(12) United States Patent
Hatakeyama et al.

(10) Patent No.: US 10,457,761 B2
(45) Date of Patent: Oct. 29, 2019

(54) POLYMER, RESIST COMPOSITION, AND PATTERN FORMING PROCESS

(71) Applicant: SHIN-ETSU CHEMICAL CO., LTD., Tokyo (JP)

(72) Inventors: Jun Hatakeyama, Joetsu (JP); Kenji Funatsu, Joetsu (JP); Teppei Adachi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 101 days.

(21) Appl. No.: 15/495,080

(22) Filed: Apr. 24, 2017

(65) Prior Publication Data

US 2017/0226250 A1 Aug. 10, 2017

Related U.S. Application Data

(63) Continuation of application No. 14/960,978, filed on Dec. 7, 2015.

(30) Foreign Application Priority Data

Dec. 10, 2014 (JP) ................................. 2014-249749

(51) Int. Cl.

| | |
|---|---|
| C08F 220/28 | (2006.01) |
| C08F 224/00 | (2006.01) |
| G03F 7/039 | (2006.01) |
| G03F 7/32 | (2006.01) |
| C08F 220/68 | (2006.01) |
| G03F 7/16 | (2006.01) |
| G03F 7/20 | (2006.01) |
| C08F 236/20 | (2006.01) |
| C08F 216/10 | (2006.01) |
| C08F 220/38 | (2006.01) |
| C08F 212/14 | (2006.01) |
| C08F 220/18 | (2006.01) |
| C08F 220/40 | (2006.01) |
| G03F 7/004 | (2006.01) |
| G03F 7/038 | (2006.01) |
| G03F 7/38 | (2006.01) |

(52) U.S. Cl.
CPC .......... *C08F 220/28* (2013.01); *C08F 212/14* (2013.01); *C08F 216/10* (2013.01); *C08F 220/18* (2013.01); *C08F 220/38* (2013.01); *C08F 220/40* (2013.01); *C08F 220/68* (2013.01); *C08F 224/00* (2013.01); *C08F 236/20* (2013.01); *G03F 7/0045* (2013.01); *G03F 7/0046* (2013.01); *G03F 7/0048* (2013.01); *G03F 7/0382* (2013.01); *G03F 7/0392* (2013.01); *G03F 7/0397* (2013.01); *G03F 7/162* (2013.01); *G03F 7/168* (2013.01); *G03F 7/2004* (2013.01); *G03F 7/32* (2013.01); *G03F 7/322* (2013.01); *G03F 7/325* (2013.01); *G03F 7/38* (2013.01); *C08F 2220/282* (2013.01); *C08F 2220/382* (2013.01)

(58) Field of Classification Search
CPC ........ C08F 2/48; C08F 220/40; C08F 220/18; C08F 220/38; C08F 236/20; C08F 216/10; C08F 220/68; C08F 224/00; C08F 2220/282; C08F 2220/382; C08F 220/28; C08F 212/14; G03F 7/322; G03F 7/38; G03F 7/162; G03F 7/0046; G03F 7/0048; G03F 7/0045; G03F 7/0392; G03F 7/325; G03F 7/0382; G03F 7/168; G03F 7/0397; G03F 7/2004; G03F 7/32
See application file for complete search history.

(56) References Cited

U.S. PATENT DOCUMENTS

| | | | |
|---|---|---|---|
| 7,482,108 B2 | 1/2009 | Matsumaru et al. | |
| 7,569,326 B2 | 8/2009 | Ohsawa et al. | |
| 7,932,334 B2 | 4/2011 | Ando et al. | |
| 2002/0094488 A1* | 7/2002 | Imai | ..................... G03F 7/0392 |
| | | | 430/270.1 |
| 2006/0057492 A1* | 3/2006 | Kunita | .................. B41C 1/1008 |
| | | | 430/270.1 |

(Continued)

FOREIGN PATENT DOCUMENTS

| | | |
|---|---|---|
| JP | 2006-45311 A | 2/2006 |
| JP | 2006-178317 A | 7/2006 |

(Continued)

OTHER PUBLICATIONS

Kishikawa et al., "Assessment of trade-off between resist resolution and sensitivity for optimizing of hyper-NA immersion lithography", Proc. of SPIE, 2007, pp. 65203L-9, vol. 6590, cited in Specification.

(Continued)

*Primary Examiner* — Cynthia Hamilton
(74) *Attorney, Agent, or Firm* — Westerman, Hattori, Daniels & Adrian, LLP

(57) ABSTRACT

A polymer comprising recurring units having an acid generator bound to the backbone, and recurring units having an optionally acid labile group-substituted carboxyl group and/or recurring units having an optionally acid labile group-substituted hydroxyl group is obtained by polymerizing corresponding monomers under such illumination that the quantity of light of wavelength up to 400 nm is up to 0.05 $mW/cm^2$. The polymer avoids photo-decomposition of the acid generator during polymerization and concomitant deprotection reaction of the acid labile group when used in positive resist compositions. A pattern with high dissolution contrast and rectangularity is formed after development.

6 Claims, No Drawings

(56) References Cited

U.S. PATENT DOCUMENTS

2011/0294070 A1   12/2011   Hatakeyama et al.
2013/0224660 A1   8/2013   Ohashi
2014/0178806 A1   6/2014   Tsuchimura
2017/0097567 A1*   4/2017   Hatakeyama ......... C08F 228/02

FOREIGN PATENT DOCUMENTS

| | | |
|---|---|---|
| JP | 2007-197718 A | 8/2007 |
| JP | 2008-133448 A | 6/2008 |
| JP | 2012-12577 A | 1/2012 |
| JP | 2013-80685 A | 5/2013 |
| JP | 2014-81496 A | 5/2014 |
| JP | 5548473 B2 | 7/2014 |
| WO | 2006-121096 A1 | 11/2006 |
| WO | 2013-031686 A1 | 3/2013 |

OTHER PUBLICATIONS

Office Action dated Aug. 15, 2017, issued in counterpart Japanese Application No. 2014-249749, with machine translation. (6 pages).

* cited by examiner

POLYMER, RESIST COMPOSITION, AND PATTERN FORMING PROCESS

CROSS-REFERENCE TO RELATED APPLICATION

This non-provisional application is a continuation of U.S. application Ser. No. 14/960,978 filed on Dec. 7, 2015 which claims priority under 35 U.S.C. § 119(a) on Patent Application No. 2014-249749 filed in Japan on Dec. 10, 2014, the entire contents of which are hereby incorporated by reference.

TECHNICAL FIELD

This invention relates to a polymer having an acid generator bound to its backbone, a resist composition comprising the polymer, and a patterning process using the composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as EB or X-ray, hydrocarbons and similar light elements used in resist materials have little absorption. Then resist materials based on polyhydroxystyrene composed mainly of hydrocarbon are under consideration.

The exposure system for mask manufacturing made a transition from the laser beam exposure system to the EB exposure system to increase the accuracy of line width. Since a further size reduction became possible by increasing the accelerating voltage of the electron gun in the EB exposure system, the accelerating voltage increased from 10 kV to 30 kV and reached 50 kV in the current mainstream system, with a voltage of 100 kV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control. However, electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are studied.

As the feature size reduces, image blurs due to acid diffusion become a problem. To insure resolution for fine patterns with a size of 45 nm et seq., not only an improvement in dissolution contrast is important as previously reported, but control of acid diffusion is also important as reported in Non-Patent Document 1.

The addition of an acid generator capable of generating a bulky acid is an effective means for suppressing acid diffusion. There was proposed a polymer comprising recurring units derived from an onium salt having a polymerizable olefin as the acid generator. Patent Document 1 discloses a sulfonium salt having polymerizable olefin capable of generating a specific sulfonic acid and a similar iodonium salt. Patent Documents 2 to 5 disclose a sulfonium salt having sulfonic acid directly bound to the backbone.

If the onium salt having polymerizable olefin is decomposed during polymerization, it generates an acid, with which deprotection of the acid labile group on the acid labile group-bearing recurring unit takes place. If deprotection reaction occurs during polymerization, the unexposed region of the positive resist film using the polymer is also dissolved in alkaline developer, failing to form a pattern. As means for suppressing deprotection reaction during polymerization, Patent Document 6 proposes to add a basic compound to a polymerization solution prior to polymerization reaction.

CITATION LIST

Patent Document 1: JP-A 2006-045311 (U.S. Pat. No. 7,482,108)
Patent Document 2: JP-A 2006-178317
Patent Document 3: WO 2006/121096
Patent Document 4: JP-A 2007-197718
Patent Document 5: JP-A 2008-133448 (U.S. Pat. No. 7,569,326)
Patent Document 6: JP 5548473
Non-Patent Document 1: SPIE Vol. 6520 65203L-1 (2007)

SUMMARY OF INVENTION

An object of the present invention is to provide a polymer having an acid generator bound to its backbone, which can be synthesized in a consistent and reproducible manner, a resist composition comprising the polymer, and a pattern forming process using the composition.

Patent Document 6 describes polymerization of a monomer solution to which a basic compound has been added. Even when the acid generator bound to the polymer backbone is decomposed to generate an acid, the acid is neutralized with the basic compound. This prevents decomposition of the acid labile group on the polymer during polymerization. However, a resist composition comprising the polymer obtained from this method lacks long-term storage stability. It is most important to prevent decomposition of the acid generator during polymerization. Also, the polymerization procedure with the basic compound added can prevent decomposition of the acid labile group to some extent even when the onium salt is photo-decomposed. However, when the desired polymer contains recurring units having lactone, there is a possibility that the lactone is decomposed with the basic compound.

The inventors have found that for producing a polymer having an acid generator bound to its backbone in a consistent and reproducible manner, it is effective to polymerize monomers under such illumination conditions that light of wavelength up to 400 nm is substantially cut off.

Problems arise if the acid generator is decomposed to generate an acid during polymerization. Since a polymer for use in positive resist compositions has an acid labile group, deprotection of the acid labile group occurs during polymerization. Since a polymer for use in negative resist compositions has a crosslinking group, crosslinking reaction occurs during polymerization. When polymerization is performed under conditions with light of wavelength 400 nm or shorter being cut off, deprotection reaction can be suppressed in the case of positive resist-forming polymer and crosslinking reaction can be suppressed in the case of negative resist-forming polymer.

Accordingly, in one aspect, the invention provides a polymer comprising recurring units having an acid generator bound to the backbone, and recurring units of at least one type selected from recurring units having a carboxyl group optionally substituted with an acid labile group and recurring units having a hydroxyl group optionally substituted with an acid labile group, the polymer being obtained from polymerization of monomers corresponding to the recurring units under such illumination conditions that the quantity of light of wavelength up to 400 nm is 0.05 mW/cm$^2$ or less.

The quantity of light of wavelength up to 400 nm is preferably 0.02 mW/cm$^2$ or less, more preferably 0.01 mW/cm$^2$ or less. Typically, the illumination is provided by an LED or organic EL.

In a preferred embodiment, the recurring units having an acid generator bound to the backbone are units of at least one type selected from recurring units having the formulae (1) to (3).

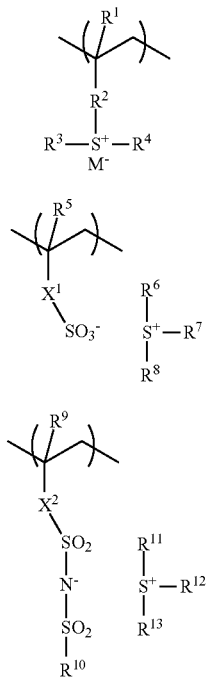

Herein $R^1$, $R^5$ and $R^9$ are each independently hydrogen or methyl; $R^2$ is a single bond, phenylene, —O—R— or —C(=O)—Y$^0$—R—, Y$^0$ is oxygen or NH, R is a straight, branched or cyclic $C_1$-$C_6$ alkylene, straight, branched or cyclic $C_2$-$C_6$ alkenylene, or phenylene group, which may contain a carbonyl (—CO—), ester (—COO—), ether (—O—), sulfonic acid ester (—OS(O$_2$)—), sulfonamide (—NH—S(O$_2$)—) or hydroxyl moiety; $R^3$, $R^4$, $R^6$, $R^7$, $R^8$, $R^{11}$, $R^{12}$ and $R^{13}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or thiophenyl group; $X^1$ and $X^2$ are each independently a single bond, methylene, ethylene, phenylene, fluorinated phenylene, —O—R$^{14}$—, or —C(=O)—Z$^1$—R$^{14}$—, Z$^1$ is oxygen or NH, R$^{14}$ is a straight, branched or cyclic $C_1$-$C_6$ alkylene, alkenylene, or phenylene group, which may contain a carbonyl, ester, ether, sulfonic acid ester, sulfonamide or hydroxyl moiety, or which may be fluorinated; R$^{10}$ is a $C_1$-$C_4$ fluoroalkyl or $C_6$-$C_{10}$ fluoroaryl group; and M$^-$ is a non-nucleophilic counter ion. In a more preferred embodiment, at least one of $R^3$ and $R^4$, at least one of $R^6$, $R^7$ and $R^8$, or at least one of $R^{11}$, $R^{12}$ and $R^{13}$ is an optionally substituted phenyl group.

In a preferred embodiment, the recurring units having a carboxyl group optionally substituted with an acid labile group and the recurring units having a hydroxyl group optionally substituted with an acid labile group have the following formulae (4) and (5), respectively.

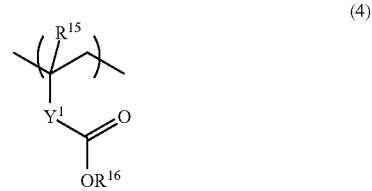

Herein $R^{15}$ and $R^{17}$ are each independently hydrogen or methyl; $R^{16}$ and $R^{19}$ are each independently hydrogen or an acid labile group; $Y^1$ is a single bond, phenylene, naphthylene or —C(=O)—O—R$^{20}$—, R$^{20}$ is a straight, branched or cyclic $C_1$-$C_{10}$ alkylene group which may contain an ether, ester, lactone ring or hydroxyl moiety, or phenylene or naphthylene group; $Y^2$ is a single bond, a phenylene or naphthylene group which may have a nitro, cyano or halogen moiety, or —C(=O)—O—R$^{21}$—, —C(=O)—NH—R$^{21}$—, —O—R$^{21}$—, or —S—R$^{21}$—, R$^{21}$ is a straight, branched or cyclic $C_1$-$C_{10}$ alkylene group which may contain an ether, ester, lactone ring or hydroxyl moiety, or a phenylene or naphthylene group which may contain a straight, branched or cyclic $C_1$-$C_6$ alkyl, $C_2$-$C_6$ alkenyl, $C_6$-$C_{10}$ aryl, alkoxy, acyl, acyloxy, alkoxycarbonyl, nitro, cyano or halogen moiety; R$^{18}$ is a single bond, or a straight, branched or cyclic, $C_1$-$C_{16}$, di- to pentavalent, aliphatic hydrocarbon group or phenylene group, which may contain an ether or ester moiety; and m is an integer of 1 to 4.

In another aspect, the invention provides a chemically amplified resist composition comprising the polymer defined above, an organic solvent, and optionally a basic compound and/or surfactant.

In a further aspect, the invention provides a pattern forming process comprising the steps of applying the resist composition onto a substrate, baking, exposing to high-energy radiation, and developing in a developer. Typically, the high-energy radiation is i-line, KrF excimer laser, ArF excimer laser, EB, or soft x-ray of wavelength in the range of 3 to 15 nm.

Advantageous Effects of Invention

The inventive polymer is obtained from polymerization of monomers under such illumination conditions that light of wavelength up to 400 nm is cut off, specifically under illumination from LED or organic EL lamps. This polymerization procedure inhibits photo-decomposition of the acid generator during polymerization, and concomitant deprotection reaction of the acid labile group on the polymer which is intended for use in positive resist compositions, leading to a high dissolution contrast and high rectangularity of a pattern after development. In addition, agglomeration of the polymer in a resist solution and hence, generation of particles is suppressed.

The chemically amplified resist composition comprising the polymer may be used not only in the lithography for forming semiconductor circuits, but also in the formation of mask circuit patterns, micromachines, and thin-film magnetic head circuits.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The acronym "PAG" stands for photoacid generator, "PEB" for post-exposure bake, "LER" for line edge roughness, "LWR" for line width roughness, "EUV" for extreme ultraviolet, and "EB" for electron beam.

Polymer

One embodiment of the invention is a polymer comprising recurring units having an acid generator bound to the backbone, and recurring units of at least one type selected from recurring units having a carboxyl group optionally substituted with an acid labile group and recurring units having a hydroxyl group optionally substituted with an acid labile group. The polymer is obtained from polymerization of monomers corresponding to the recurring units under illumination that light of wavelength up to 400 nm is cut off. The illumination that light of wavelength up to 400 nm is cut off means that the quantity of light of wavelength up to 400 nm is 0.05 mW/cm$^2$ or less, preferably 0.02 mW/cm$^2$ or less, and more preferably 0.01 mW/cm$^2$ or less.

The illumination of this type is provided by yellow lamps, LED lamps and organic EL lamps, preferably LED and organic EL lamps. In general, fluorescent lamps produce light emissions which include a fraction of wavelength up to 400 nm in a quantity of about 0.1 mW/cm$^2$. During polymerization of a monomer corresponding to a recurring unit having an acid generator bound thereto, the acid generator is decomposed with that fraction of light, and the acid labile group is deprotected with the aid of heat applied during polymerization. Such inconvenience may be avoided by using a yellow lamp which is constructed by applying a yellow laminate to the surface of a fluorescent lamp.

LED lamps and organic EL (electroluminescent) lamps produce light emissions which contain little or substantially no UV radiation. In the case of LED lamps, not only UV, but also light of wavelength 500 nm or shorter can be reduced by controlling the applied voltage, as described in JP-A 2013-080685.

The yellow lamp has the shortcoming that color discrimination is difficult under its illumination. For example, yellow marks cannot be used since they are not visible, and discrimination between blue and black marks is difficult. In the case of LED and organic EL lamps, the illumination in which a light fraction of wavelength 400 nm or shorter is completely cut off is a slightly yellowish illumination, under which color discrimination is easy, with the advantage of increased efficiency of experimentation.

With LED and organic EL lamps, it is even possible that the quantity of light of wavelength up to 400 nm is 0.01 mW/cm$^2$ or less, with which little or no decomposition of the acid generator occurs during polymerization.

In a preferred embodiment, the recurring units having an acid generator bound to the backbone are units of at least one type selected from recurring units having the formulae (1) to (3).

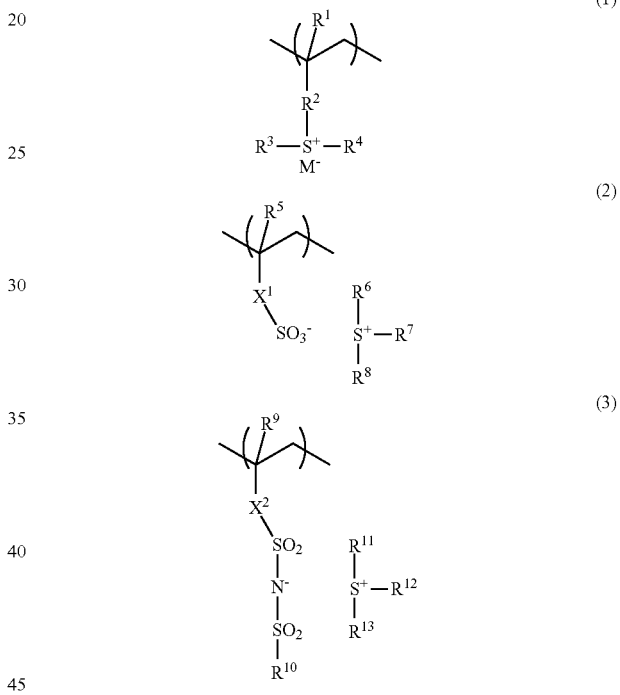

Herein $R^1$, $R^5$ and $R^9$ are each independently hydrogen or methyl. $R^2$ is a single bond, phenylene, —O—R— or —C(=O)—$Y^0$—R—, wherein $Y^0$ is oxygen or NH, and R is a straight, branched or cyclic $C_1$-$C_6$ alkylene, straight, branched or cyclic $C_2$-$C_6$ alkenylene, or phenylene group, which may contain a carbonyl (—CO—), ester (—COO—), ether (—O—), sulfonic acid ester (—OS(O$_2$)—), sulfonamide (—NH—S(O$_2$)—) or hydroxyl moiety. $R^3$, $R^4$, $R^6$, $R^7$, $R^8$, $R^{11}$, $R^{12}$ and $R^{13}$ are each independently a straight, branched or cyclic $C_1$-$C_{12}$ alkyl group which may contain a carbonyl, ester or ether moiety, or a $C_6$-$C_{12}$ aryl group, $C_7$-$C_{20}$ aralkyl group, or thiophenyl group. $X^1$ and $X^2$ are each independently a single bond, methylene, ethylene, phenylene, fluorinated phenylene, —O—$R^{14}$—, or —C(=O)—$Z^1$—$R^{14}$—, wherein $Z^1$ is oxygen or NH, and $R^{14}$ is a straight, branched or cyclic $C_1$-$C_6$ alkylene, alkenylene, or phenylene group, which may contain a carbonyl, ester, ether, sulfonic acid ester, sulfonamide or hydroxyl moiety, or which may be fluorinated. $R^{10}$ is a $C_1$-$C_4$ fluoroalkyl or $C_6$-$C_{10}$ fluoroaryl group. M$^-$ is a non-nucleophilic counter ion.

Examples of the monomer from which the recurring units (a1) having formula (1) are derived are shown below, but not limited thereto.
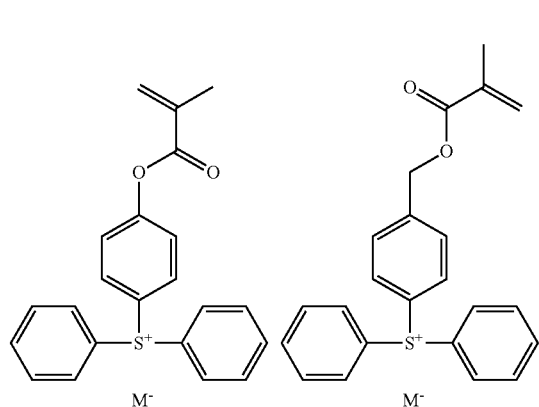
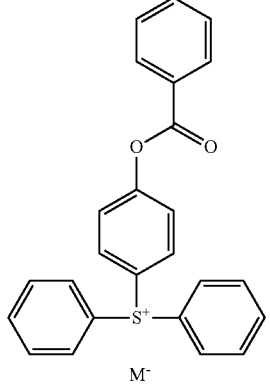
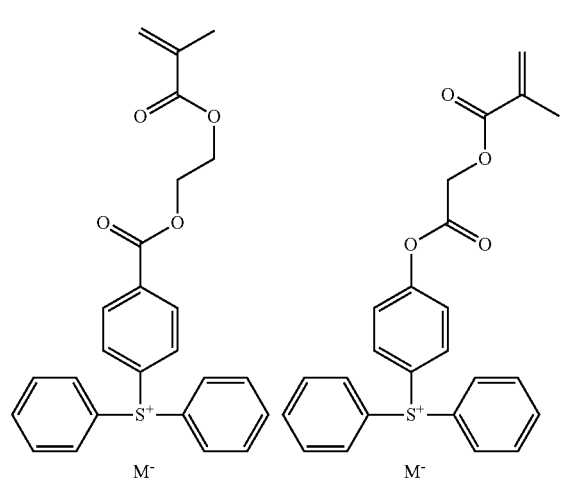
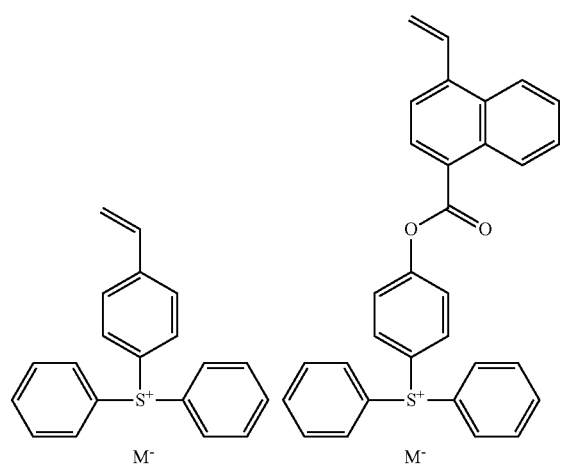
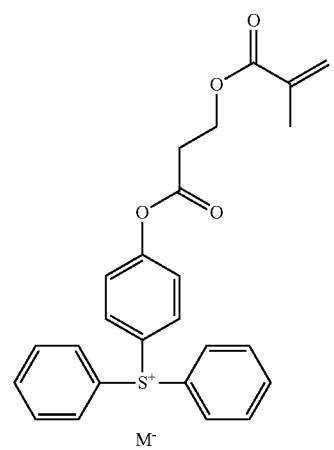

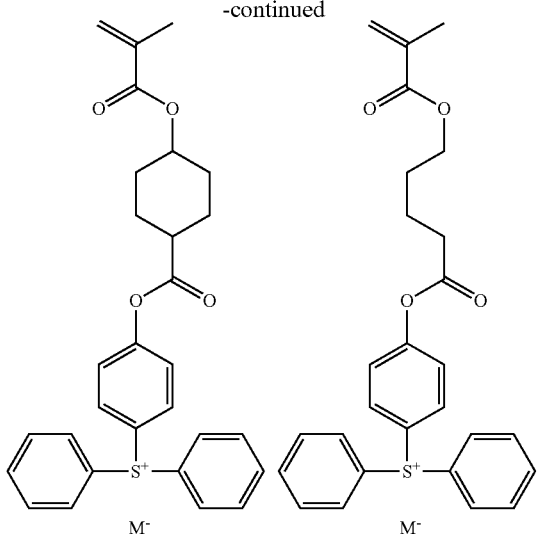
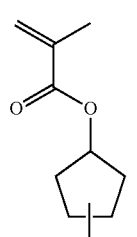
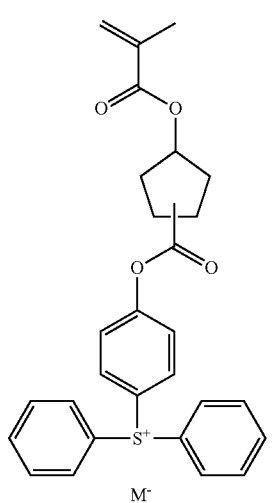
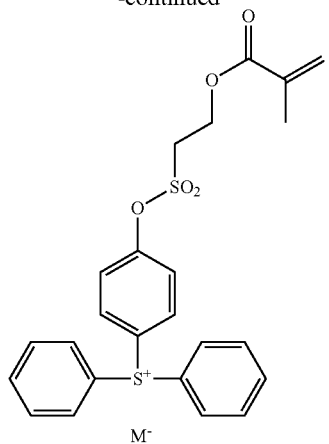
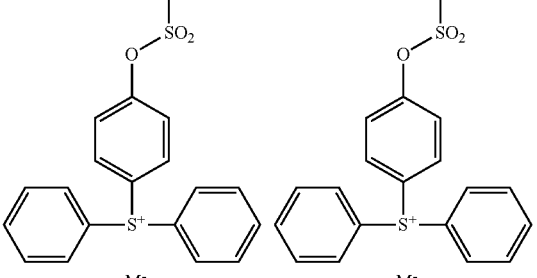
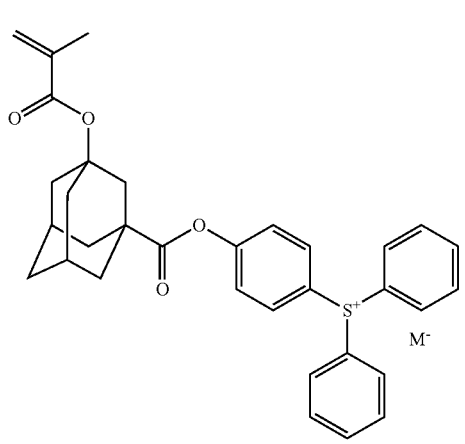
Herein M⁻ is as defined above.
Examples of the monomer from which the recurring units (a2) having formula (2) are derived are shown below, but not limited thereto.

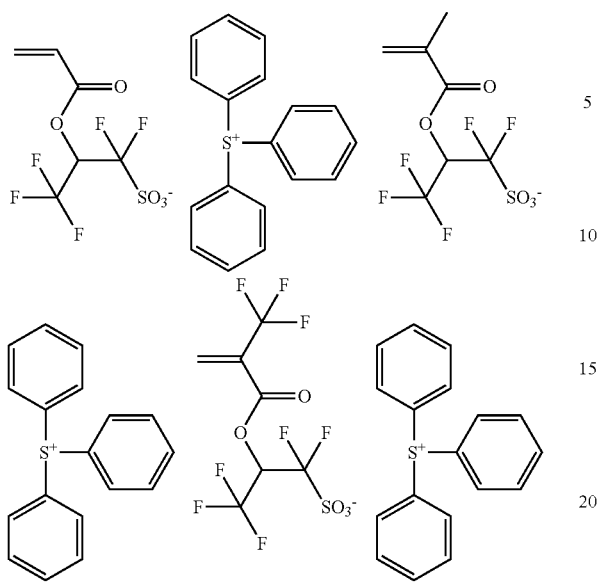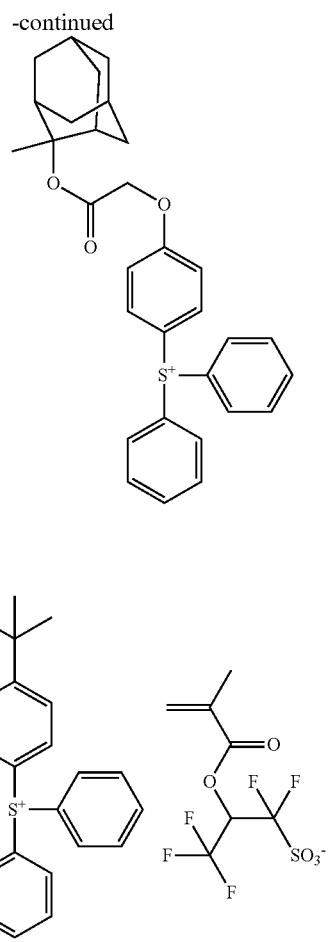

-continued
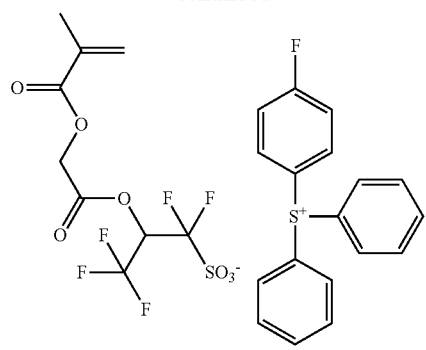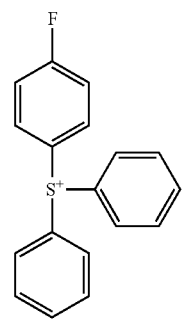
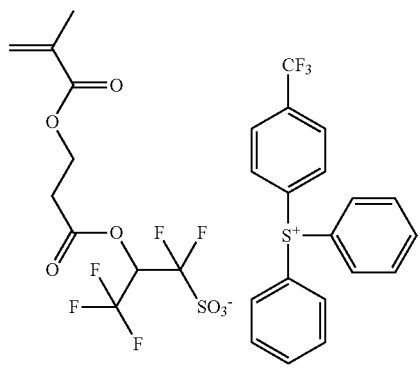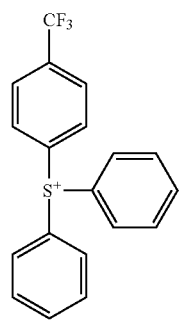
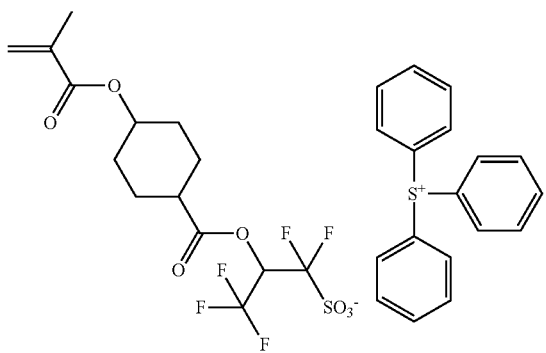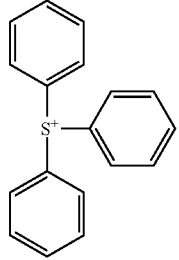
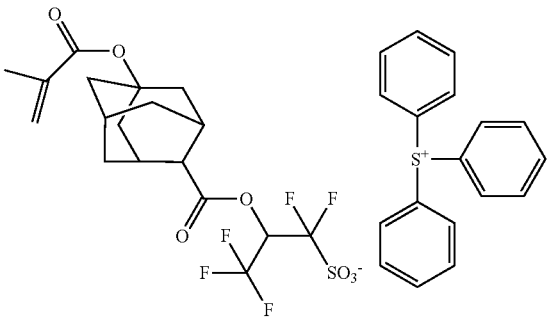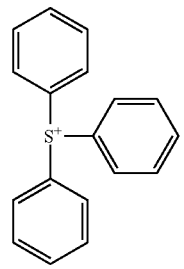
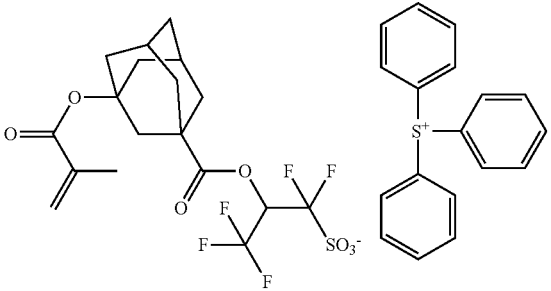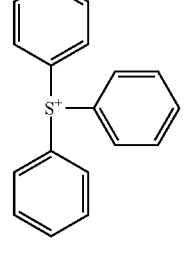
-continued
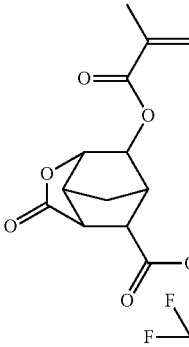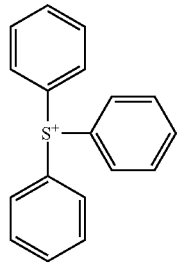
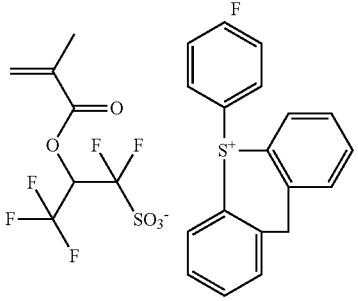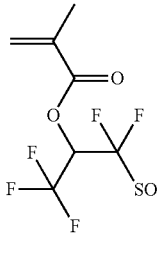
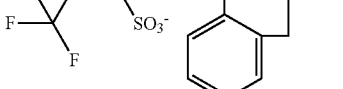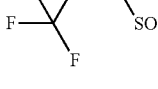
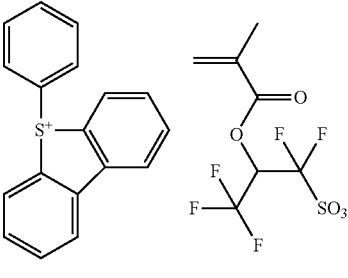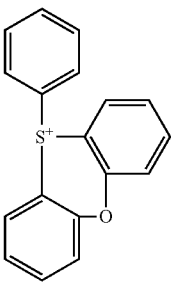
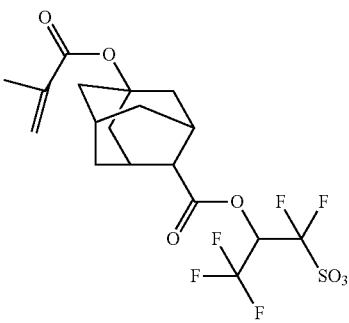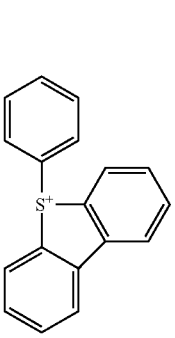
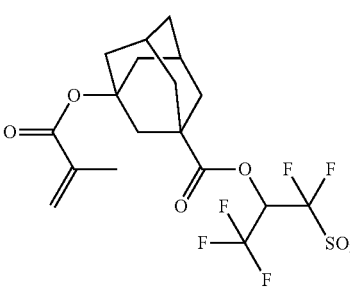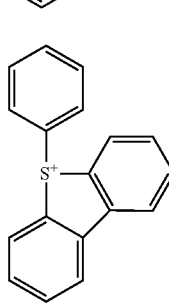

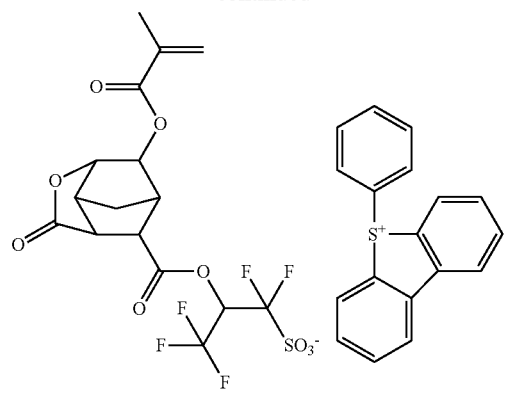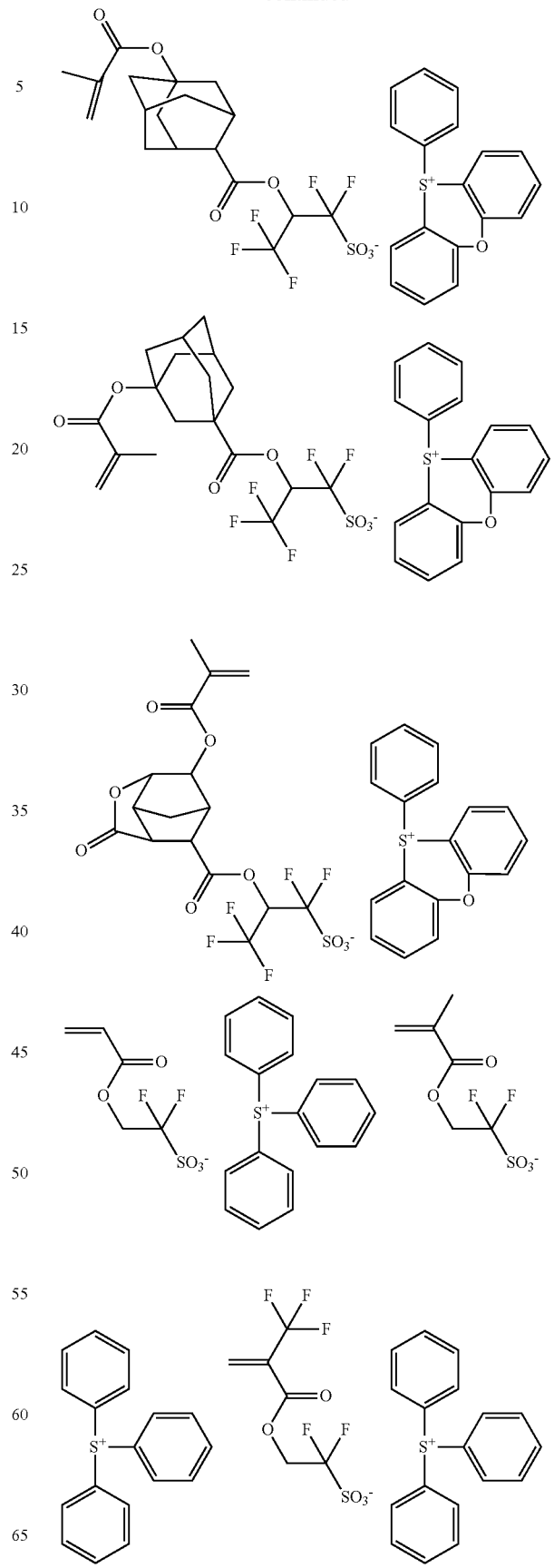

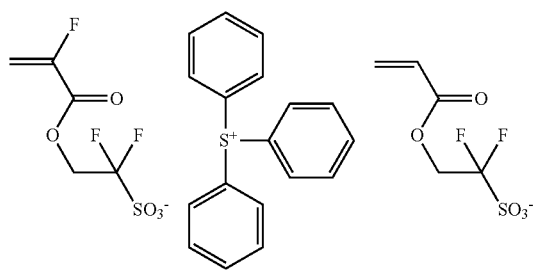
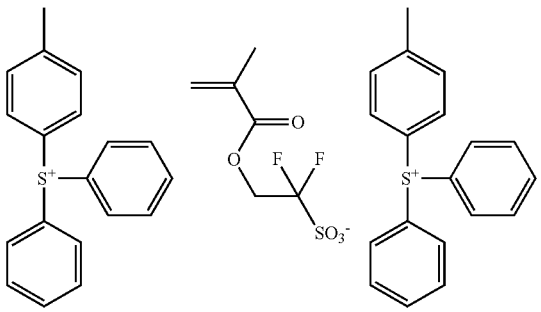
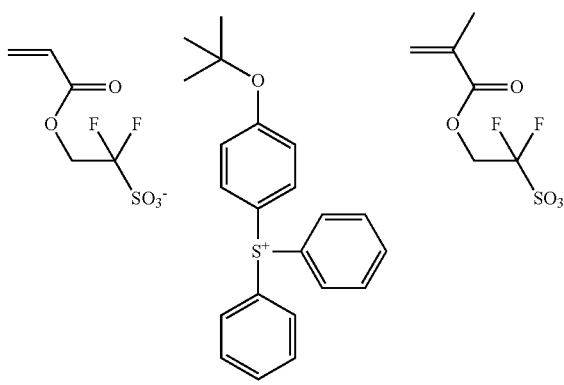
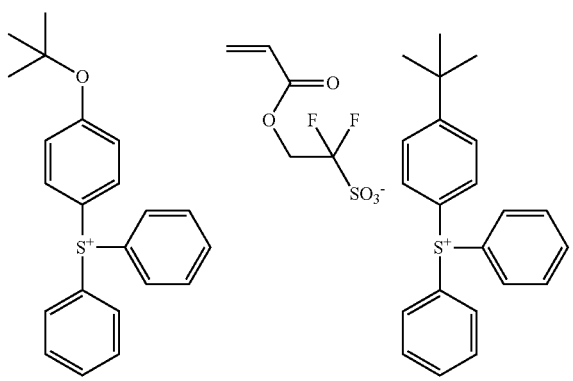
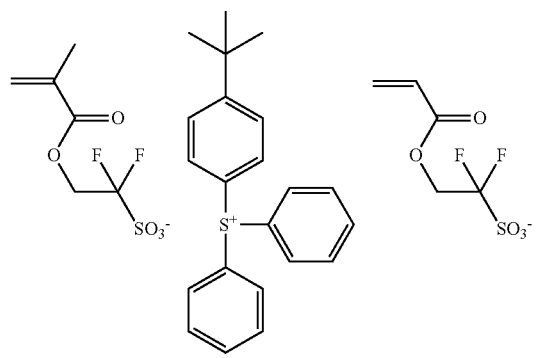
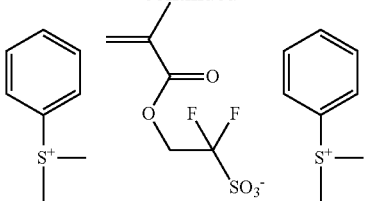
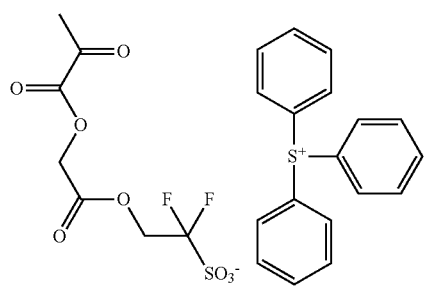
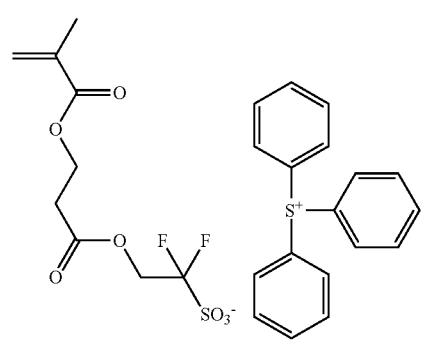
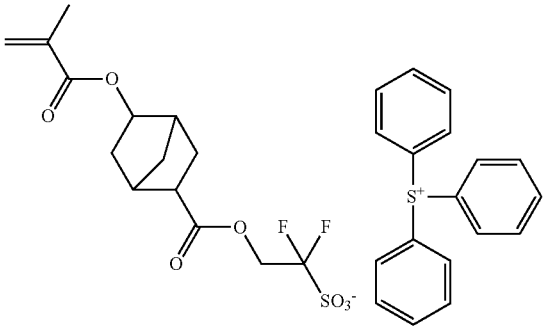
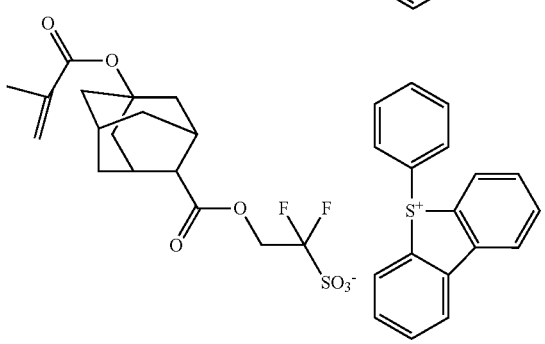

-continued
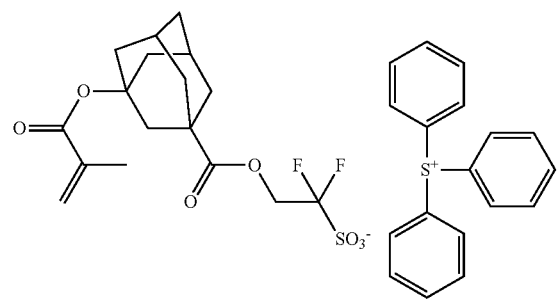
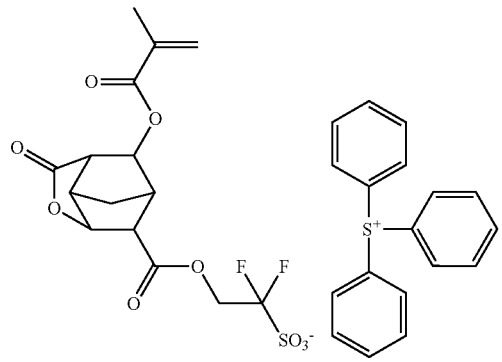
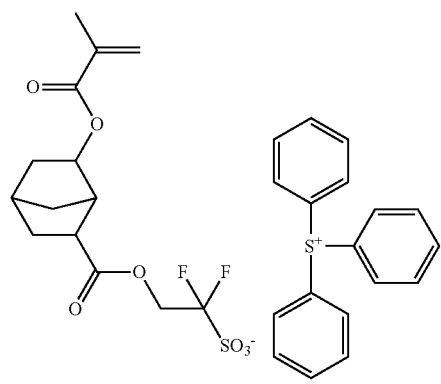
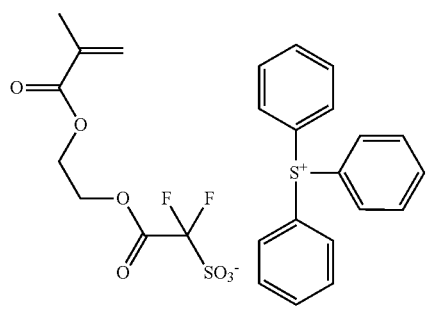
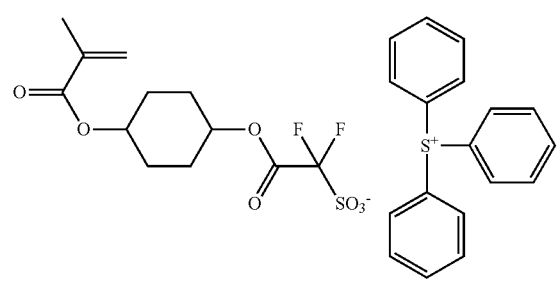
-continued
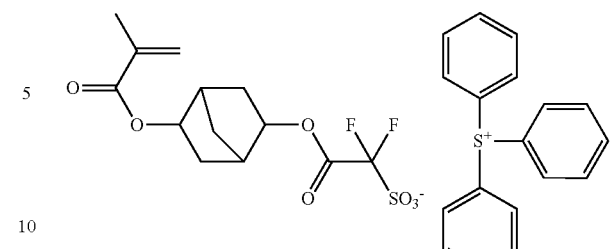
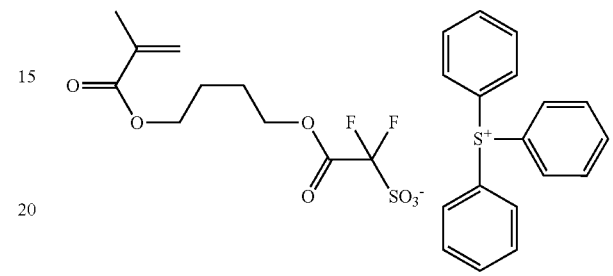
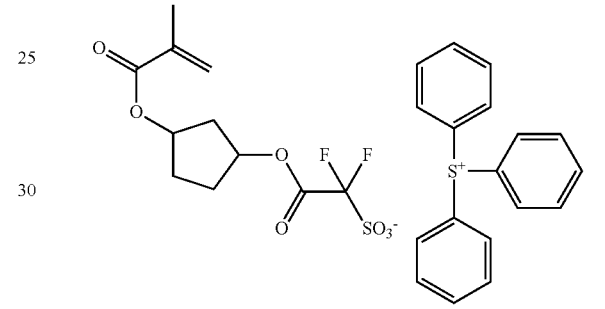
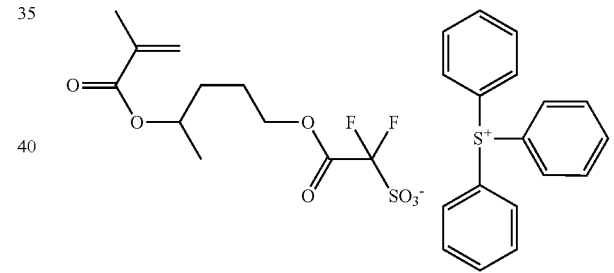
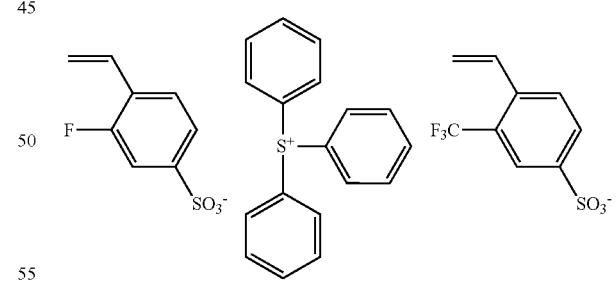
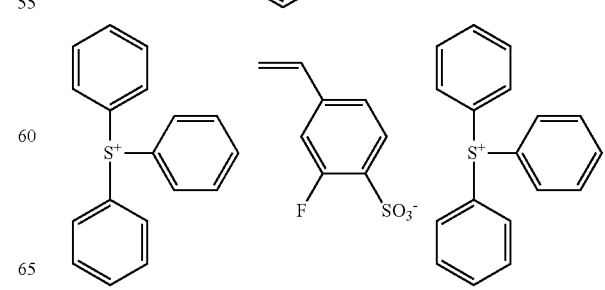

-continued
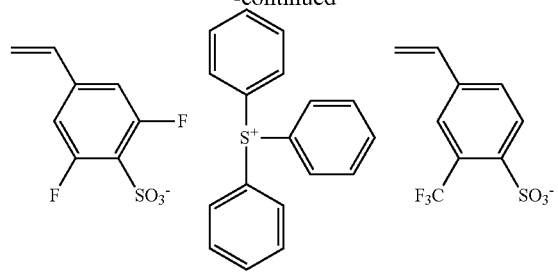
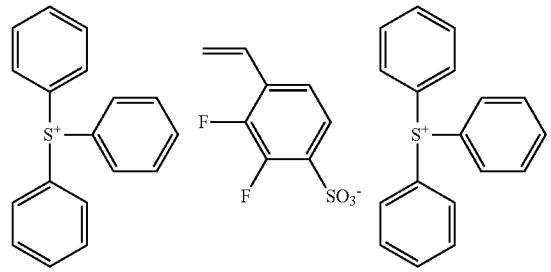
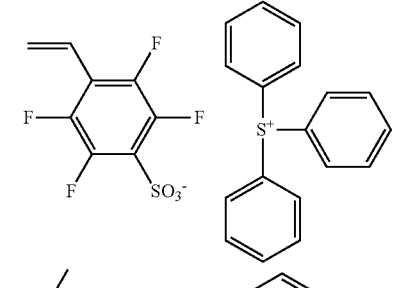
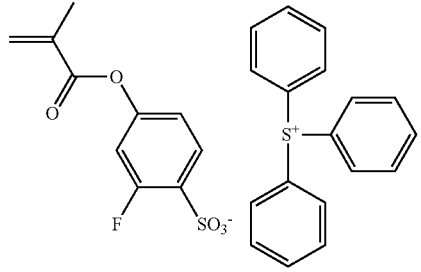
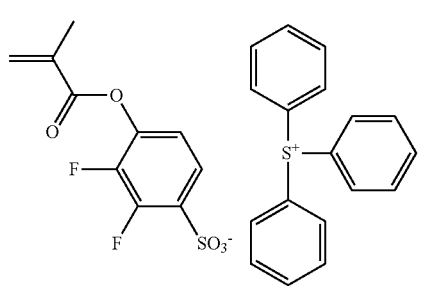
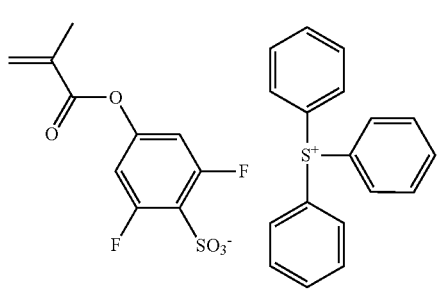
-continued
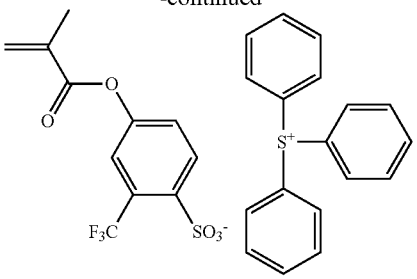
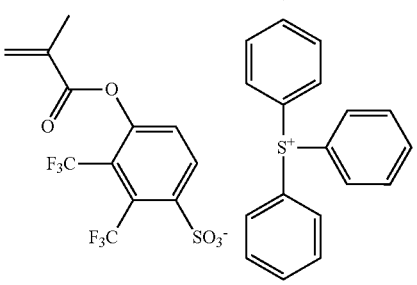
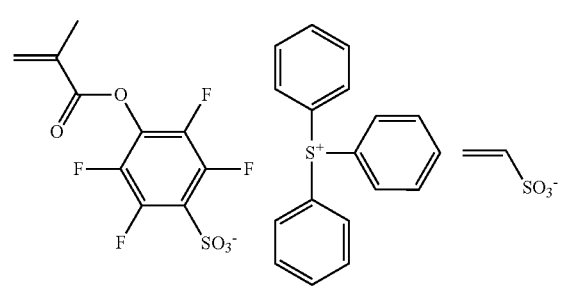
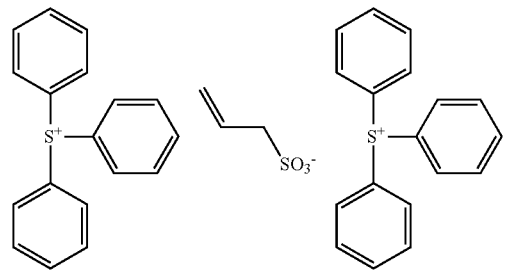
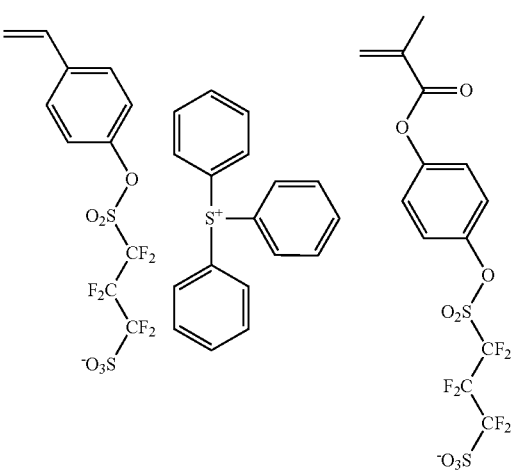

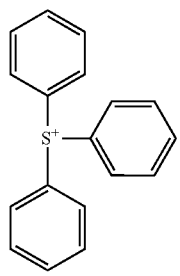
Examples of the monomer from which the recurring units (a3) having formula (3) are derived are shown below, but not limited thereto.
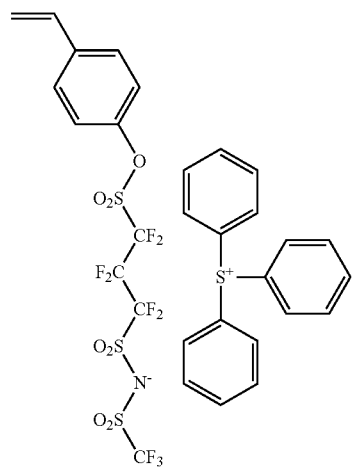
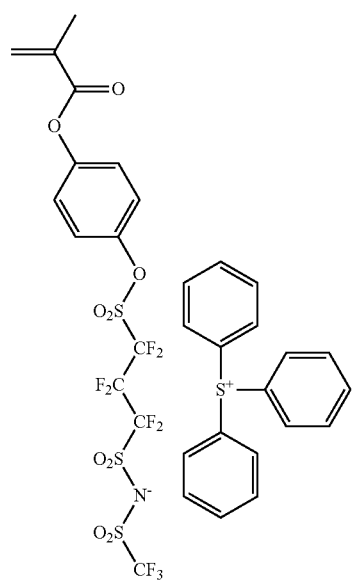
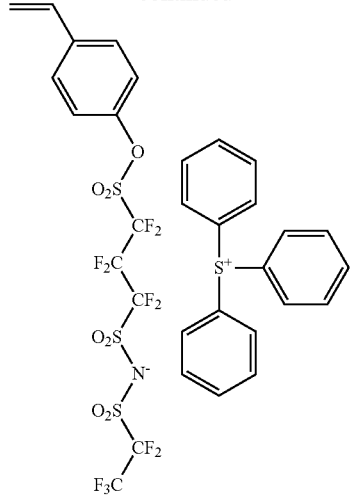
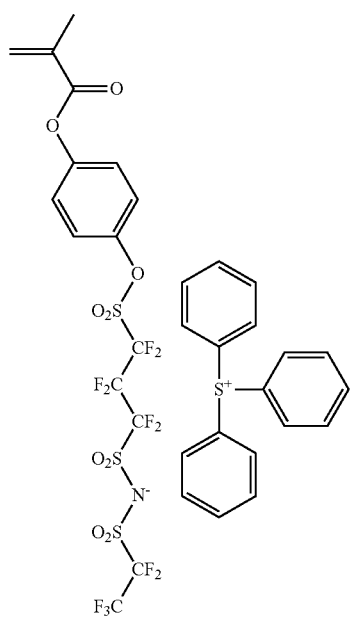
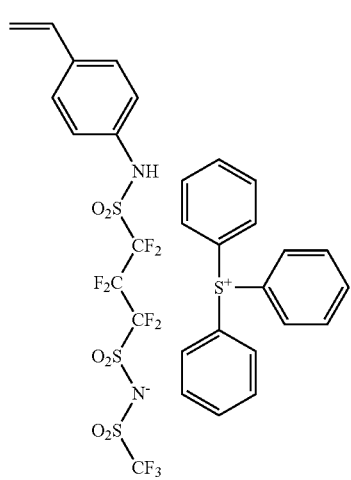

-continued

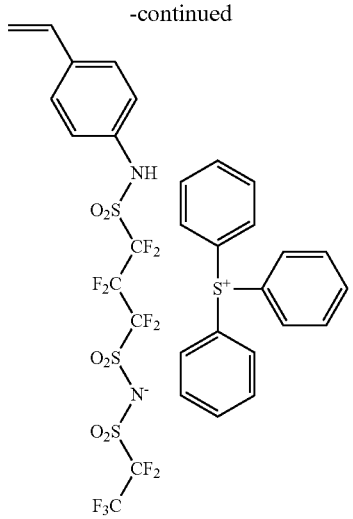

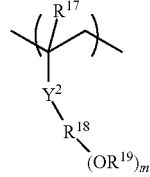

In formula (1), examples of the non-nucleophilic counter ion represented by M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide, as well as the anions described in JP-A 2007-145797, JP-A 2008-007410, JP-A 2008-299069, JP-A 2009-080474, and JP-A 2009-169230.

Polymers comprising recurring units of formula (1), (2) or (3) wherein at least one of $R^3$ and $R^4$, at least one of $R^6$, $R^7$ and $R^8$, or at least one of $R^{11}$, $R^{12}$ and $R^{13}$ is an optionally substituted phenyl group have high sensitivity to a light fraction of wavelength up to 400 nm. In this case, full wavelength cutoff is necessary.

The recurring units having a carboxyl group optionally substituted with an acid labile group, referred to as recurring units (b1), hereinafter, and the recurring units having a hydroxyl group optionally substituted with an acid labile group, referred to as recurring units (b2), hereinafter, preferably have the following formulae (4) and (5), respectively. When an inventive polymer contains recurring units having an acid labile group-substituted carboxyl or hydroxyl group, it is possible to form a positive resist pattern via exposure and alkaline development, or a negative resist pattern via exposure and organic solvent development. When an inventive polymer contains recurring units having a carboxyl or hydroxyl group which is not substituted with an acid labile group, a negative resist composition may be formulated from the polymer.

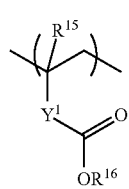

(4)

(5)

Herein $R^{15}$ and $R^{17}$ are each independently hydrogen or methyl. $R^{16}$ and $R^{19}$ are each independently hydrogen or an acid labile group. $Y^1$ is a single bond, phenylene, naphthylene or —C(=O)—O—$R^{20}$—, wherein $R^{20}$ is a straight, branched or cyclic $C_1$-$C_{10}$ alkylene group which may contain an ether, ester, lactone ring or hydroxyl moiety, or a phenylene or naphthylene group. $Y^2$ is a single bond, a phenylene or naphthylene group which may have a nitro, cyano or halogen moiety, or —C(=O)—O—$R^{21}$—, —C(=O)—NH—$R^{21}$—, —O—$R^{21}$—, or —S—$R^{21}$—, wherein $R^{21}$ is a straight, branched or cyclic $C_1$-$C_{10}$ alkylene group which may contain an ether, ester, lactone ring or hydroxyl moiety, or a phenylene or naphthylene group which may contain a straight, branched or cyclic $C_1$-$C_6$ alkyl, $C_2$-$C_6$ alkenyl, $C_6$-$C_{10}$ aryl, alkoxy, acyl, acyloxy, alkoxycarbonyl, nitro, cyano or halogen moiety. $R^{18}$ is a single bond, or a straight, branched or cyclic, $C_1$-$C_{16}$, di- to pentavalent, aliphatic hydrocarbon group or phenylene group, which may contain an ether or ester moiety, and m is an integer of 1 to 4.

The recurring units (b1) and (b2) are derived from monomers having the formulae (4') and (5'), respectively.

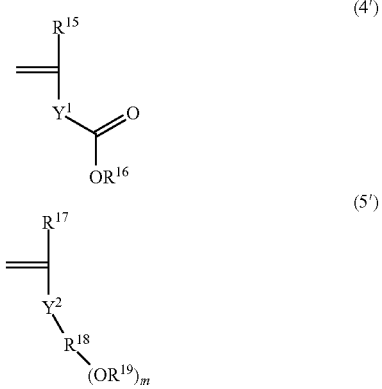

(4')

(5')

Herein $R^{15}$ to $R^{19}$, $Y^1$, $Y^2$, and m are as defined above.

Examples of the monomer having formula (4') are shown below, but not limited thereto.

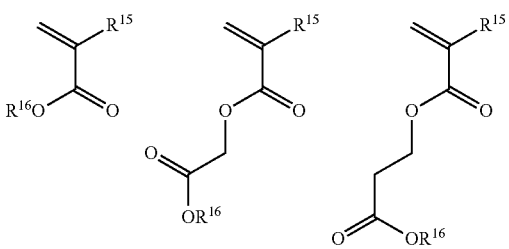

-continued
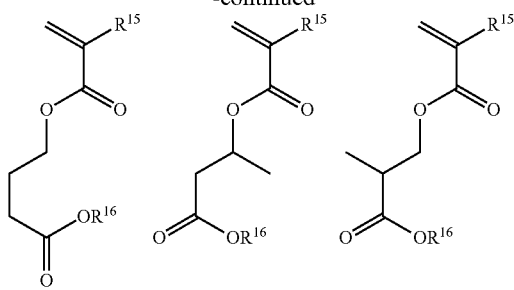
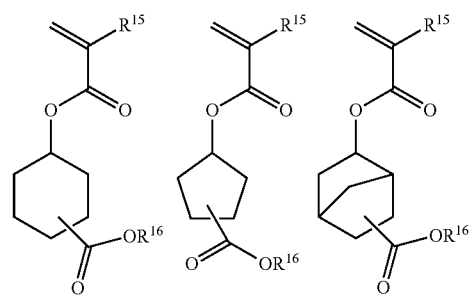
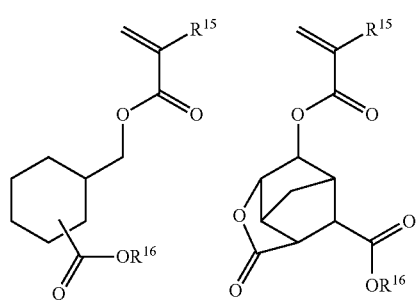
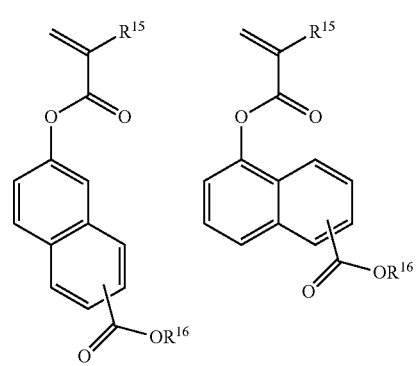
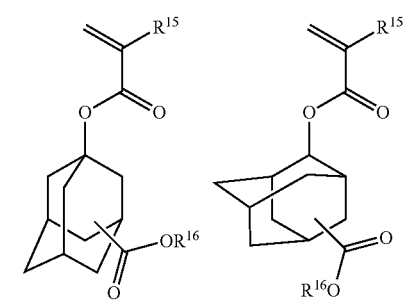
-continued
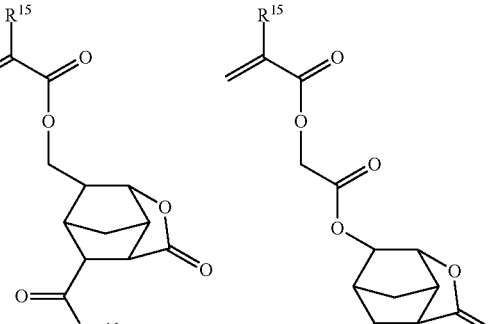
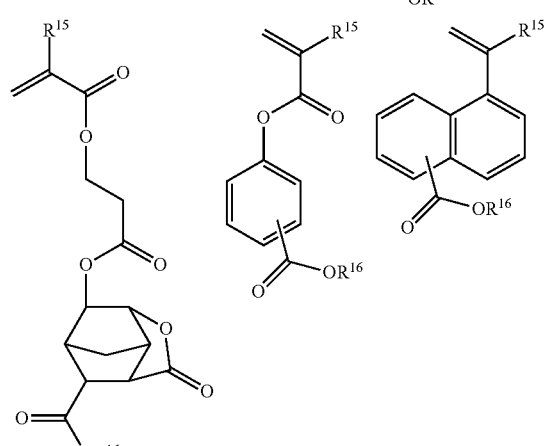
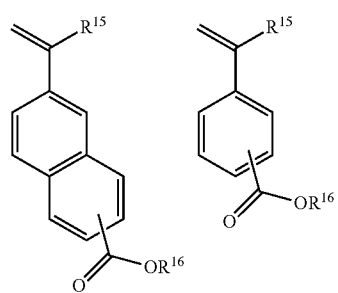
Herein $R^{15}$ and $R^{16}$ are as defined above.
Examples of the monomer having formula (5') are shown below, but not limited thereto.
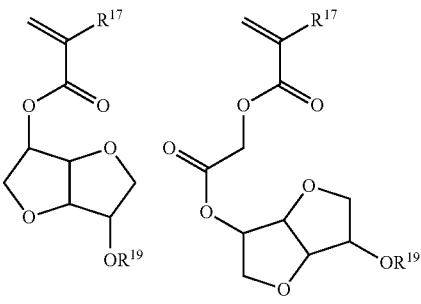

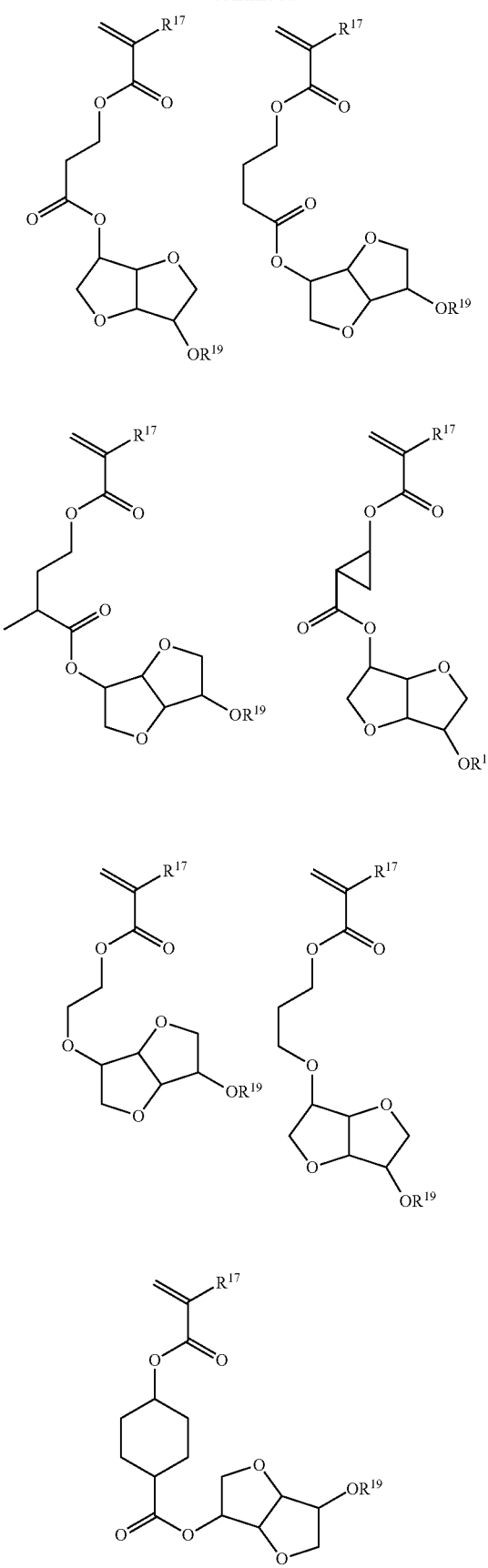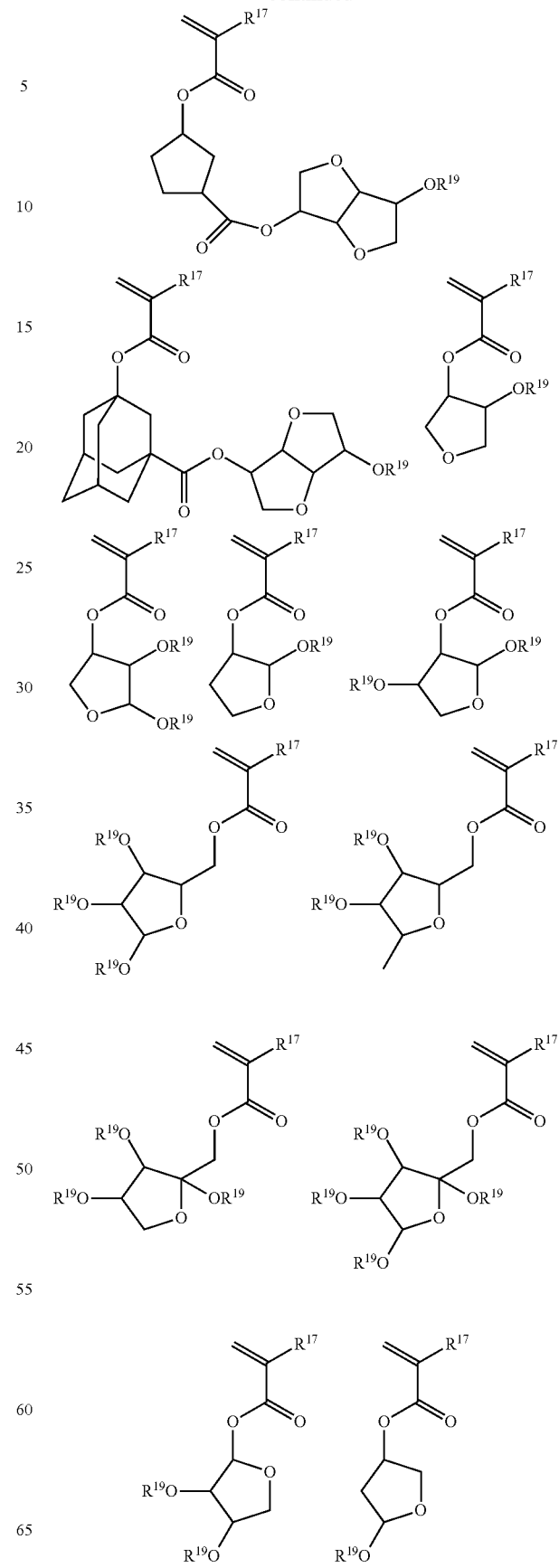

-continued
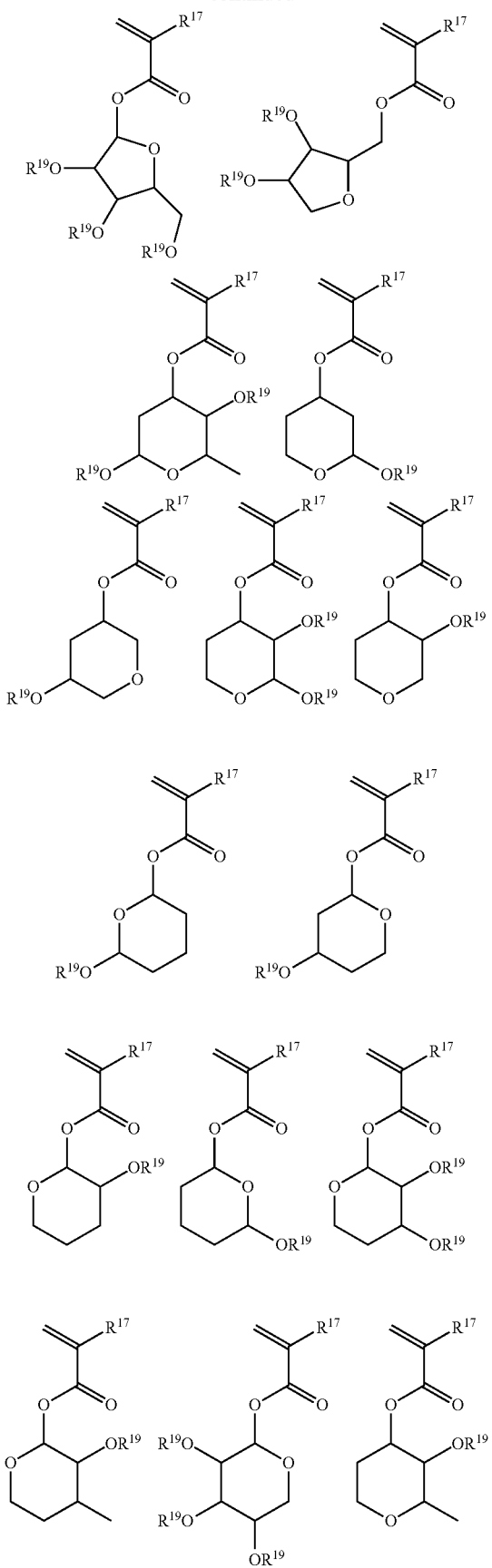
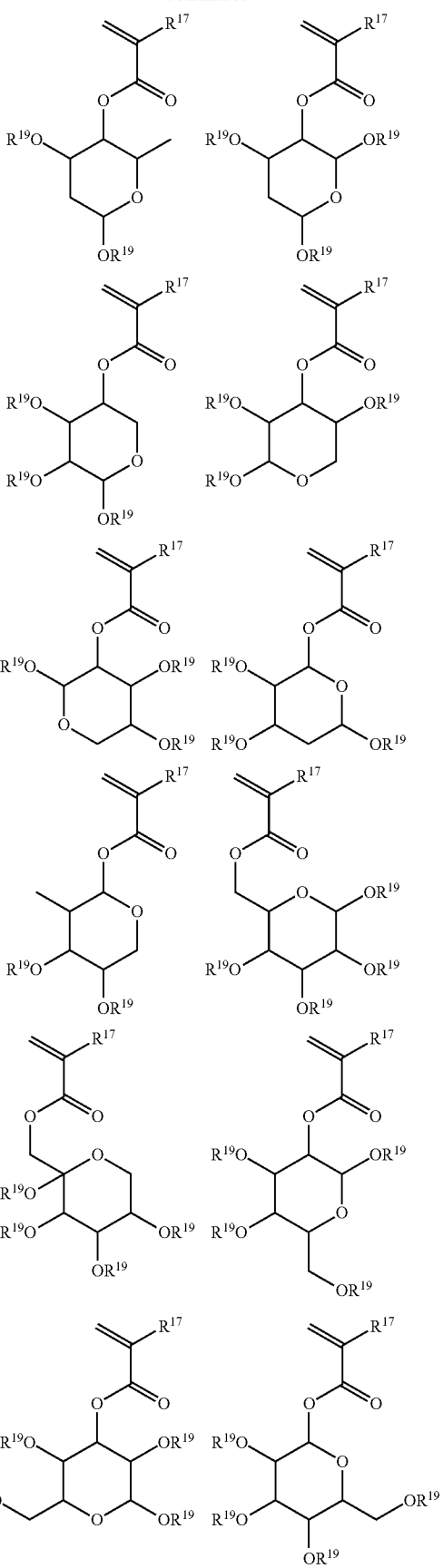

-continued
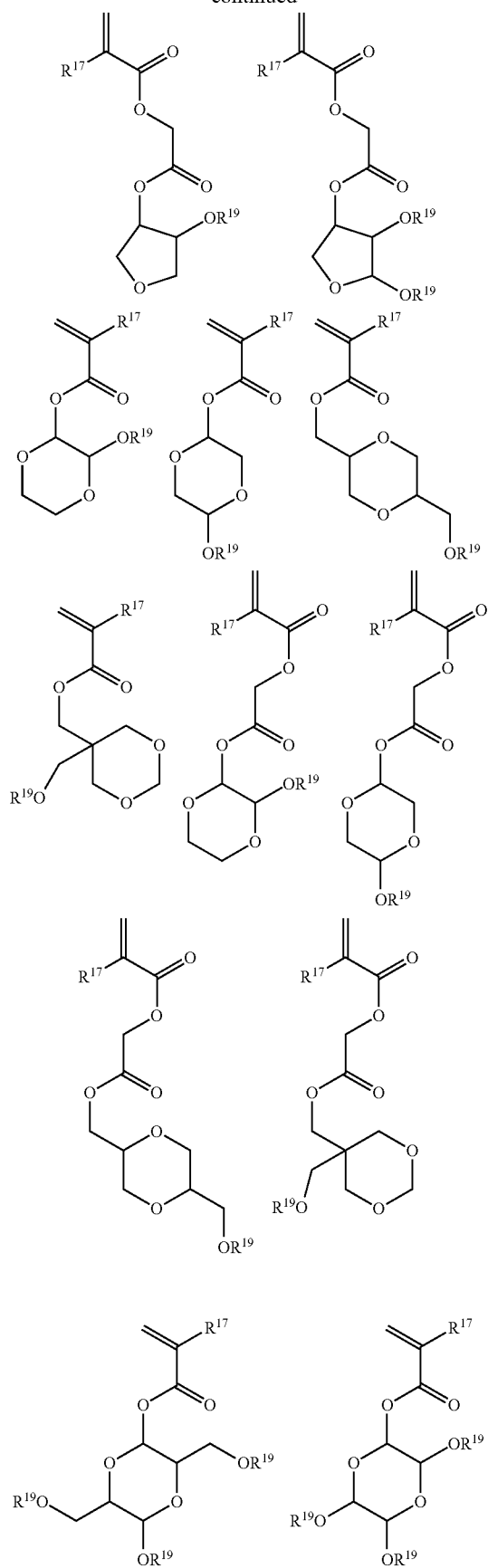
-continued
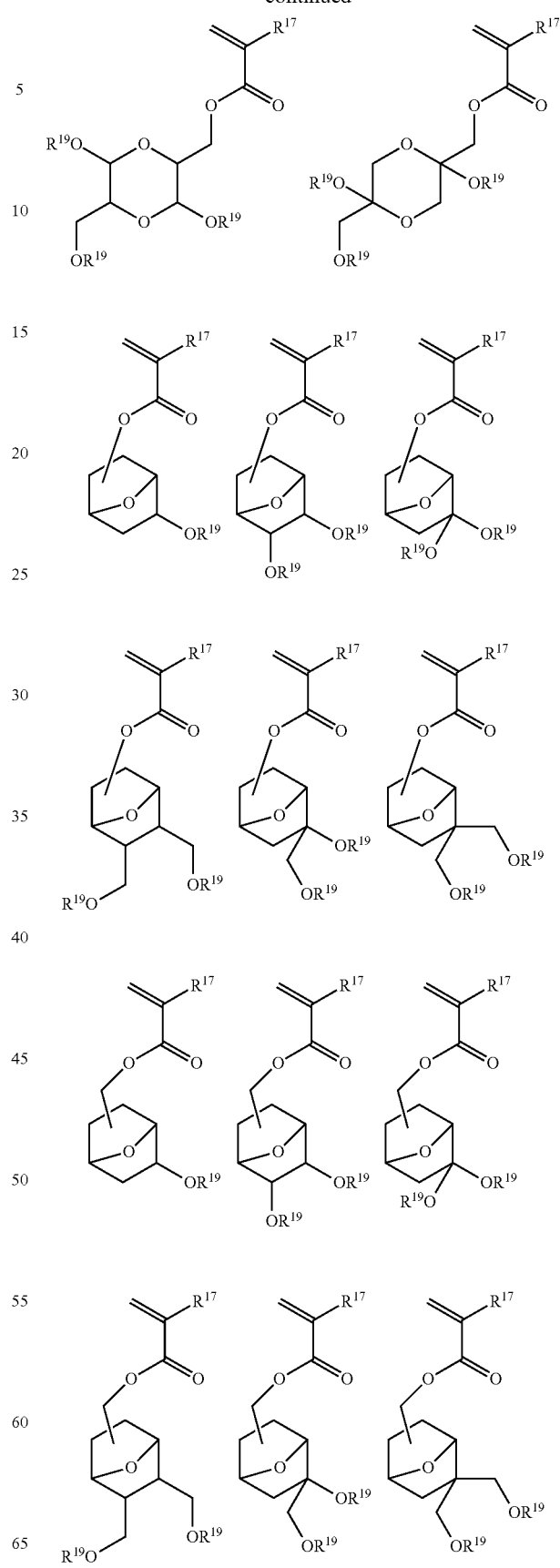

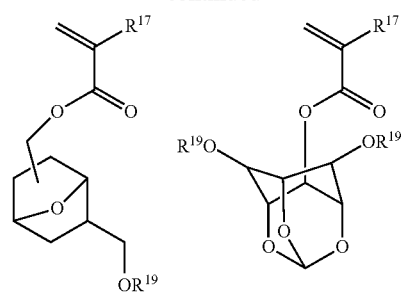
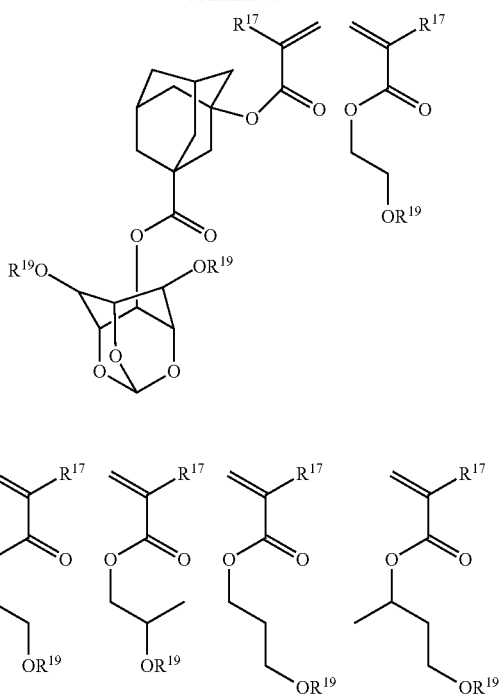
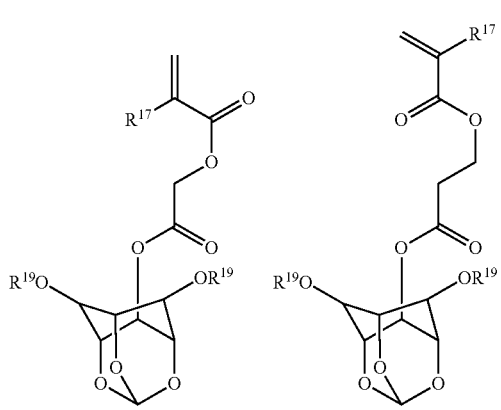
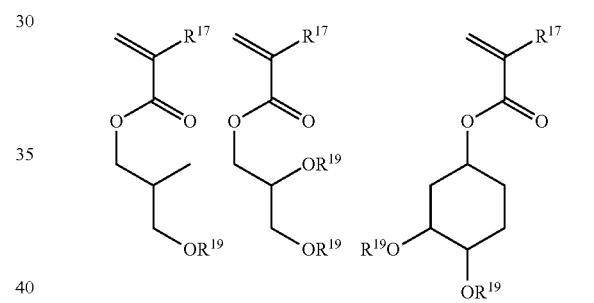
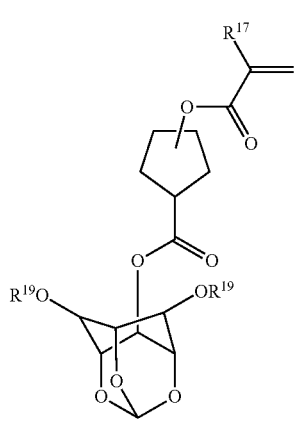
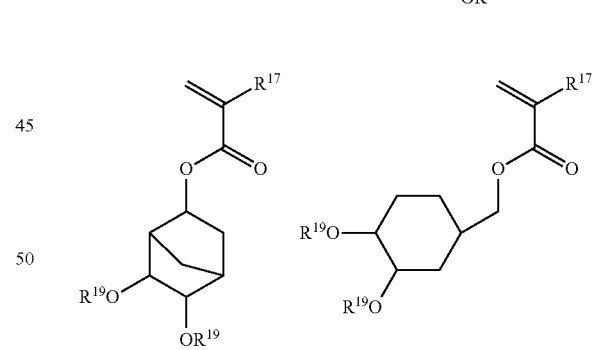
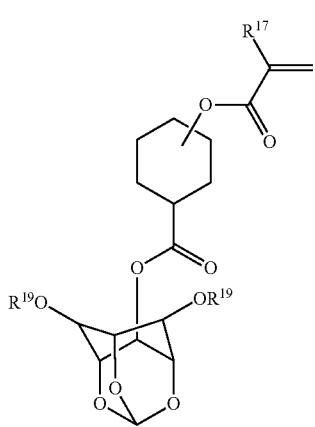
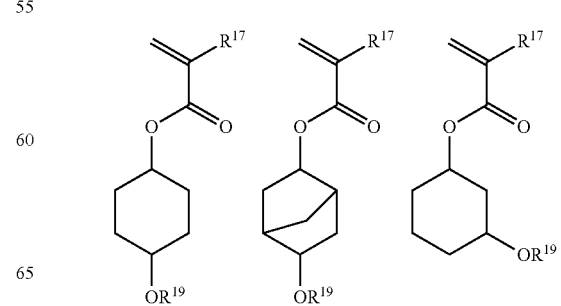

-continued
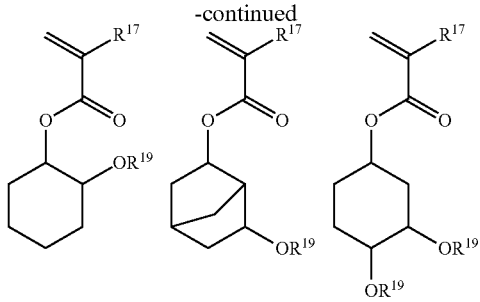
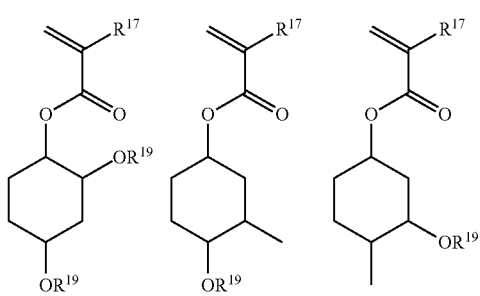
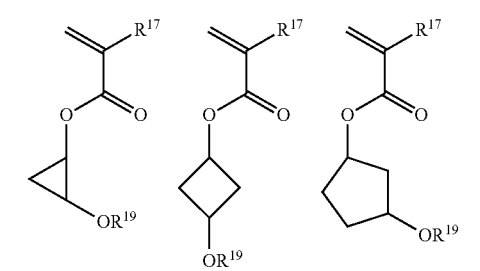
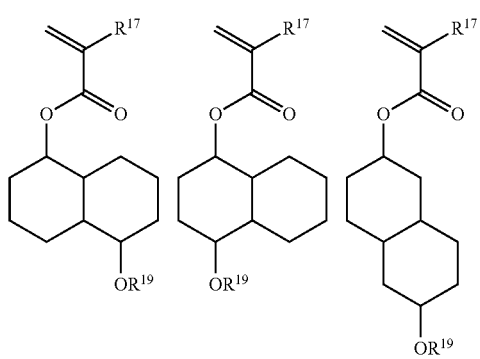
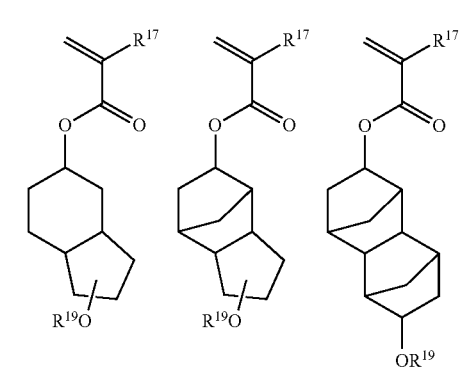
-continued
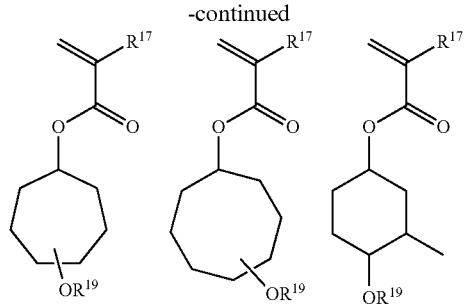
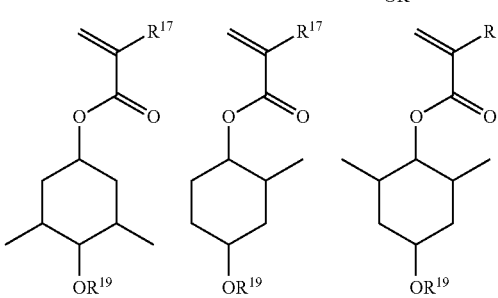
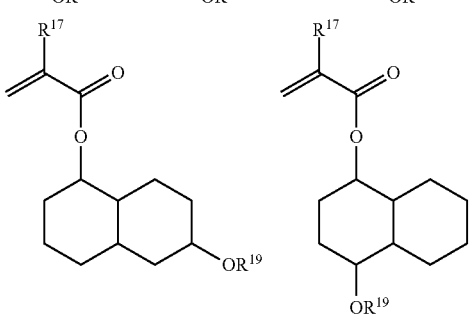
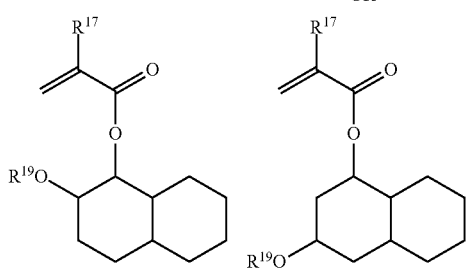
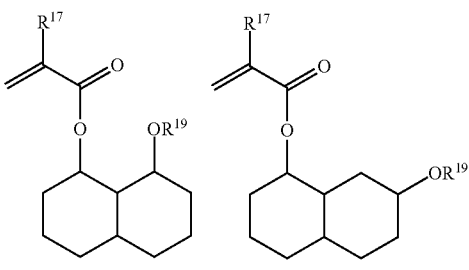
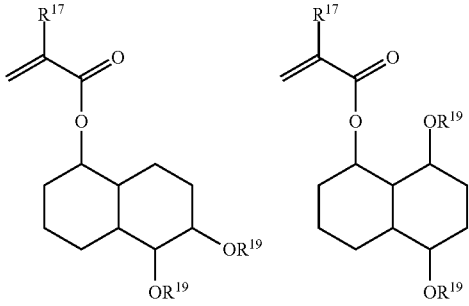

-continued
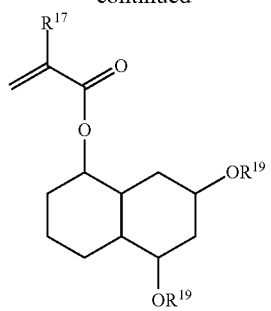
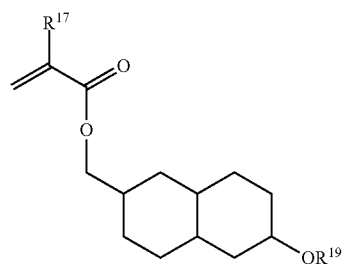
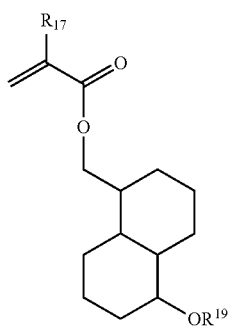
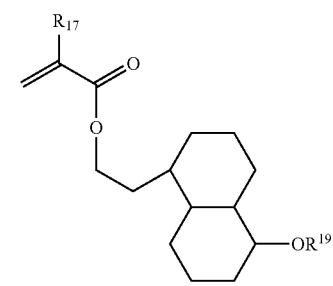
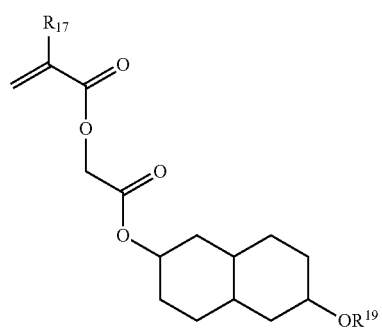
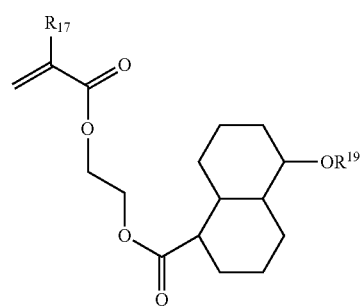
-continued
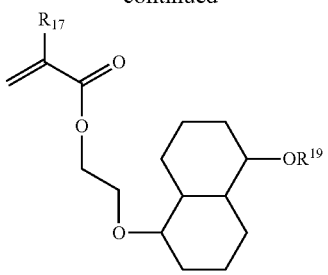
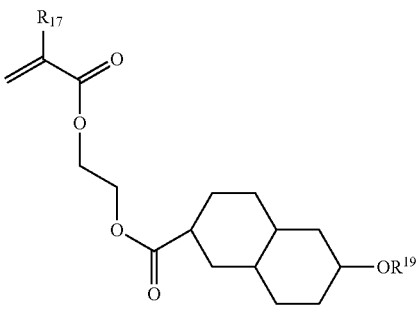
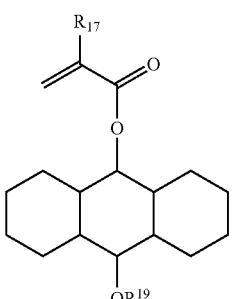
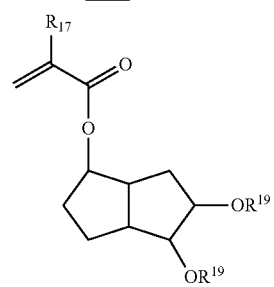
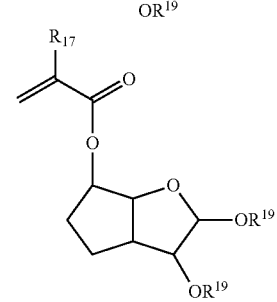
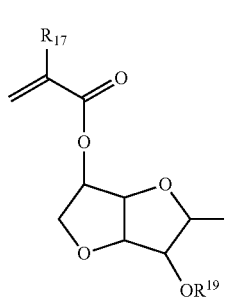
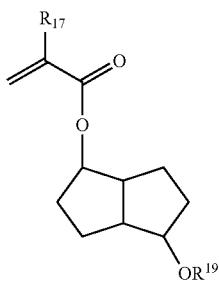
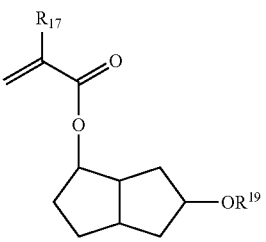
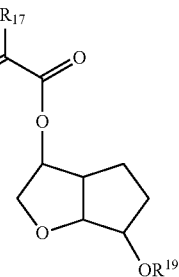

-continued
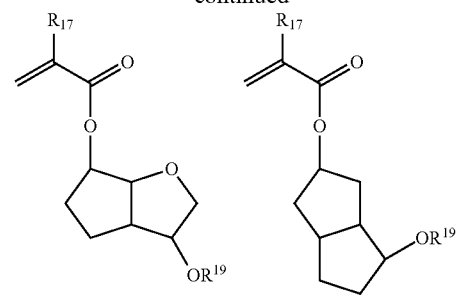
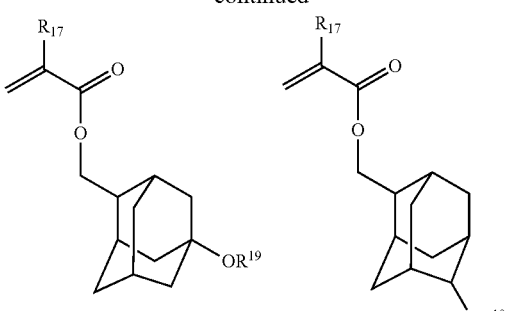
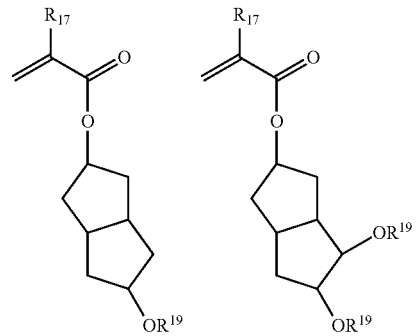
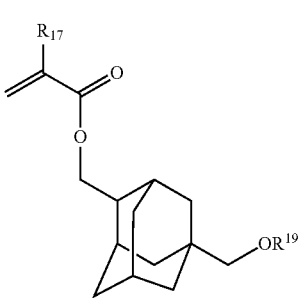
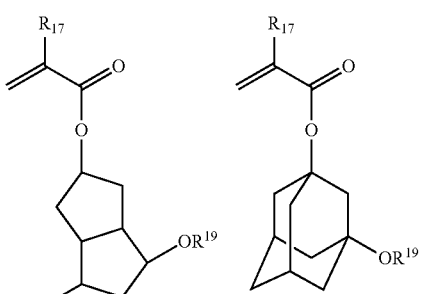
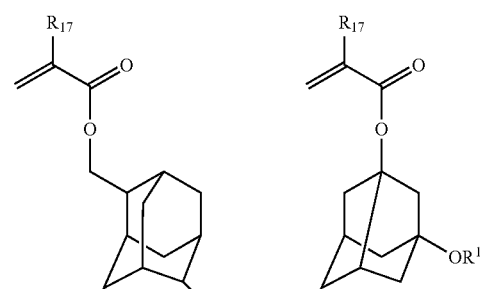
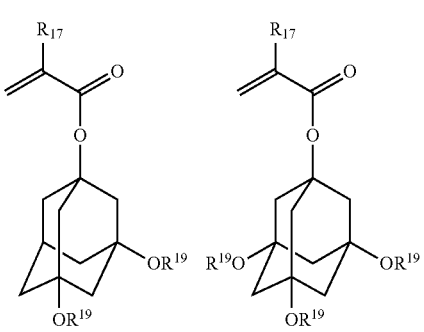
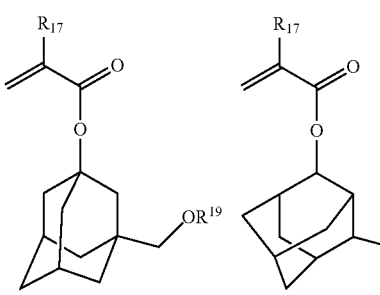
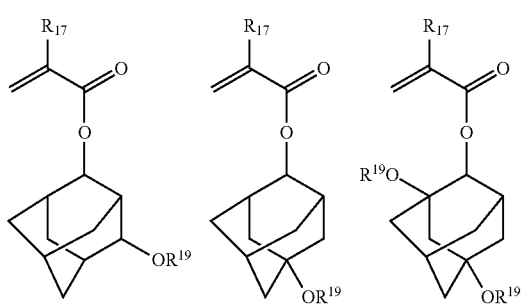
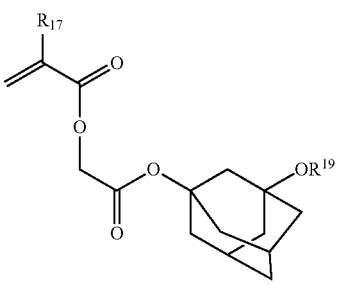

-continued
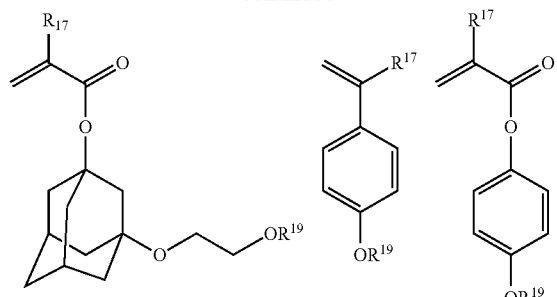
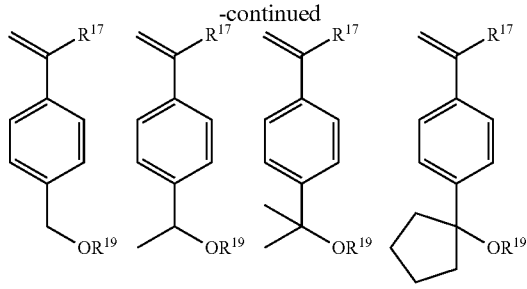
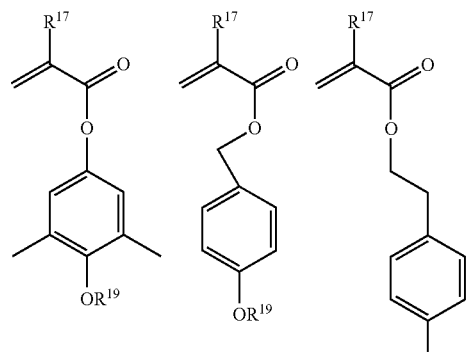
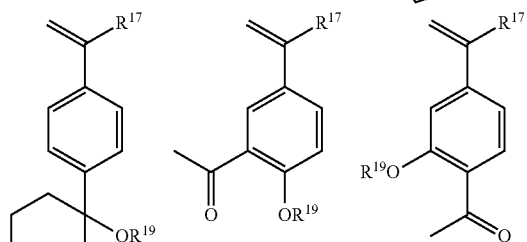
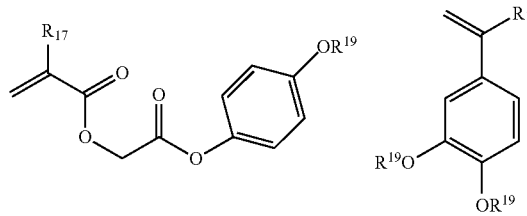
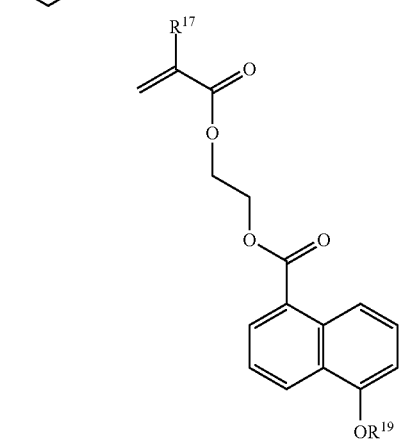
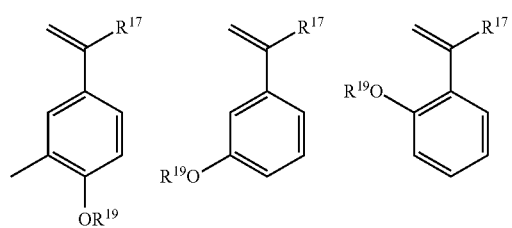
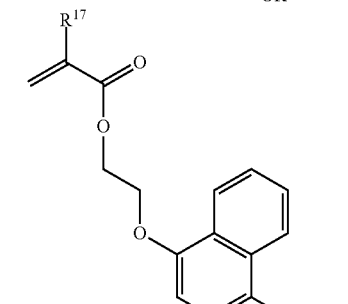
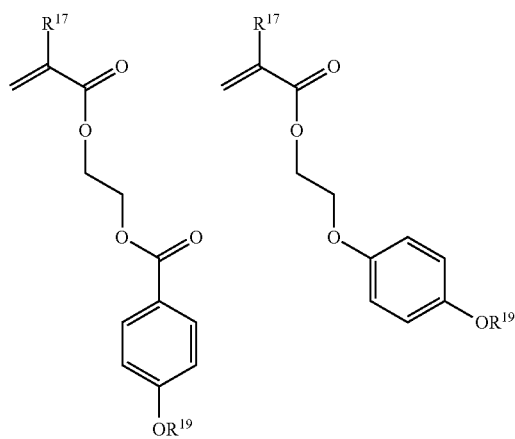
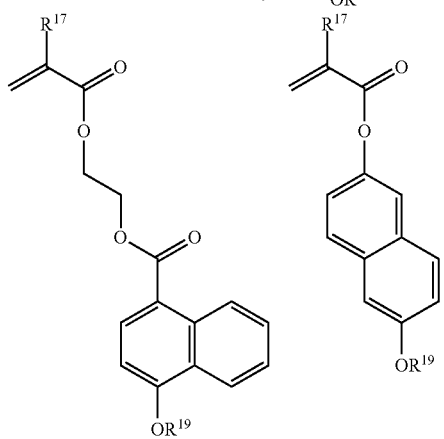

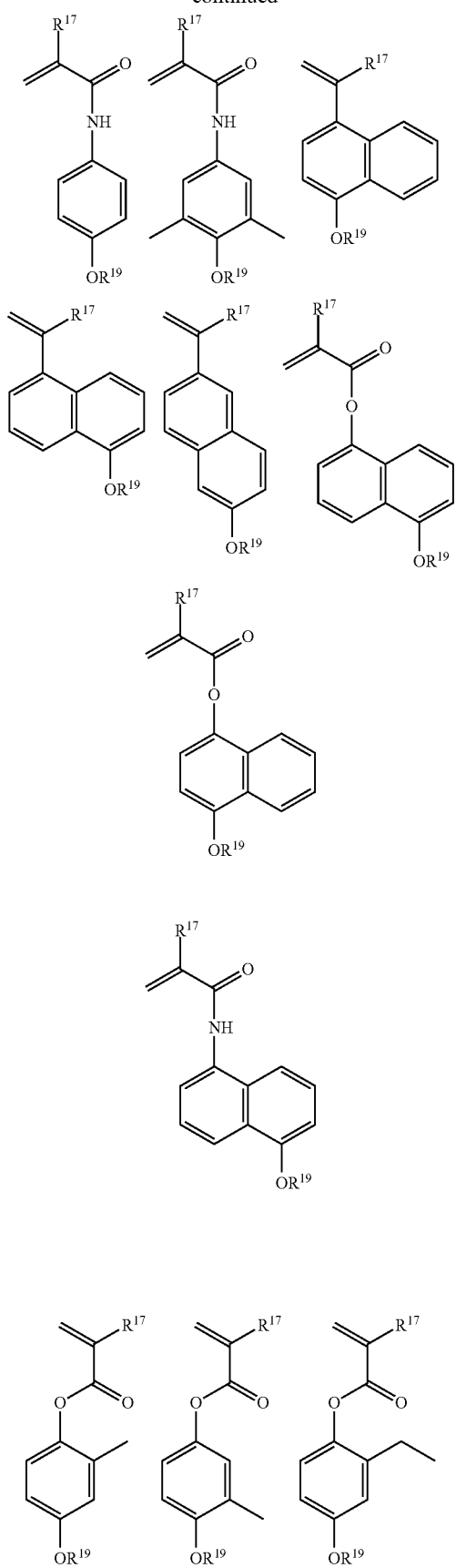
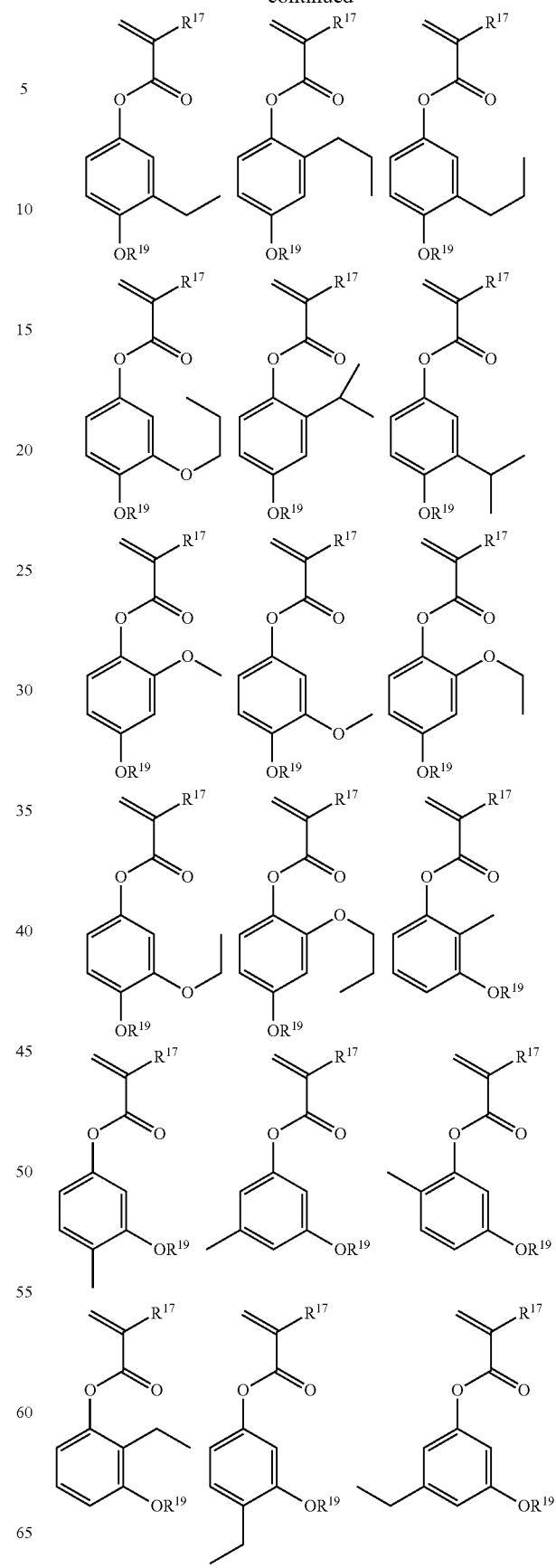

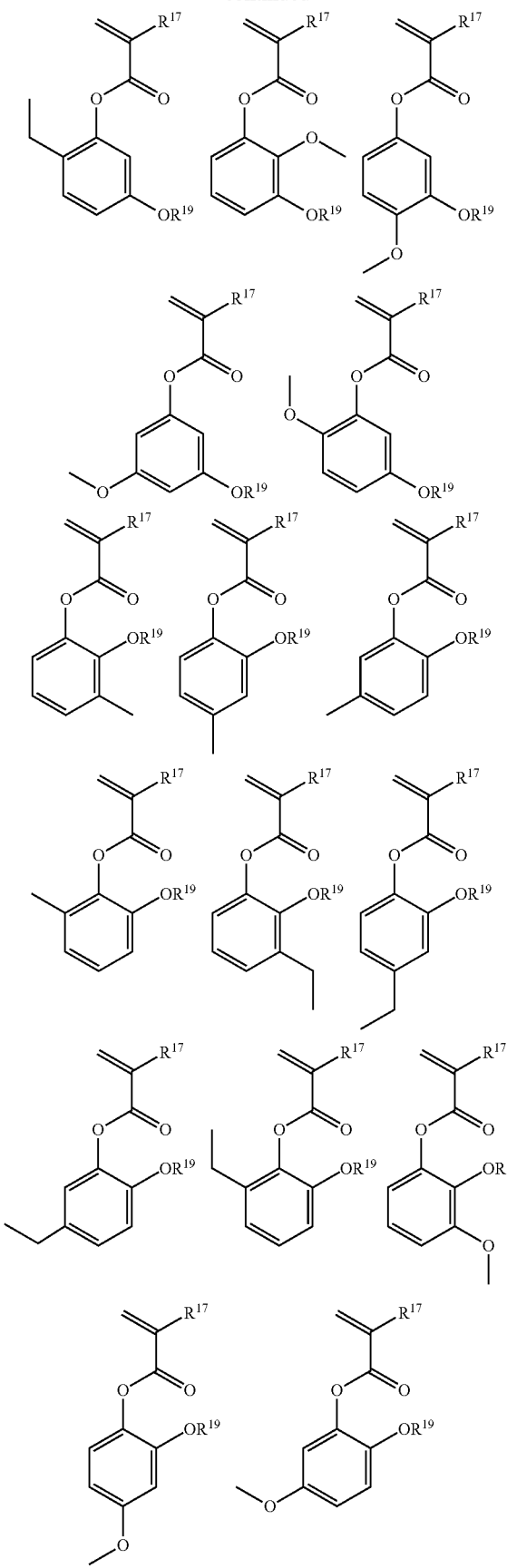
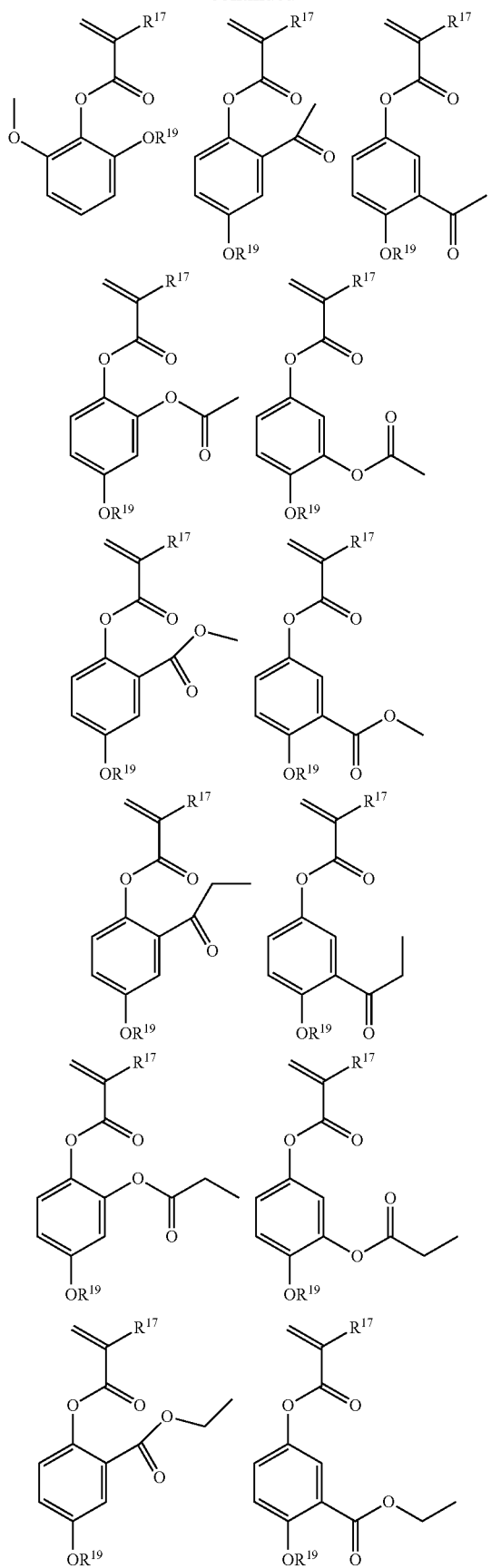

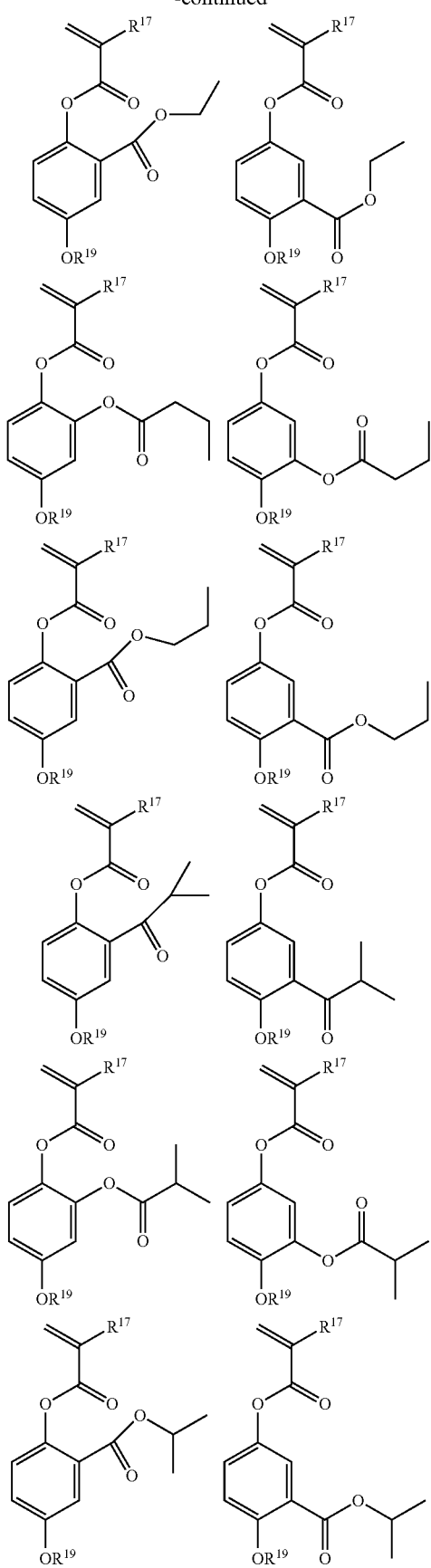
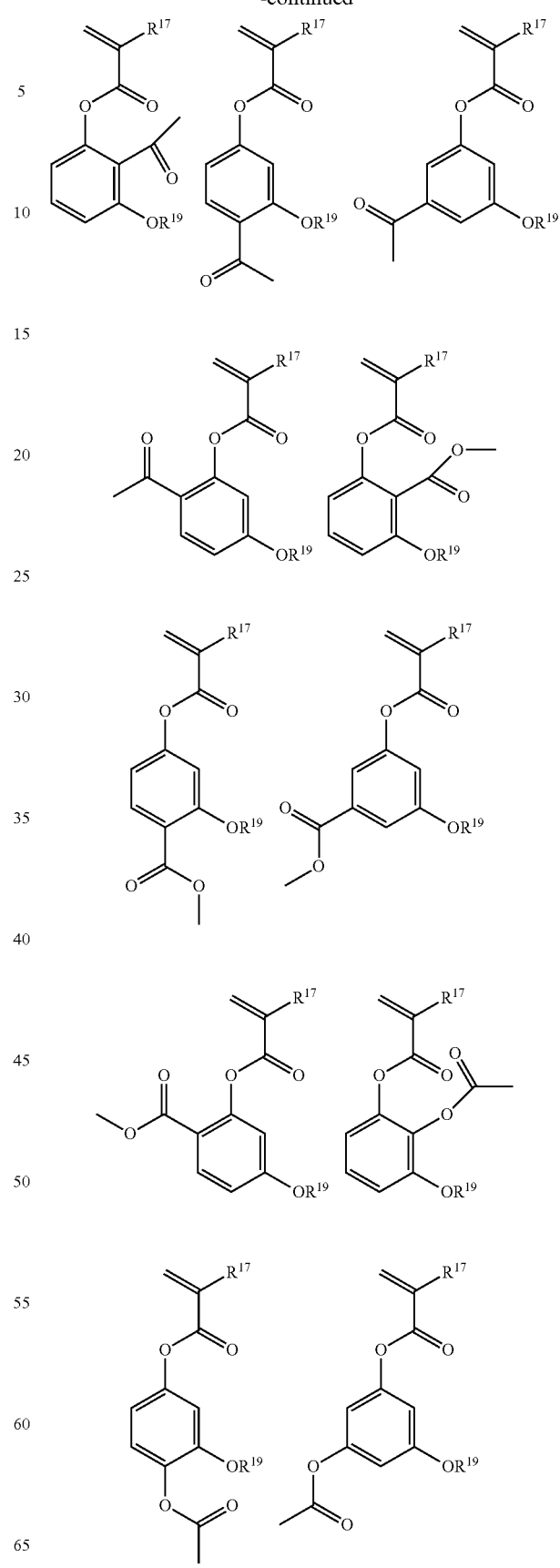

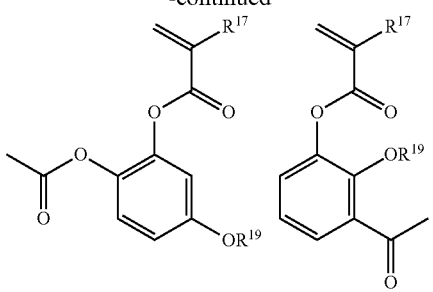
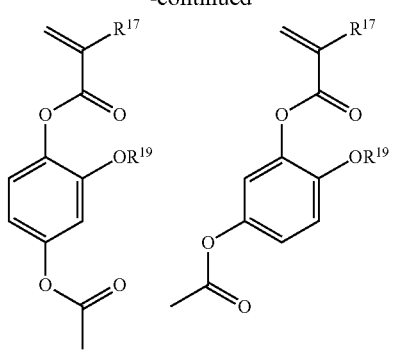
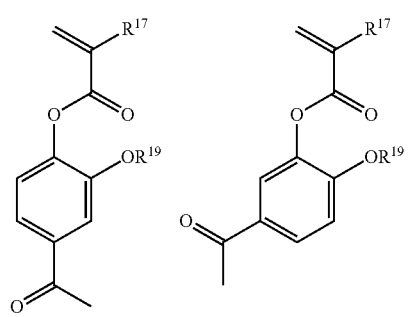
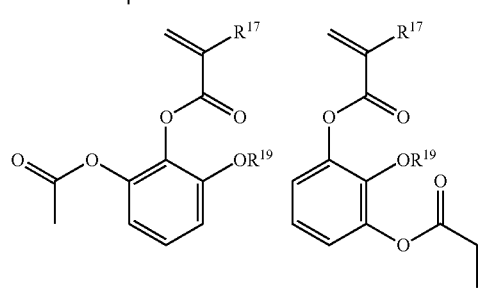
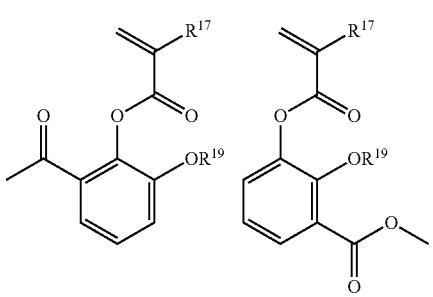
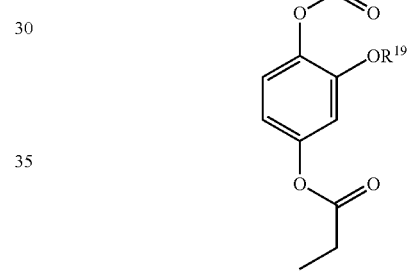
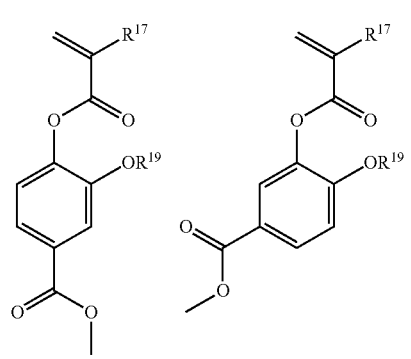
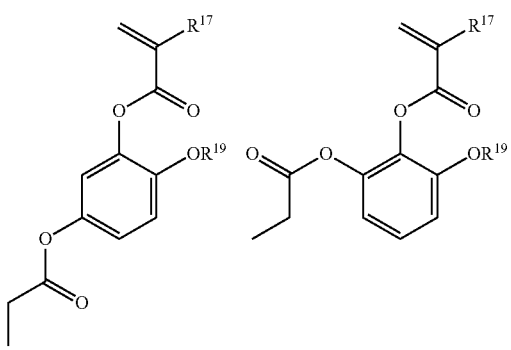
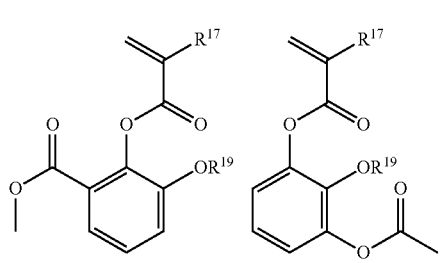
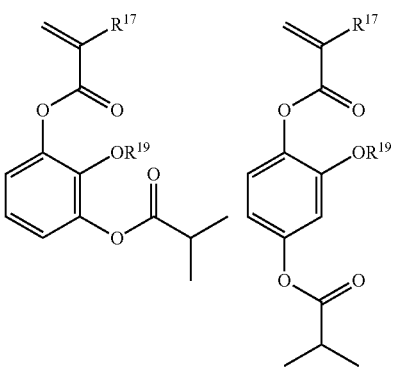

-continued
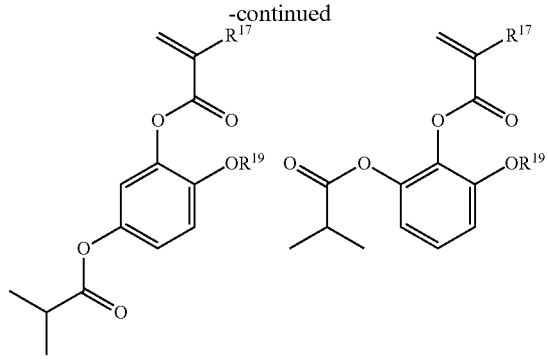
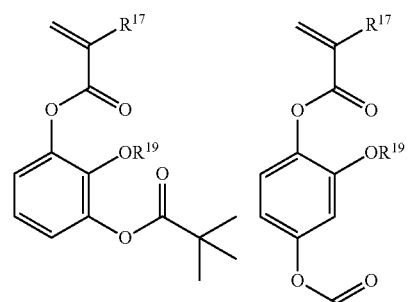
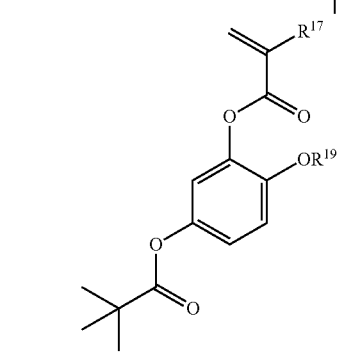
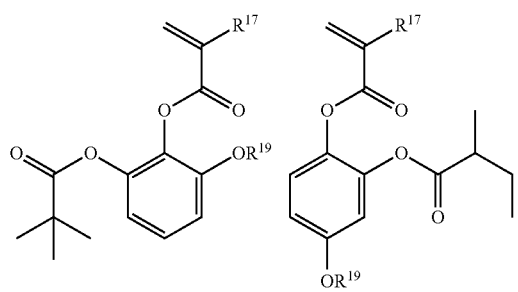
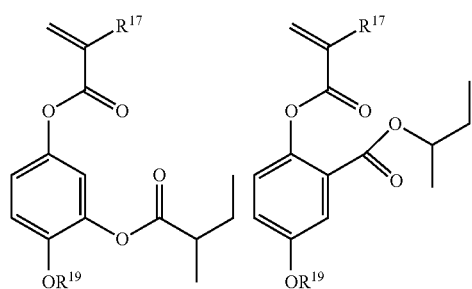
-continued
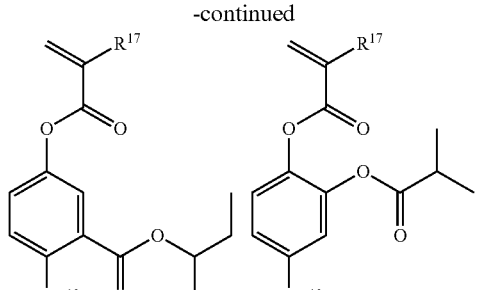
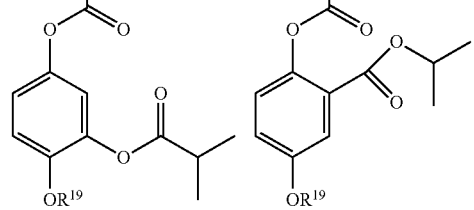
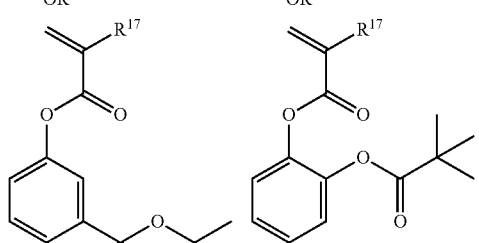
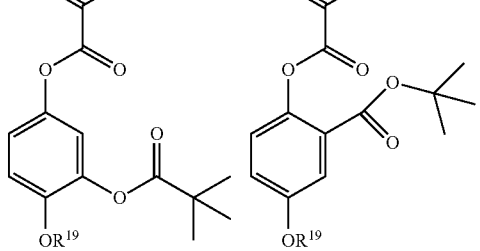
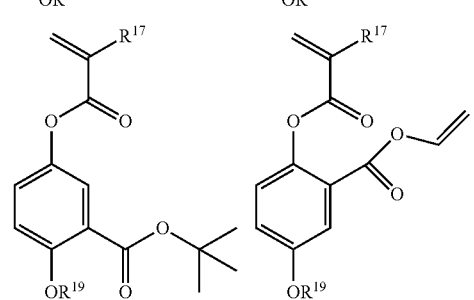
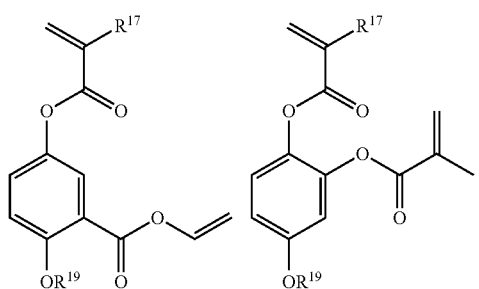

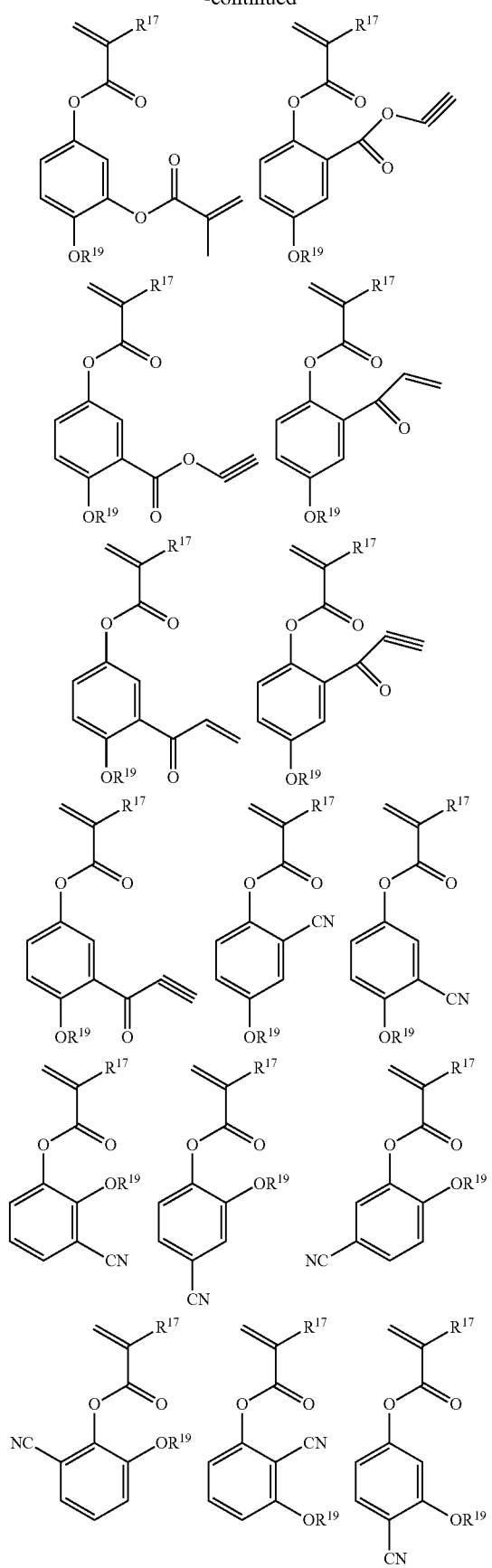
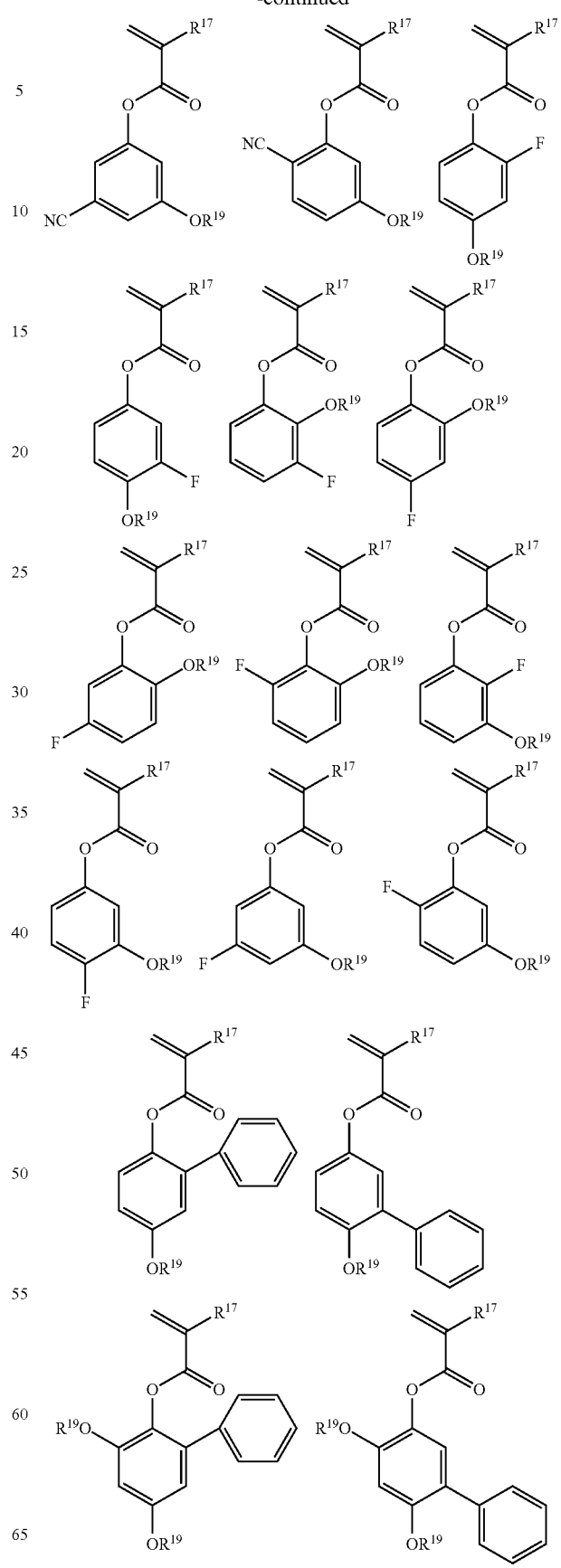

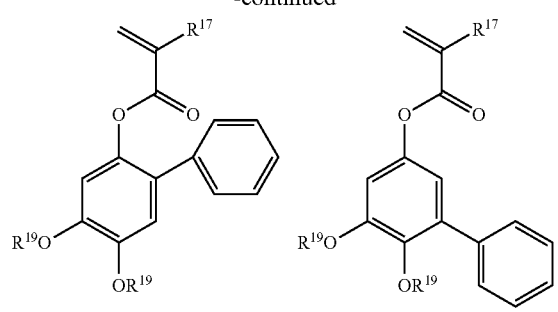
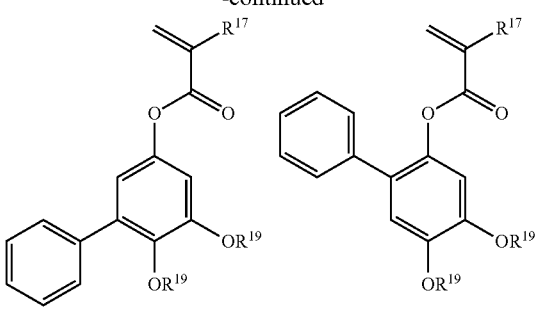
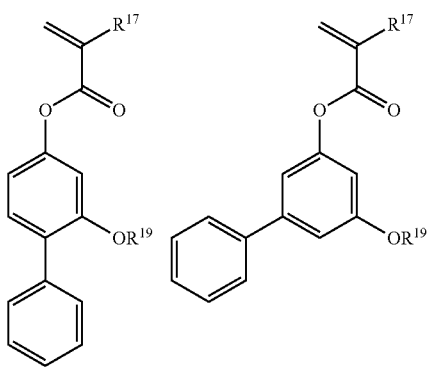
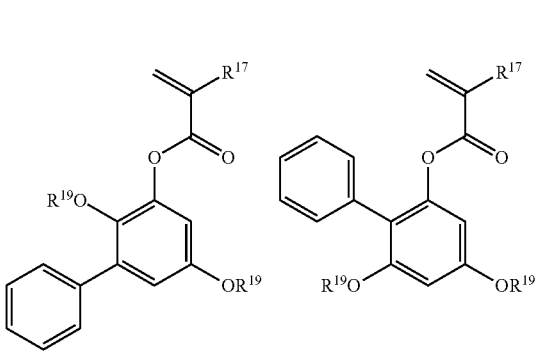
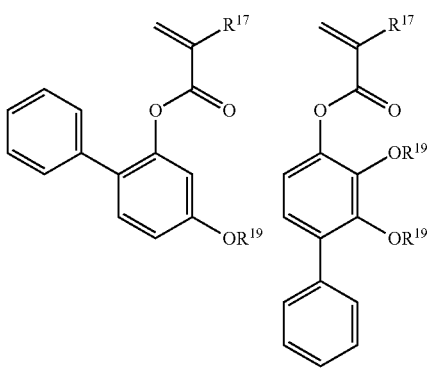
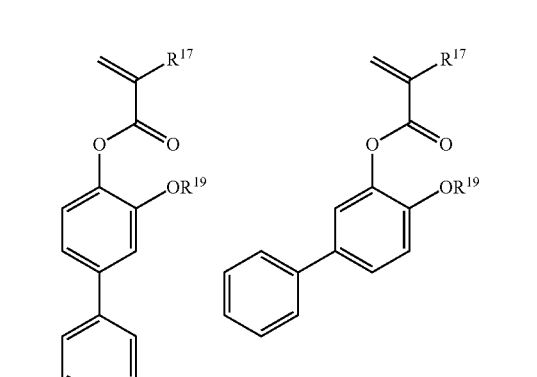
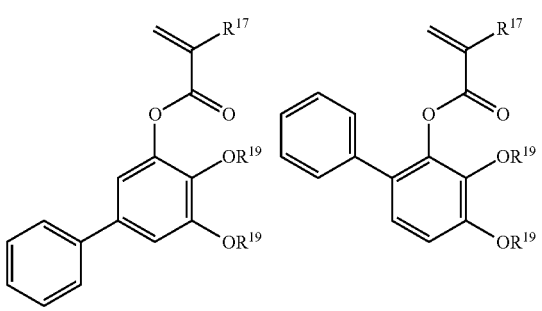
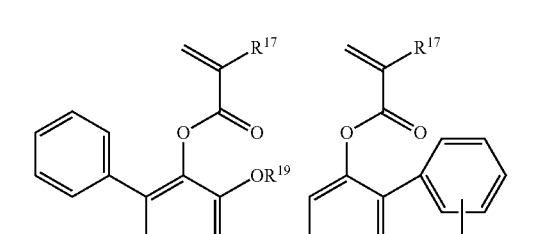
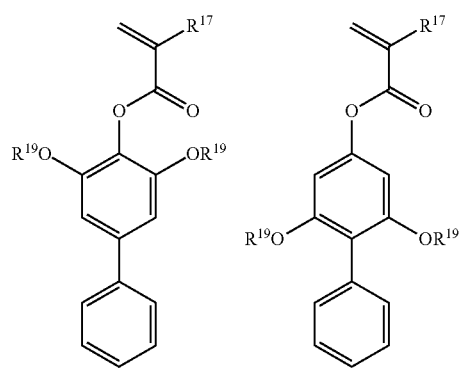
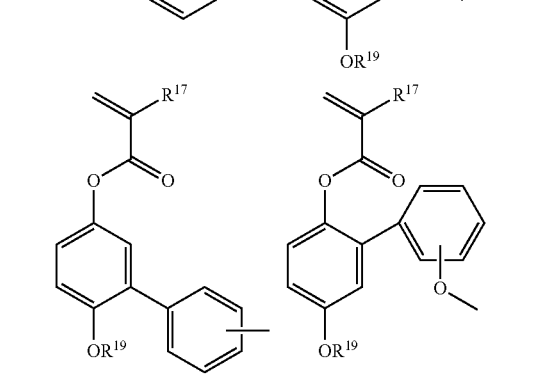

-continued
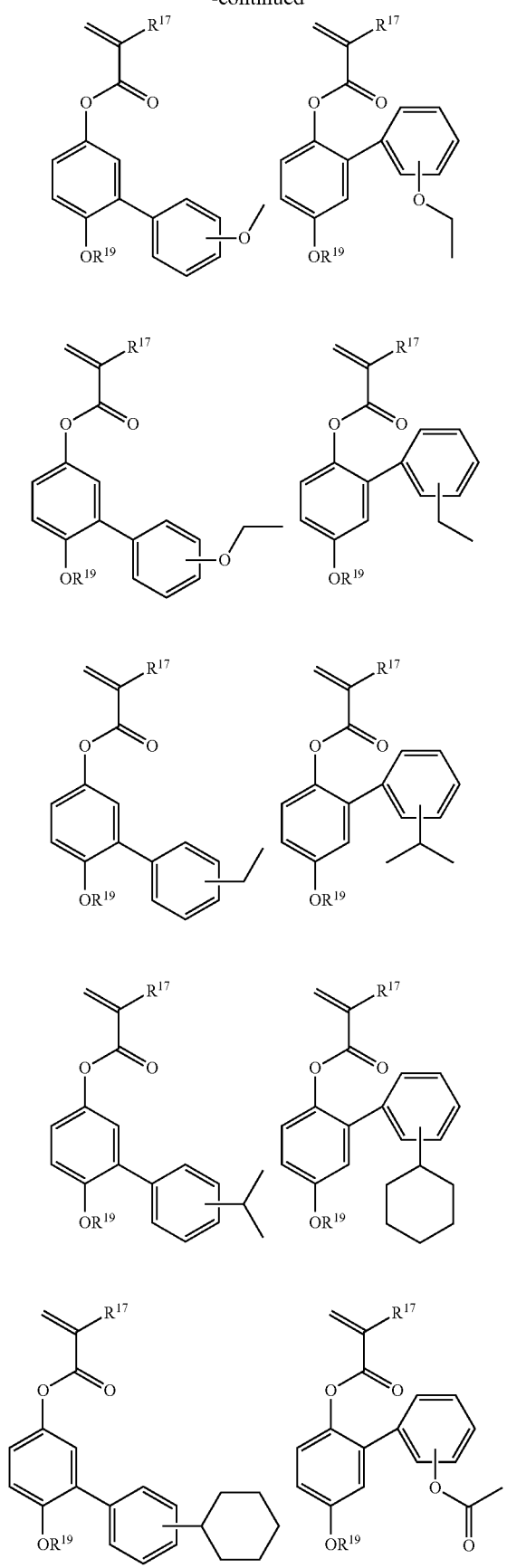
-continued
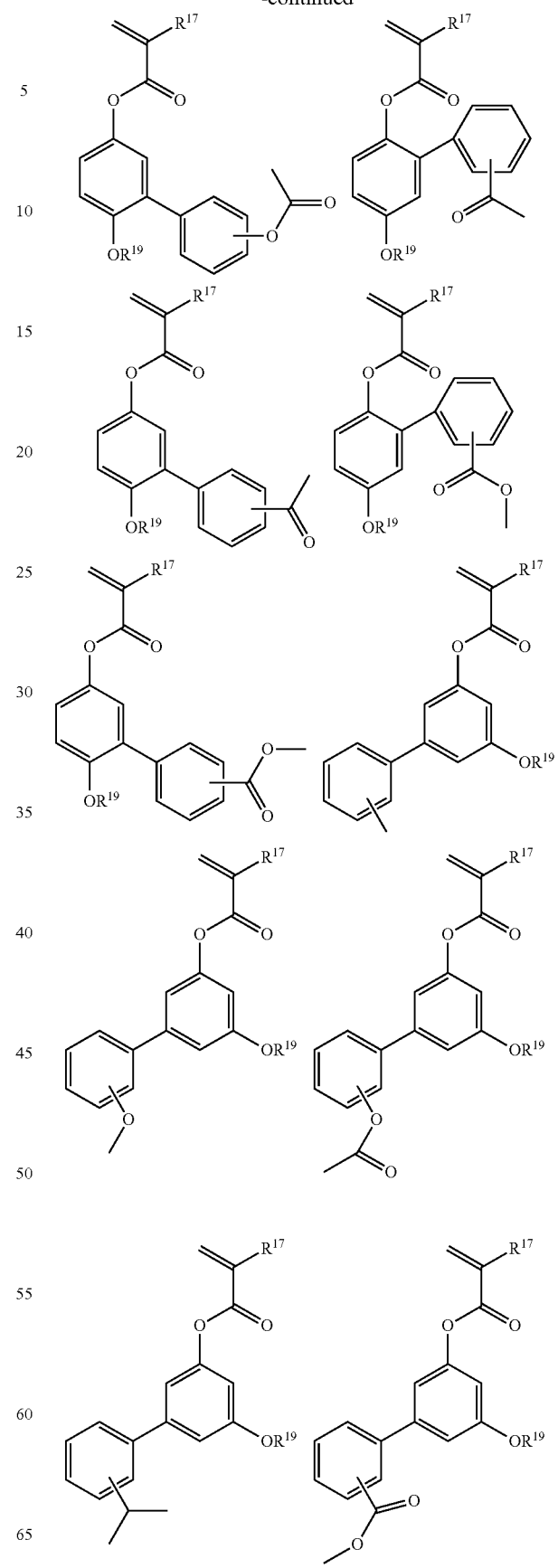

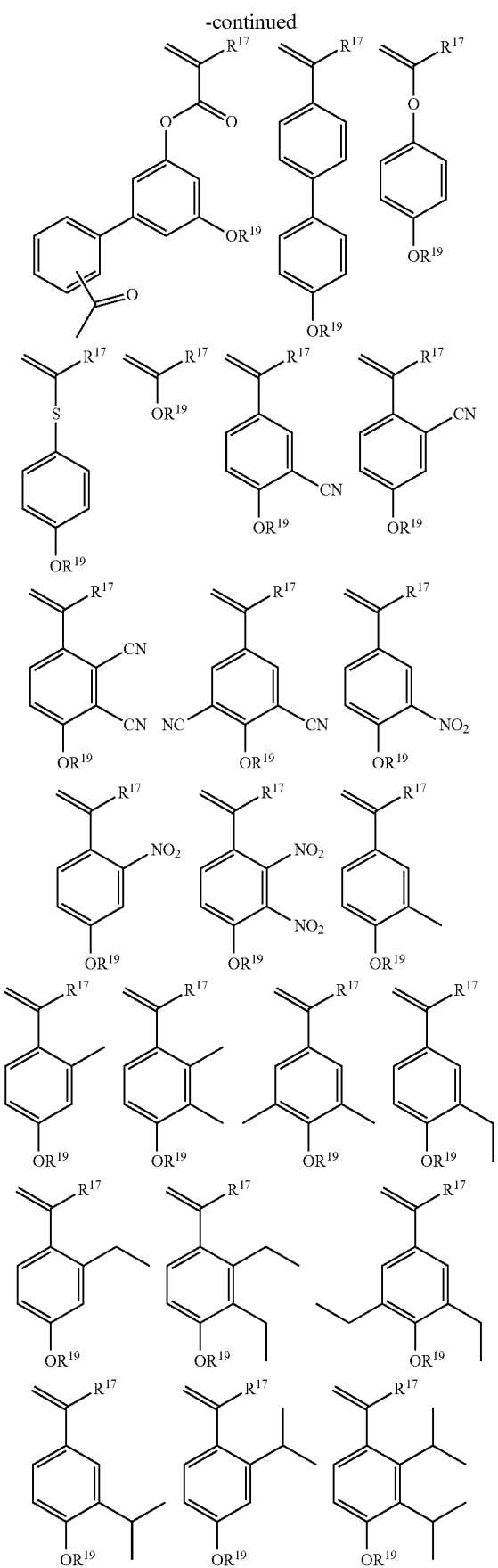

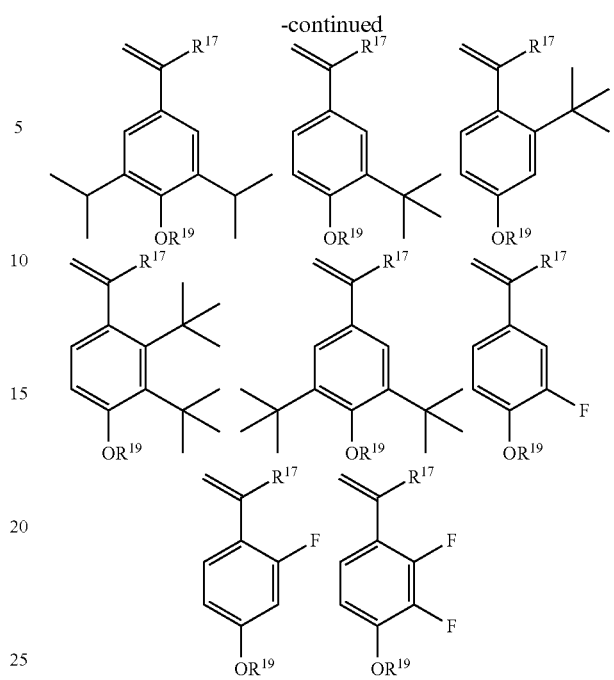

Herein $R^{17}$ and $R^{19}$ are as defined above.

The acid labile group $R^{16}$ or $R^{19}$ may be selected from a variety of such groups while they may be the same or different. Suitable acid labile groups include groups of the formula (AL-10), acetal groups of the formula (AL-11), tertiary alkyl groups of the formula (AL-12), and $C_4$-$C_{20}$ oxoalkyl groups, but are not limited thereto.

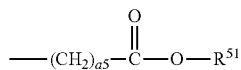 (AL-10)

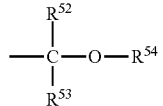 (AL-11)

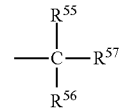 (AL-12)

In formulae (AL-10) and (AL-11), $R^{51}$ and $R^{54}$ each are a monovalent hydrocarbon group of 1 to 40 carbon atoms, more specifically 1 to 20 carbon atoms, which may contain a heteroatom such as oxygen, sulfur, nitrogen or fluorine. $R^{52}$ and $R^{53}$ each are hydrogen or a monovalent hydrocarbon group of 1 to 20 carbon atoms which may contain a heteroatom such as oxygen, sulfur, nitrogen or fluorine. The subscript "a5" is an integer of 0 to 10, and especially 1 to 5. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms. In formula (AL-12), $R^{55}$, $R^{56}$ and $R^{57}$ each are a monovalent hydrocarbon group of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms. Typical of the monovalent hydrocarbon group are straight, branched or cyclic alkyl groups.

Illustrative examples of the acid labile group of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

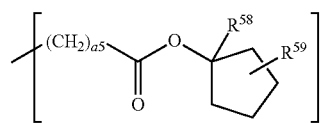
(AL-10)-1

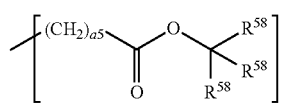
(AL-10)-2

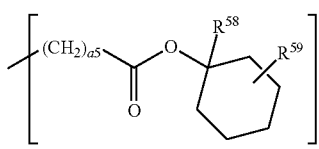
(AL-10)-3

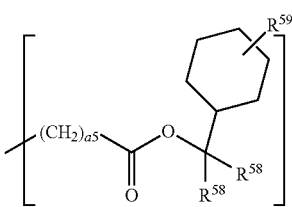
(AL-10)-4

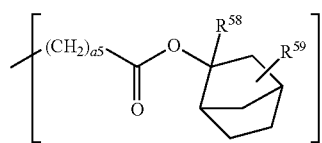
(AL-10)-5

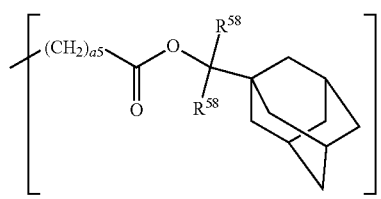
(AL-10)-6

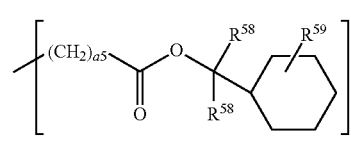
(AL-10)-7

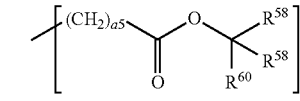
(AL-10)-8

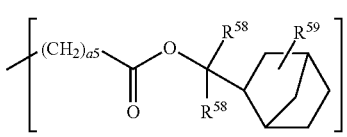
(AL-10)-9

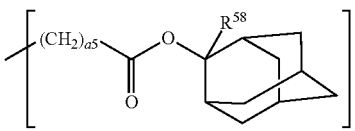
(AL-10)-10

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and a5 is an integer of 0 to 10, especially 1 to 5.

Illustrative examples of the acetal group of formula (AL-11) include those of the following formulae (AL-11)-1 to (AL-11)-112.

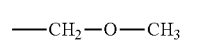
(AL-11)-1

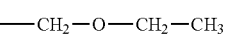
(AL-11)-2

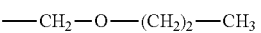
(AL-11)-3

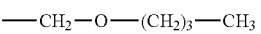
(AL-11)-4

(AL-11)-5

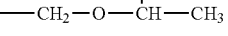
(AL-11)-6

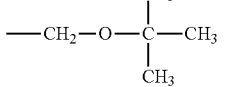
(AL-11)-7

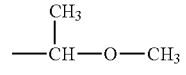
(AL-11)-8

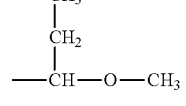
(AL-11)-9

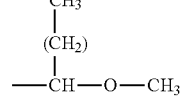
(AL-11)-10

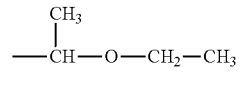
(AL-11)-11

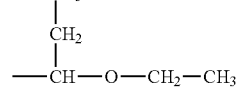
(AL-11)-12

-continued
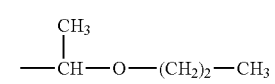 (AL-11)-13
 (AL-11)-14
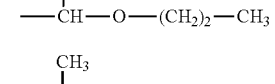 (AL-11)-15
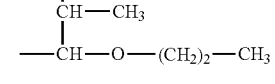 (AL-11)-16
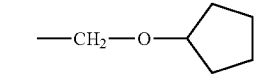 (AL-11)-17
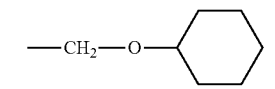 (AL-11)-18
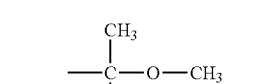 (AL-11)-19
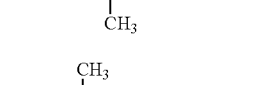 (AL-11)-20
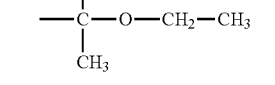 (AL-11)-21
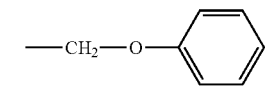 (AL-11)-22
 (AL-11)-23
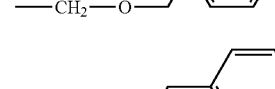 (AL-11)-24
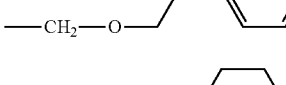 (AL-11)-25
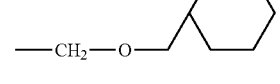 (AL-11)-26
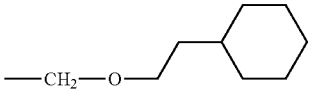 (AL-11)-27
-continued
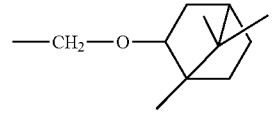 (AL-11)-28
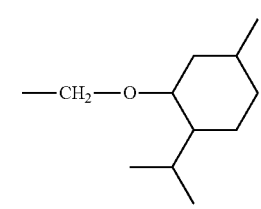 (AL-11)-29
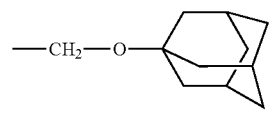 (AL-11)-30
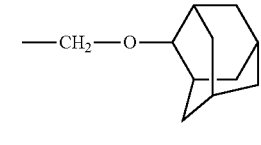 (AL-11)-31
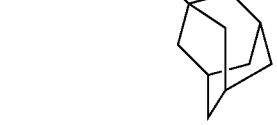 (AL-11)-32
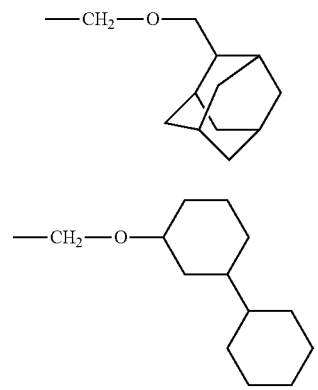 (AL-11)-33
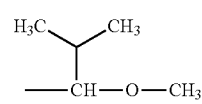 (AL-11)-34
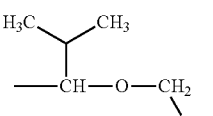 (AL-11)-35
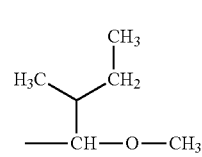 (AL-11)-36
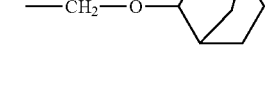 (AL-11)-37

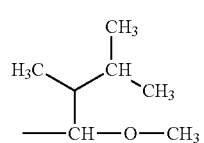 (AL-11)-38
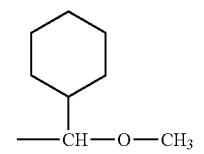 (AL-11)-39
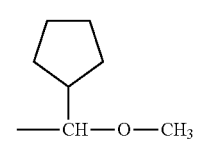 (AL-11)-40
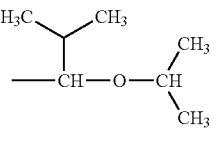 (AL-11)-41
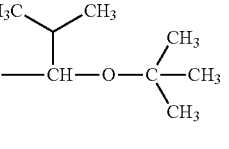 (AL-11)-42
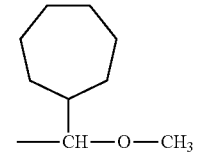 (AL-11)-43
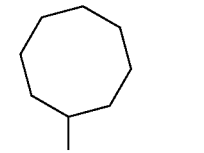 (AL-11)-44
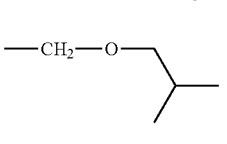 (AL-11)-45
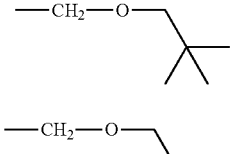 (AL-11)-46
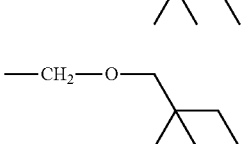 (AL-11)-47
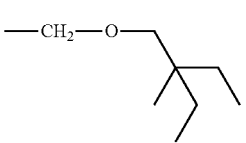 (AL-11)-48
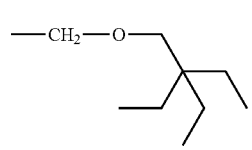 (AL-11)-49
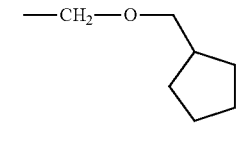 (AL-11)-50
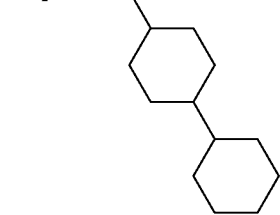 (AL-11)-51
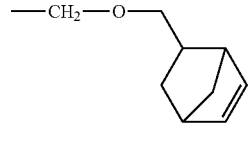 (AL-11)-52
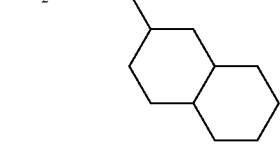 (AL-11)-53
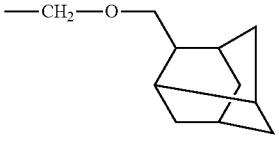 (AL-11)-54
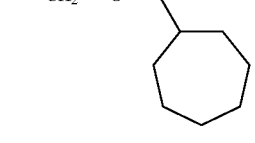 (AL-11)-55
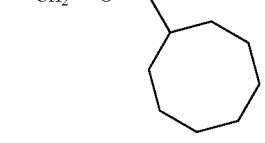 (AL-11)-56
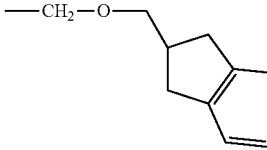 (AL-11)-57
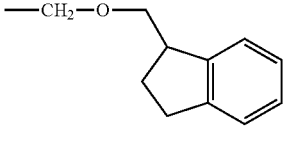 (AL-11)-58

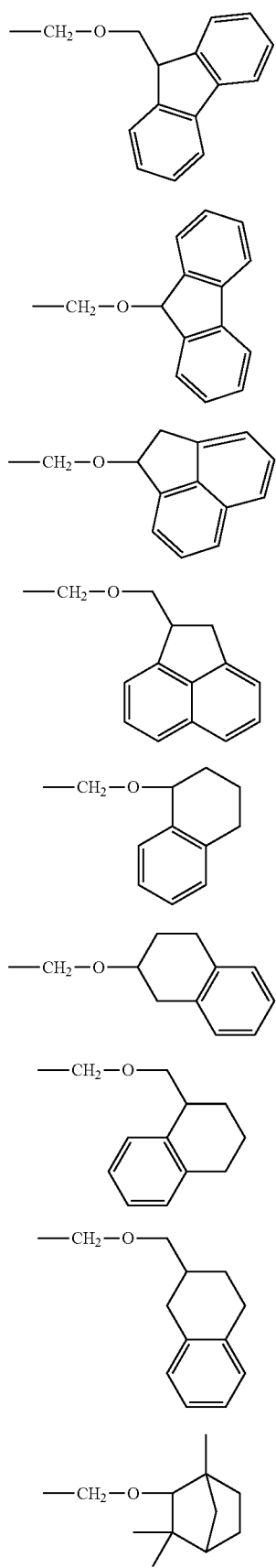

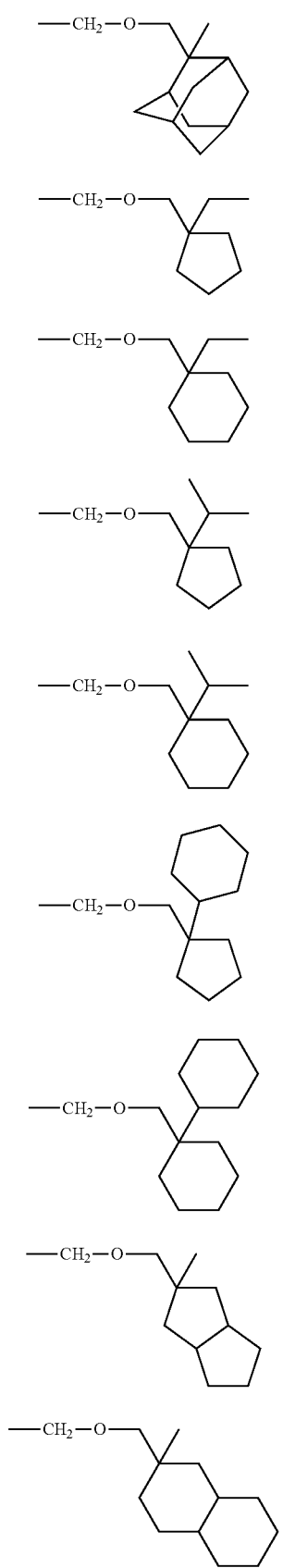
(AL-11)-80
(AL-11)-81
(AL-11)-82
(AL-11)-83
(AL-11)-84
(AL-11)-85
(AL-11)-86
(AL-11)-87
(AL-11)-88
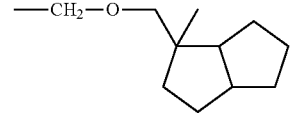 (AL-11)-89
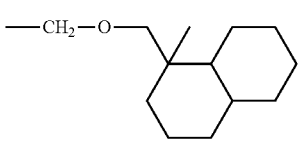 (AL-11)-90
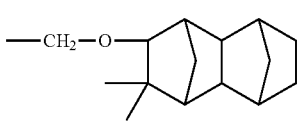 (AL-11)-91
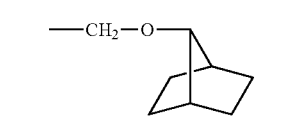 (AL-11)-92
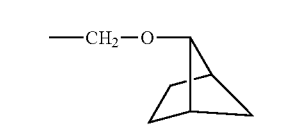 (AL-11)-93
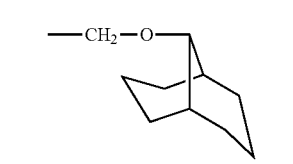 (AL-11)-94
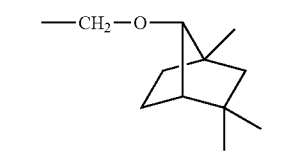 (AL-11)-95
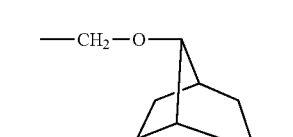 (AL-11)-96
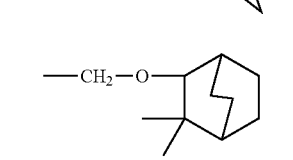 (AL-11)-97
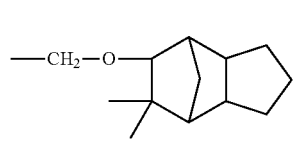 (AL-11)-98
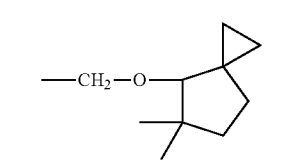 (AL-11)-99

-continued (AL-11)-100 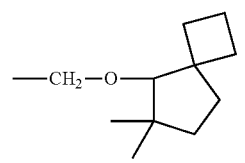

(AL-11)-101 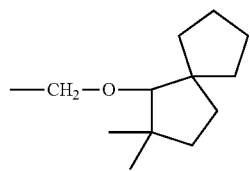

(AL-11)-102 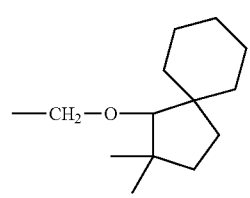

(AL-11)-103 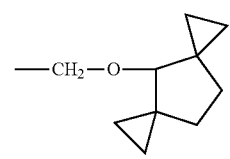

(AL-11)-104 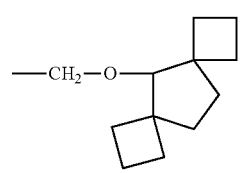

(AL-11)-105 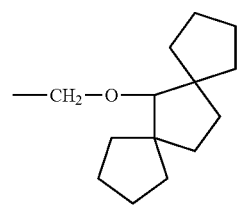

(AL-11)-106 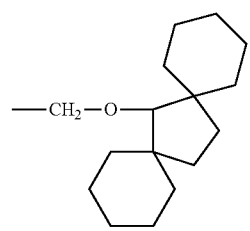

(AL-11)-107 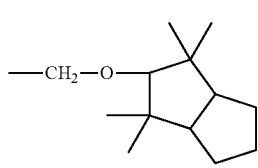

(AL-11)-108 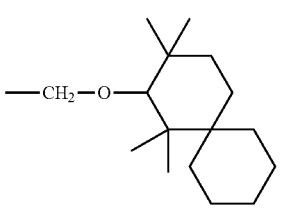

(AL-11)-109 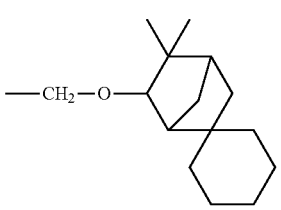

(AL-11)-110 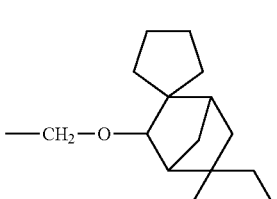

(AL-11)-111 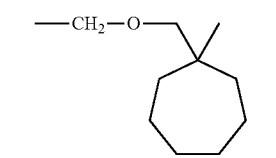

(AL-11)-112 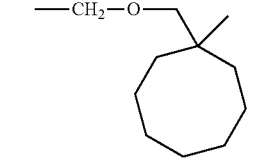

Other examples of acid labile groups include those of the following formula (AL-11a) or (AL-11b) while the polymer may be crosslinked within the molecule or between molecules with these acid labile groups.

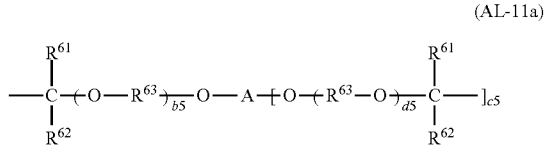
(AL-11a)

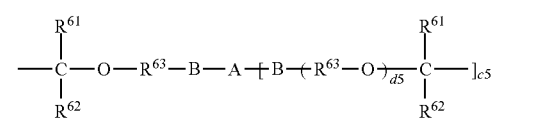
(AL-11b)

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may contain a heteroatom such as oxygen, sulfur or nitrogen or in which some carbon-bonded hydrogen atoms may be substituted by hydroxyl, carboxyl, acyl radicals or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups; each of b5 and d5 is 0 or an integer of 1 to 5; and c5 is an integer of 1 to 3.

The crosslinking acetal groups of formulae (AL-11a) and (AL-11b) are exemplified by the following formulae (AL-11)-113 through (AL-11)-120, but not limited thereto.

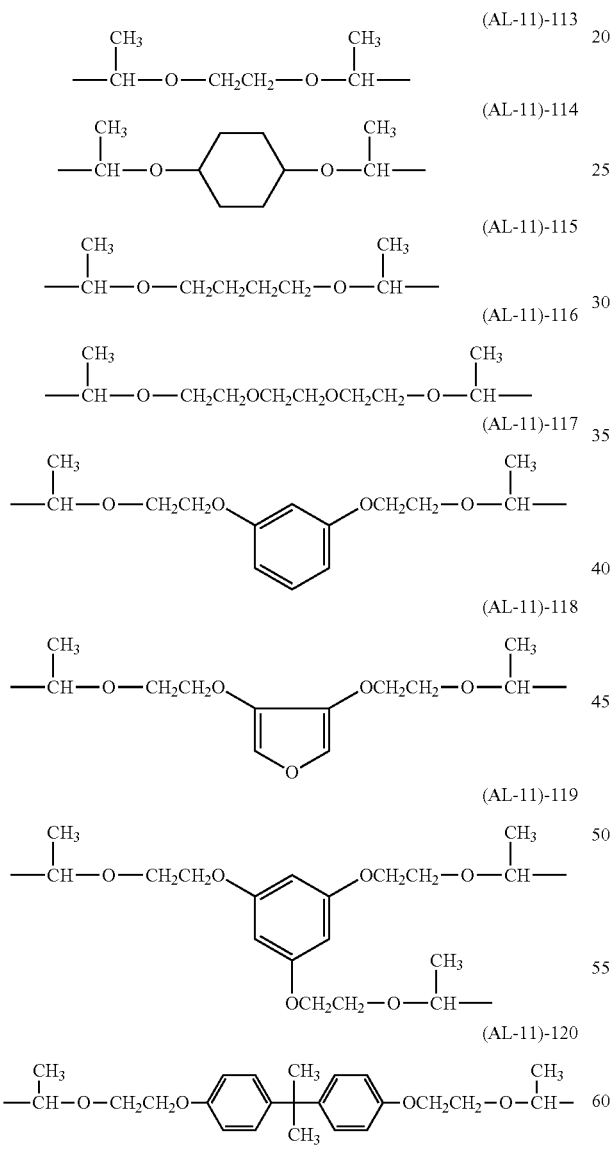

Illustrative examples of the tertiary alkyl group of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

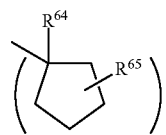

(AL-12)-1

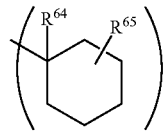

(AL-12)-2

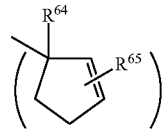

(AL-12)-3

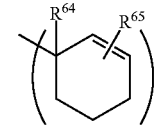

(AL-12)-4

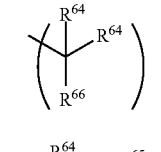

(AL-12)-5

(AL-12)-6

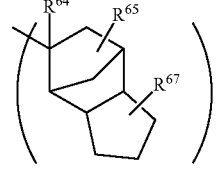

(AL-12)-7

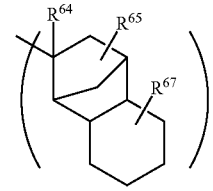

(AL-12)-8

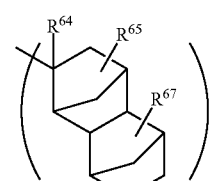

(AL-12)-9

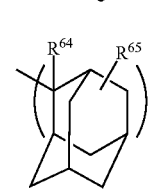

(AL-12)-10

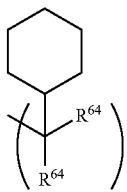
(AL-12)-11

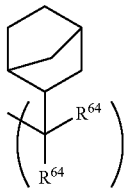
(AL-12)-12

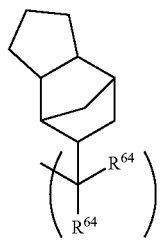
(AL-12)-13

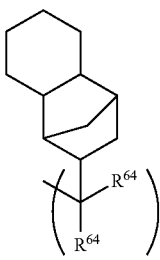
(AL-12)-14

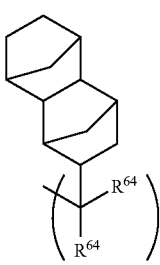
(AL-12)-15

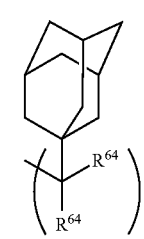
(AL-12)-16

Herein $R^{64}$ is each independently a straight, branched or cyclic $C_1$-$C_8$ alkyl group, $C_6$-$C_{20}$ aryl group or $C_7$-$C_{20}$ aralkyl group, or two $R^{64}$ groups may bond together to form a ring. $R^{65}$ and $R^{67}$ each are hydrogen, methyl or ethyl. $R^{66}$ is a $C_6$-$C_{20}$ aryl group or $C_7$-$C_{20}$ aralkyl group.

Also included are acid labile groups having the following formula (AL-12)-17. With acid labile groups containing $R^{68}$ representative of a di- or poly-valent alkylene or arylene group, the polymer may be crosslinked within the molecule or between molecules.

(AL-12)-17

Herein, $R^{64}$ is as defined above, $R^{68}$ is a single bond, a straight, branched or cyclic $C_1$-$C_{20}$ alkylene group or $C_6$-$C_{20}$ arylene group, which may contain a heteroatom such as oxygen, sulfur or nitrogen, and b6 is an integer of 0 to 3.

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

—(CH$_2$)$_4$OH  (AL-13)-1

—(CH$_2$)$_2$O(CH$_2$)$_3$CH$_3$  (AL-13)-2

—CH$_2$—⬡—CH$_2$OH  (AL-13)-3

—(CH$_2$)$_2$O(CH$_2$)$_2$OH  (AL-13)-4

—(CH$_2$)$_6$OH  (AL-13)-5

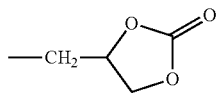
(AL-13)-6

(AL-13)-7

Of the acid labile groups of formula (AL-12), groups of exo-form structure having the following formula (AL-12)-19 are preferred.

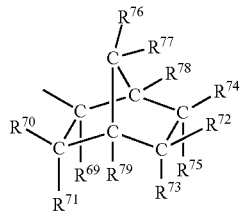
(AL-12)-19

Herein $R^{69}$ is a straight, branched or cyclic $C_1$-$C_8$ alkyl group or optionally substituted $C_6$-$C_{20}$ aryl group. $R^{70}$ to $R^{75}$, $R^{78}$, and $R^{79}$ are each independently hydrogen or a monovalent $C_1$-$C_{15}$ hydrocarbon group, typically straight, branched or cyclic alkyl, which may contain a heteroatom, $R^{76}$ and $R^{77}$ are hydrogen; or a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, typically aliphatic ring, with the carbon atom to which they are attached, and in this case, the ring-forming participant is a divalent $C_1$-$C_{15}$ hydrocarbon group, typically straight, branched or cyclic alkylene, which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

Suitable recurring units having an exo-form structure represented by the formula (AL-12)-19 are those having the following formula.

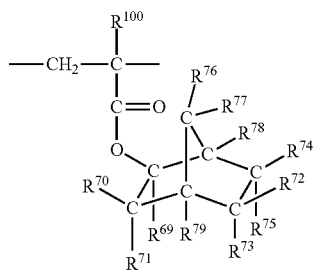

$R^{69}$ to $R^{79}$ are as defined above, and $R^{100}$ is hydrogen or methyl. The monomers from which these recurring units are derived are described in U.S. Pat. No. 6,448,420 (JP-A 2000-327633). Illustrative non-limiting examples thereof are given below.

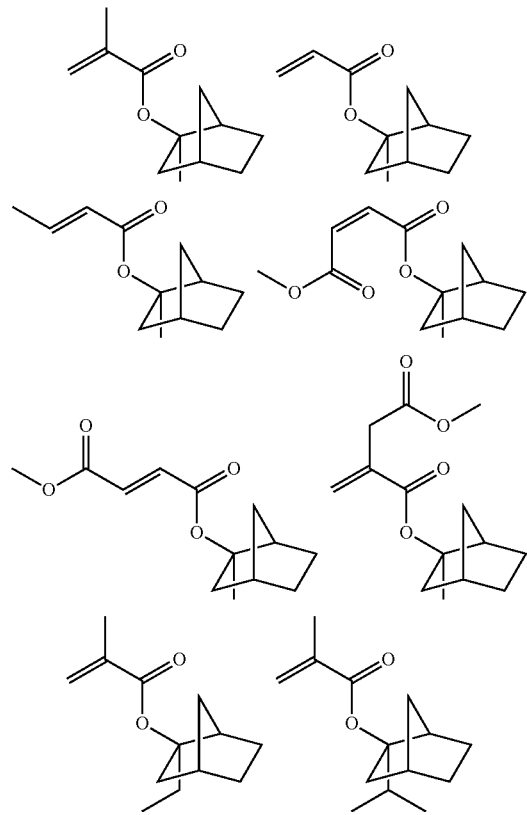

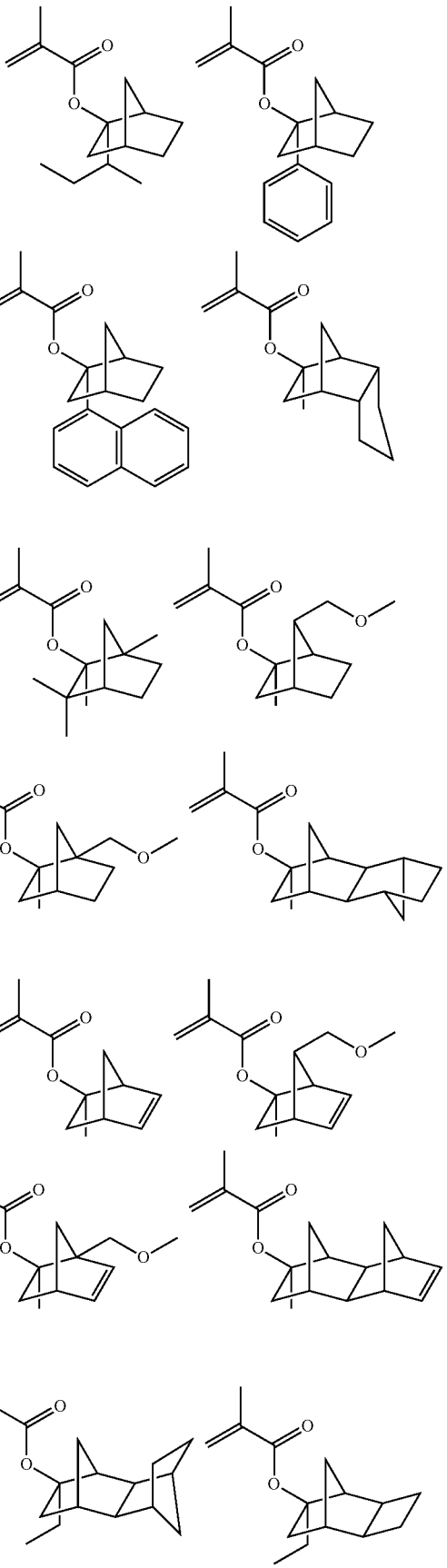

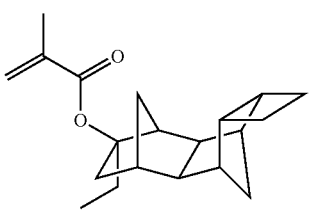

Also included in the acid labile groups of formula (AL-12) are acid labile groups having furandiyl, tetrahydrofurandiyl or oxanorbornanediyl as represented by the following formula (AL-12)-20.

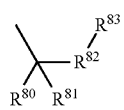
(AL-12)-20

Herein, $R^{80}$ and $R^{81}$ are each independently a $C_1$-$C_{10}$ monovalent hydrocarbon group. $R^{80}$ and $R^{81}$, taken together, may form an aliphatic hydrocarbon ring of 3 to 20 carbon atoms with the carbon atom to which they are attached. $R^{82}$ is furandiyl, tetrahydrofurandiyl or oxanorbornanediyl. $R^{83}$ is hydrogen or a $C_1$-$C_{10}$ monovalent hydrocarbon group which may contain a heteroatom. Typical of the monovalent hydrocarbon group are straight, branched or cyclic alkyl groups.

Recurring units having an acid labile group of formula (AL-12)-20 include those represented by the formula:

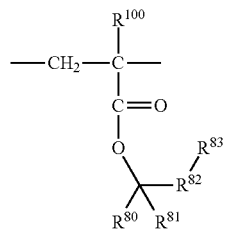

wherein $R^{100}$, $R^{80}$ to $R^{83}$ are as defined above. These recurring units are derived from monomers as exemplified below. Note that Me is methyl and Ac is acetyl.

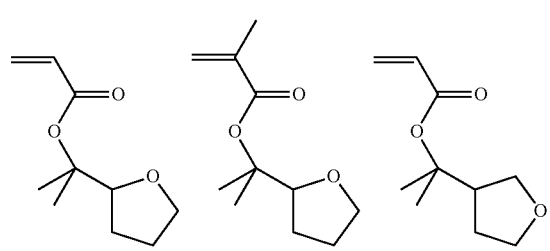

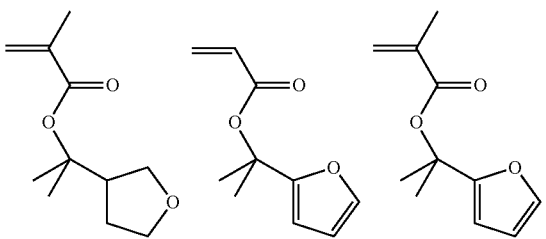

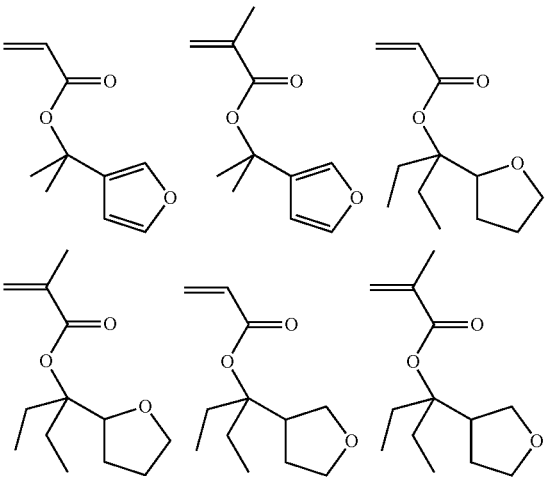

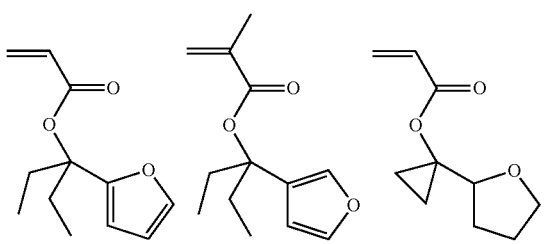

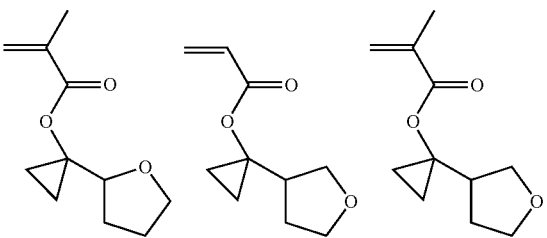

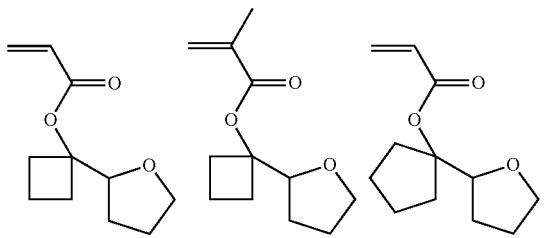

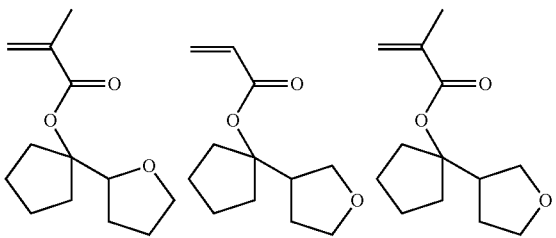

-continued
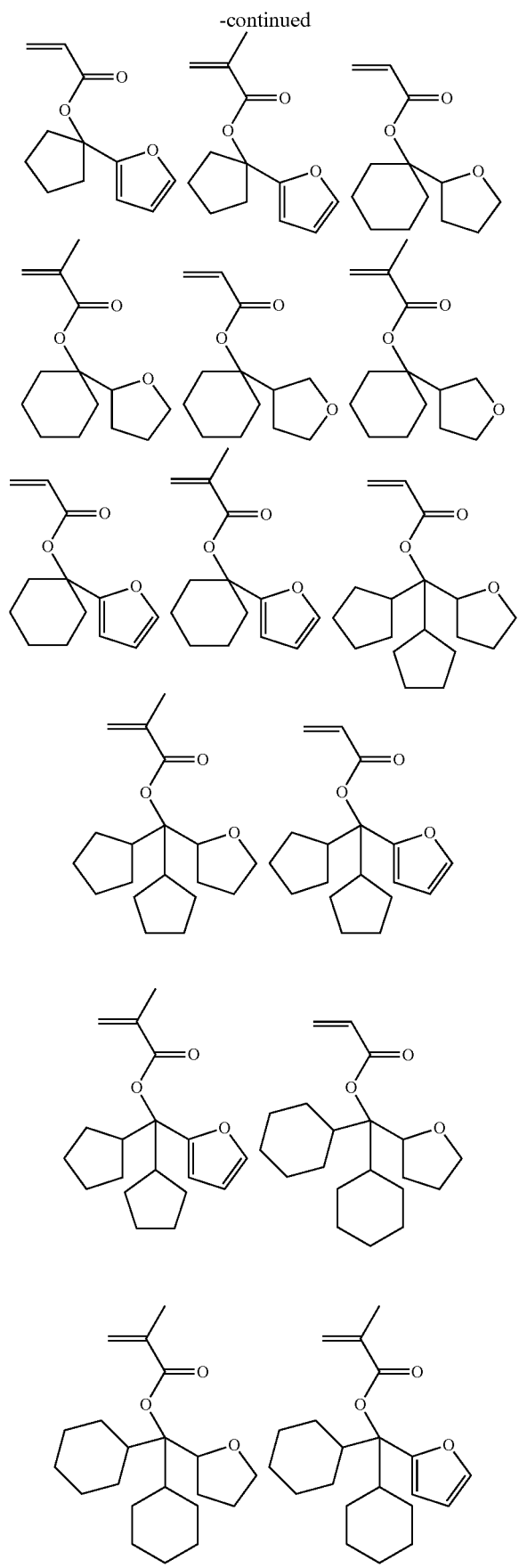
-continued
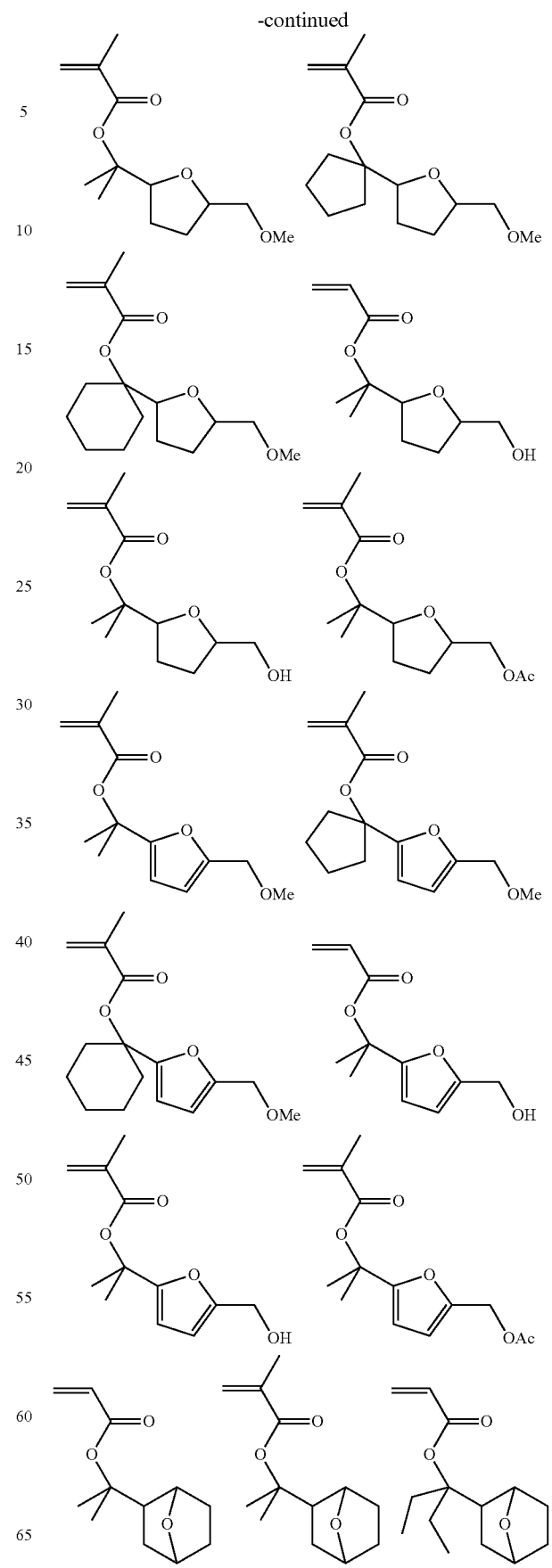

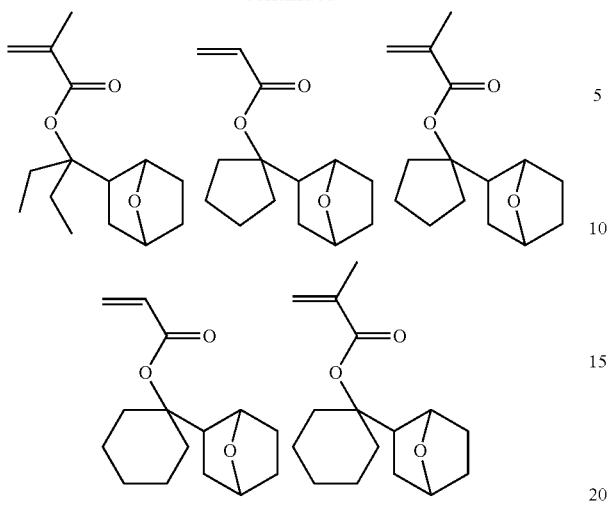
Of the acid labile groups of tertiary alkyl form having formula (Al-12), those acid labile groups having a branched alkyl directly attached to the ring offer high solubility in organic solvents. Suitable acid labile groups are exemplified below, but not limited thereto.
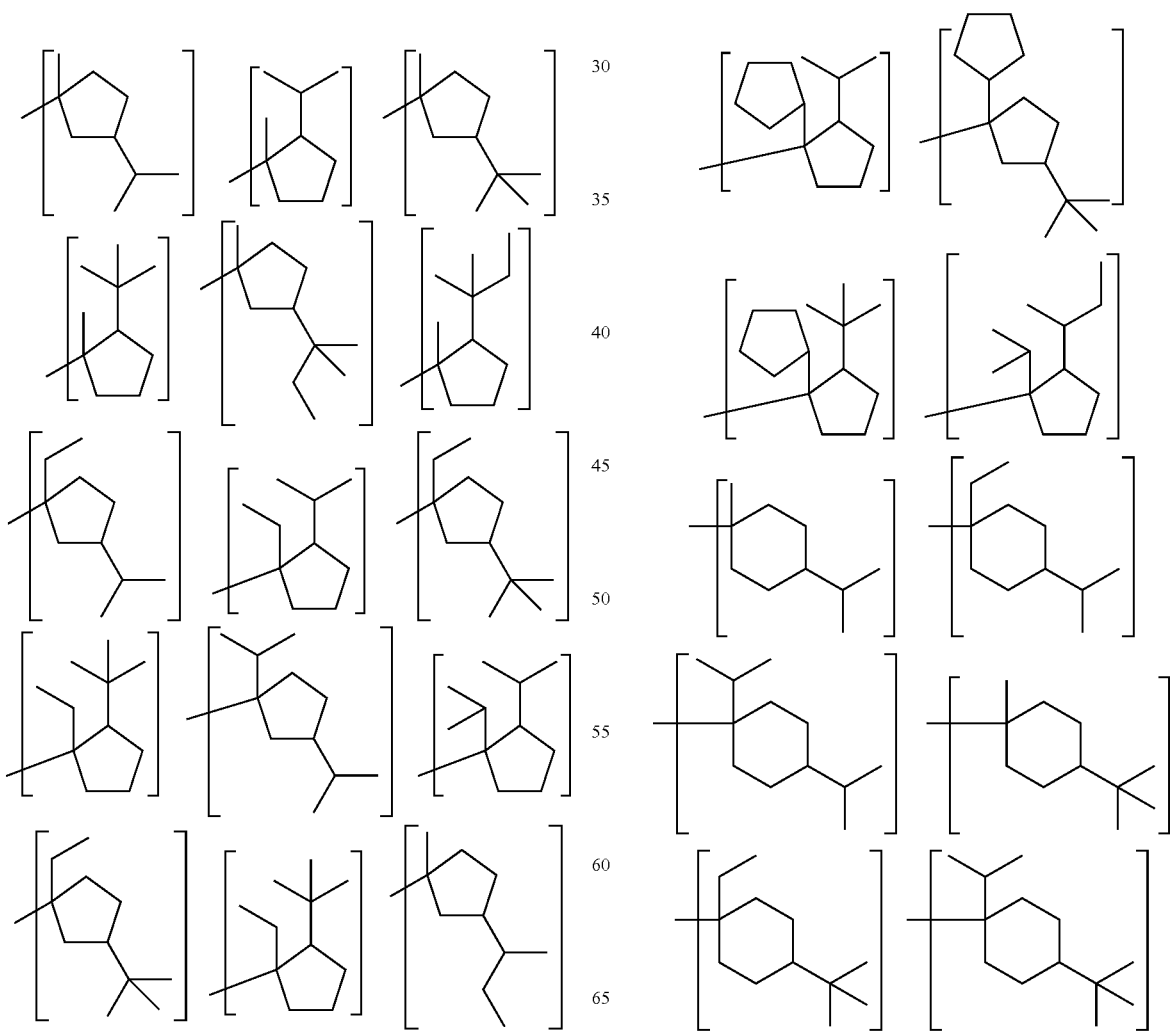

-continued
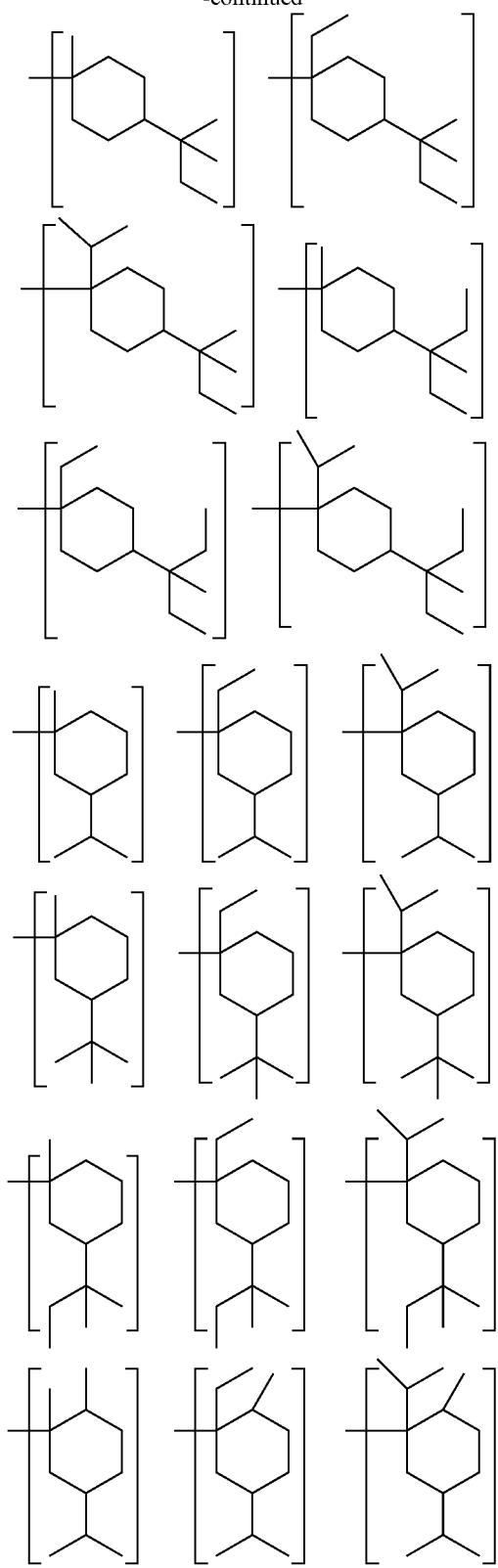
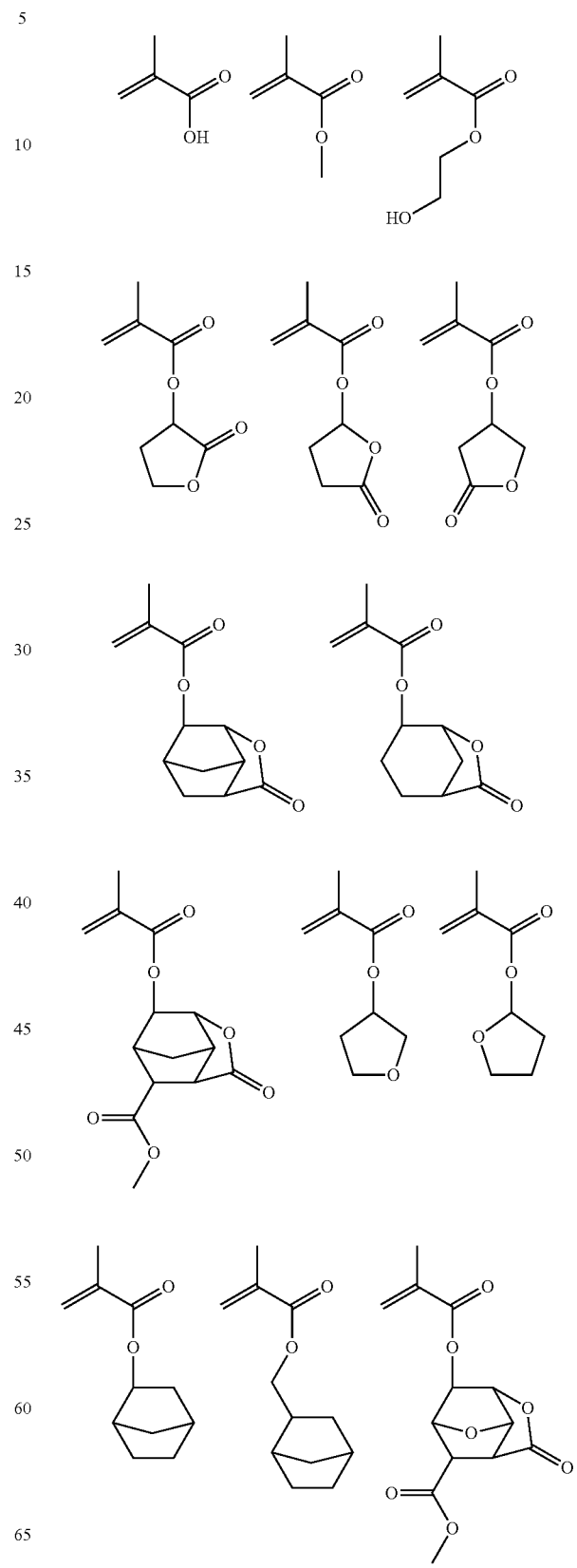
hydroxy, lactone ring, ether, ester, carbonyl or cyano group. Examples of the recurring unit (c) are shown below, but not limited thereto.
While the preferred polymer used herein comprises recurring units (a1, a2, a3) and recurring units (b1) and/or (b2), it may have further copolymerized therein recurring units (c) derived from monomers having an adhesive group such as

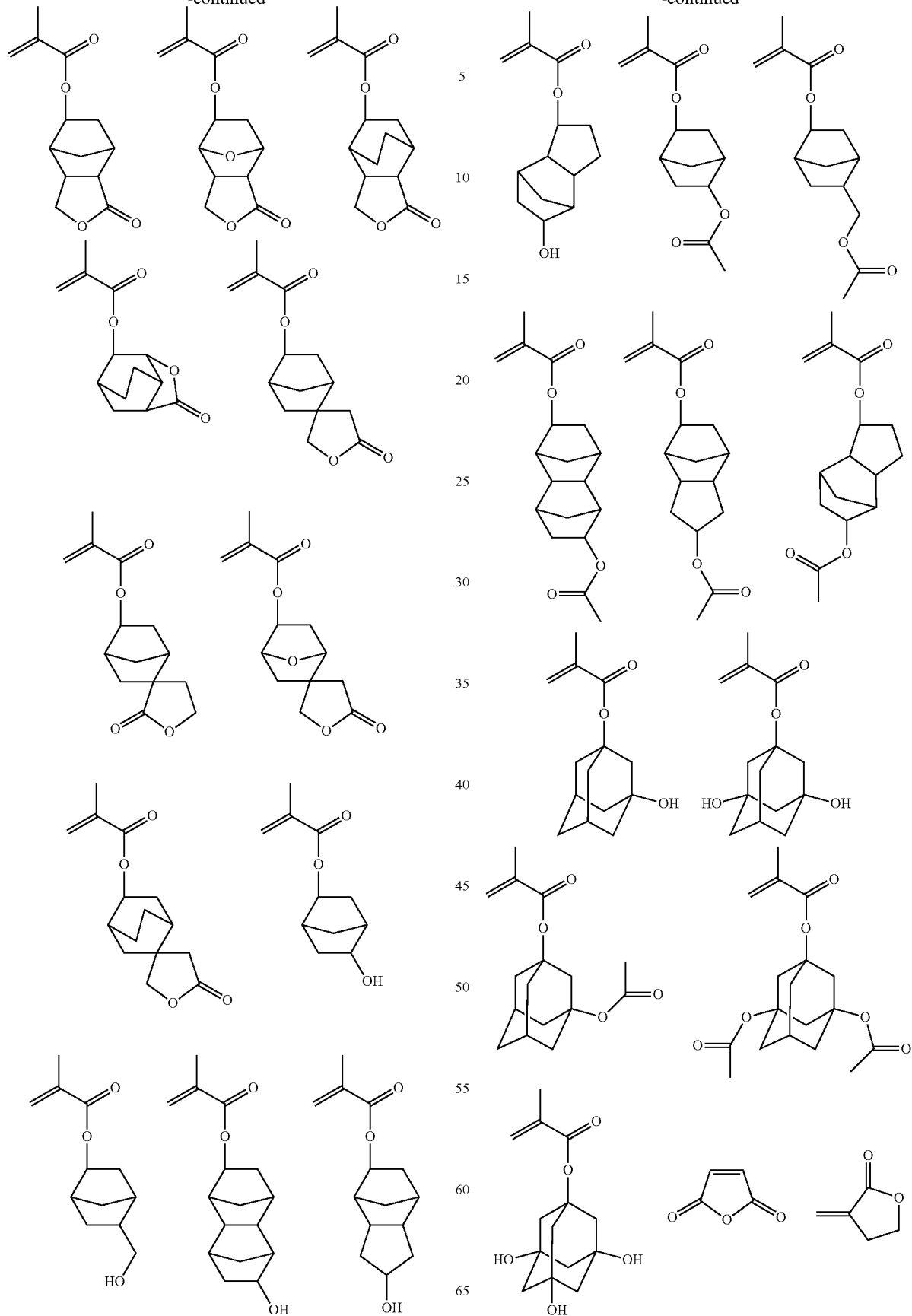

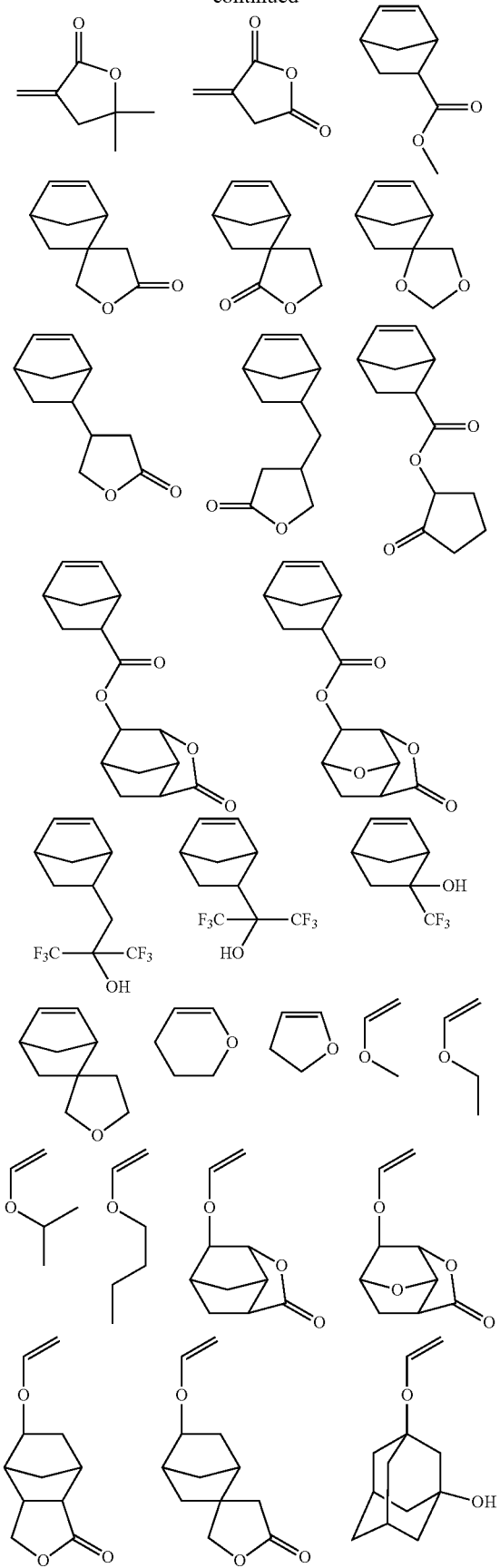
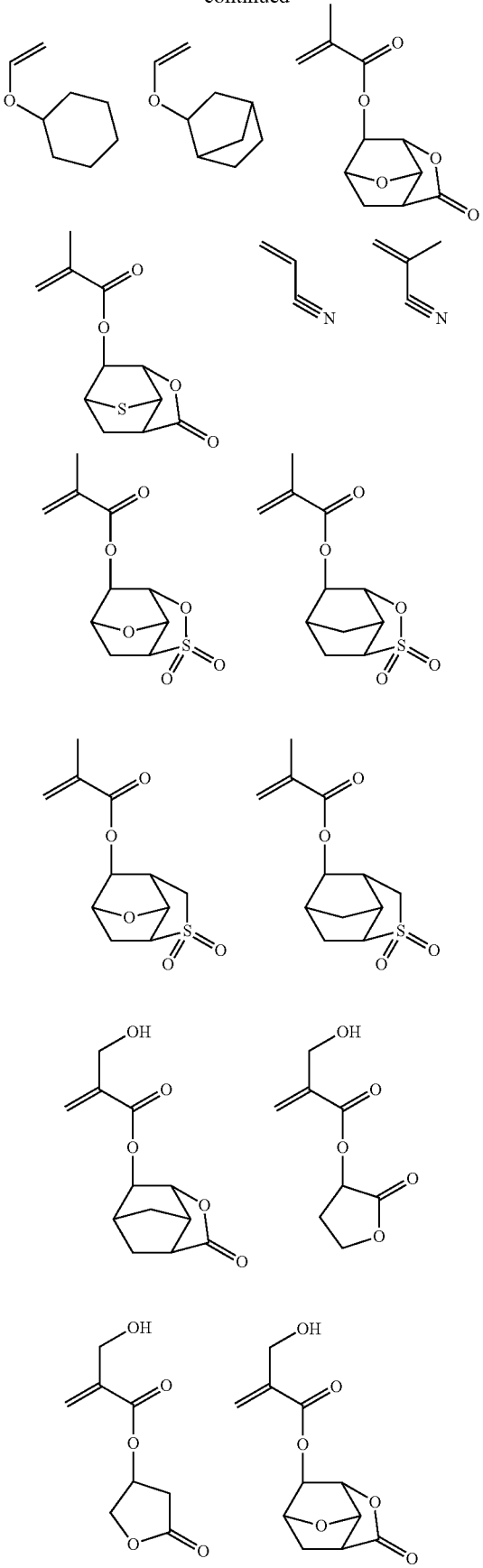

-continued
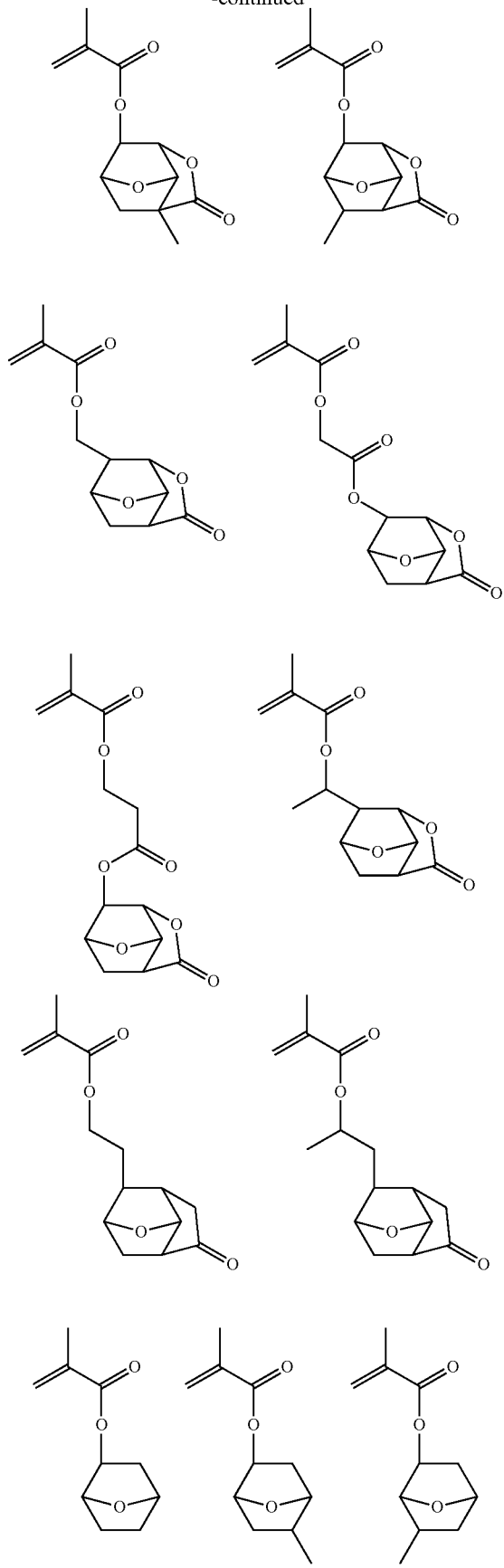
-continued
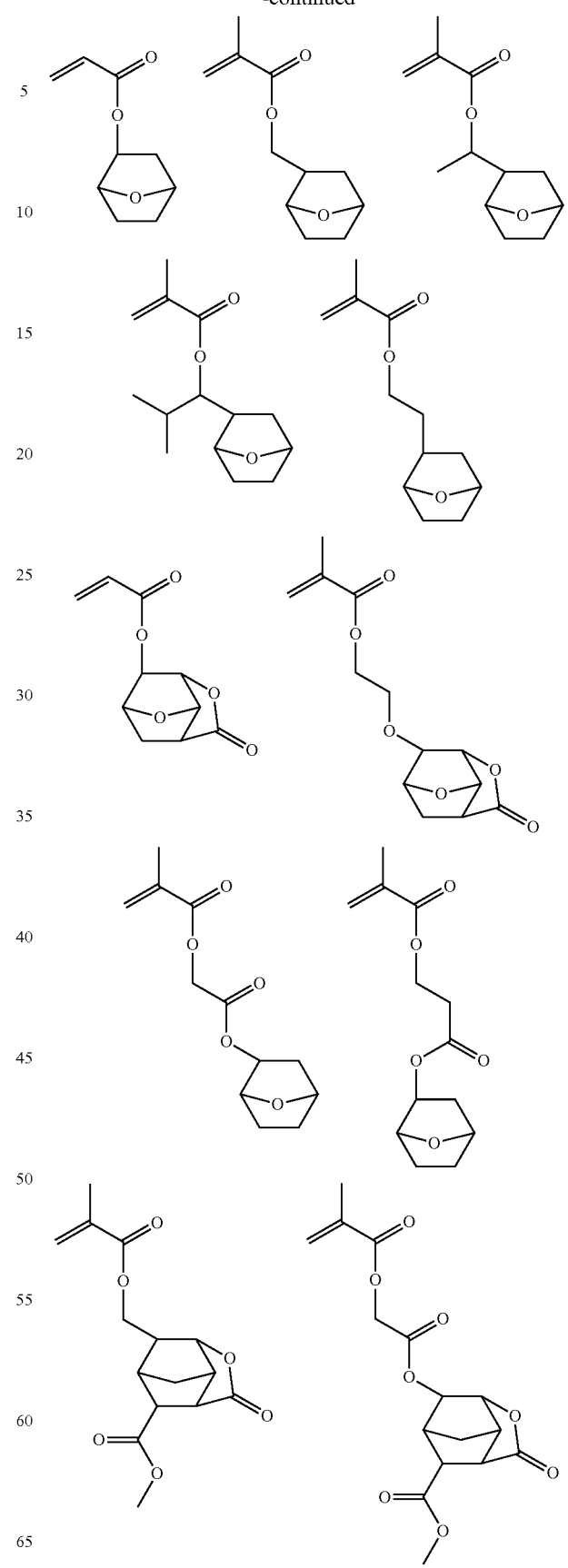

95
-continued
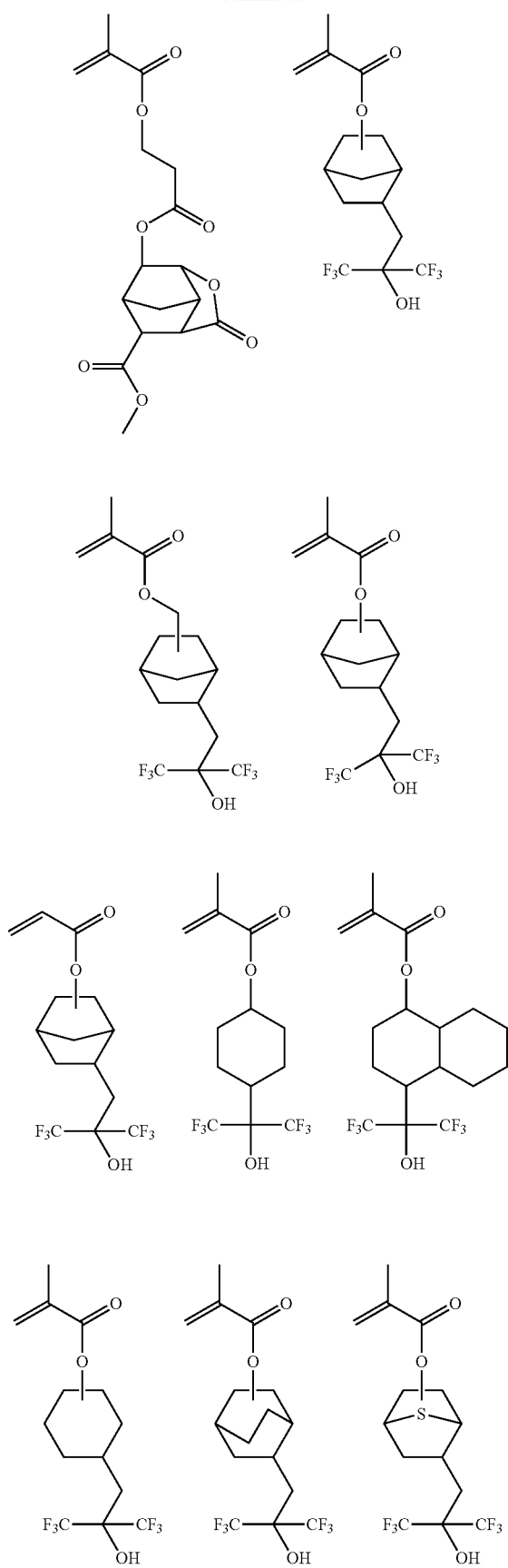
96
-continued
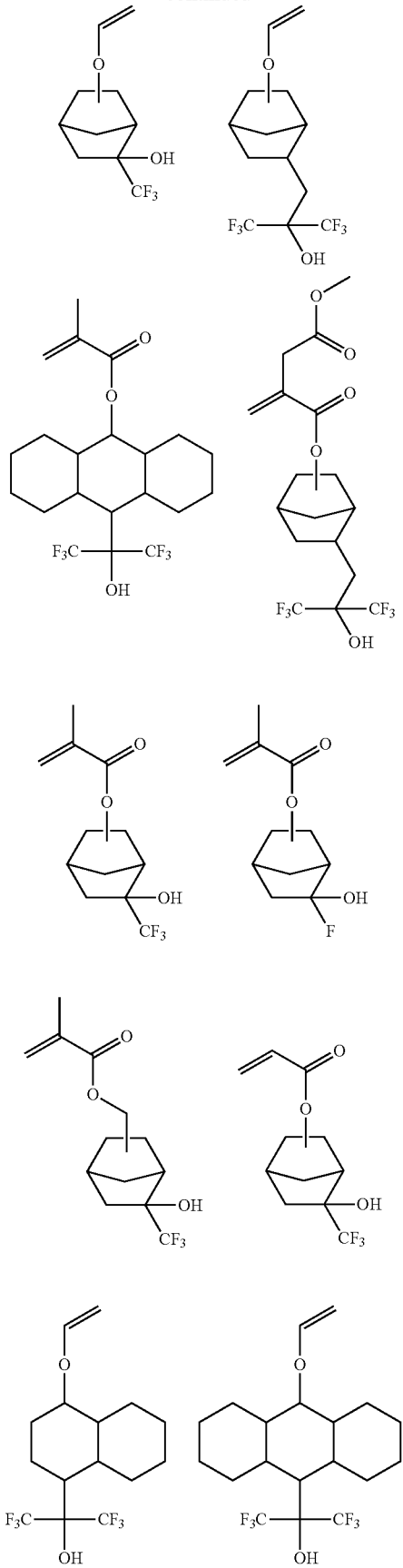

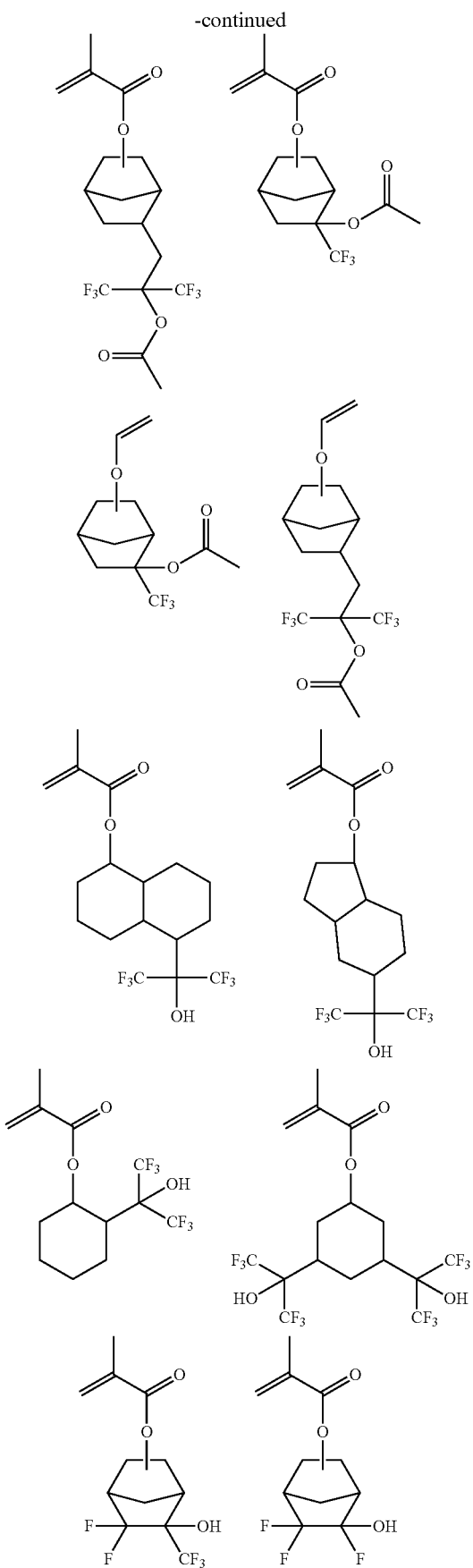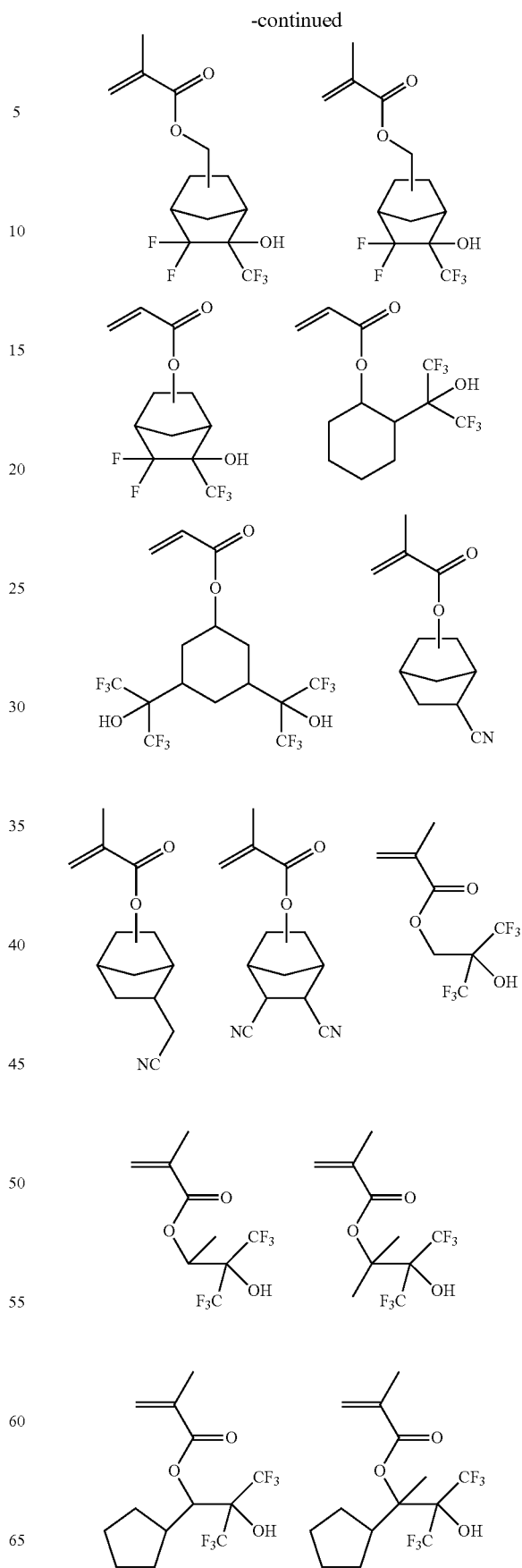

99
-continued
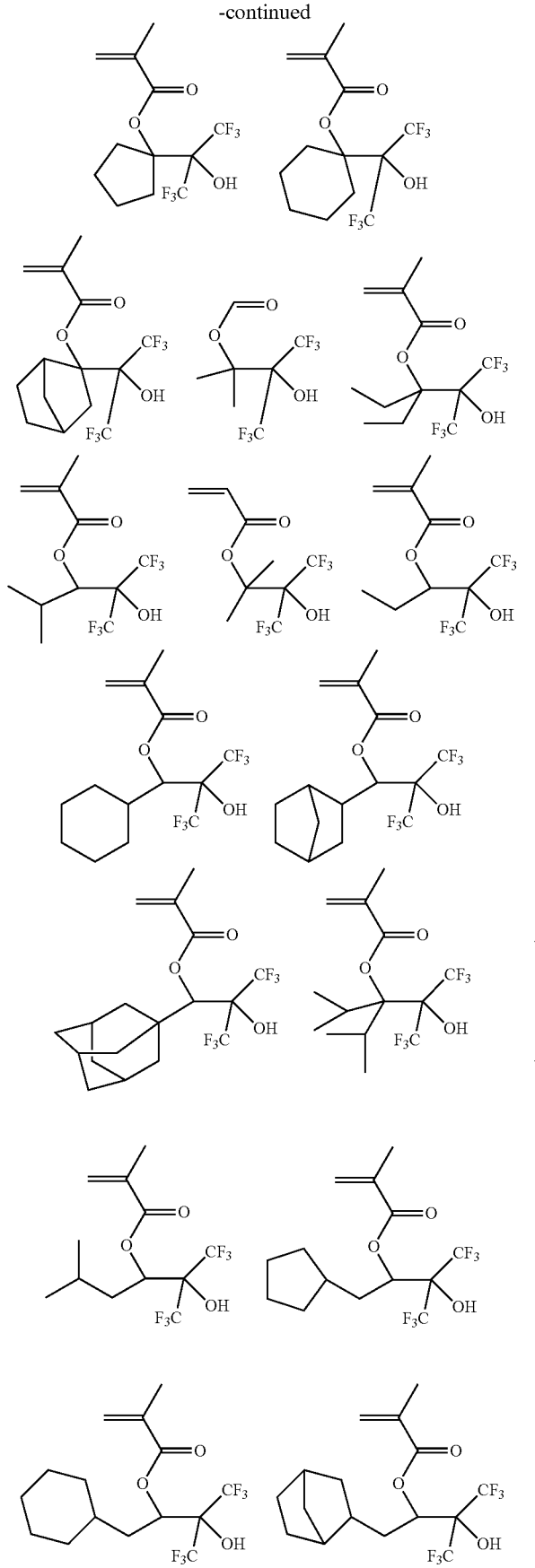
100
-continued
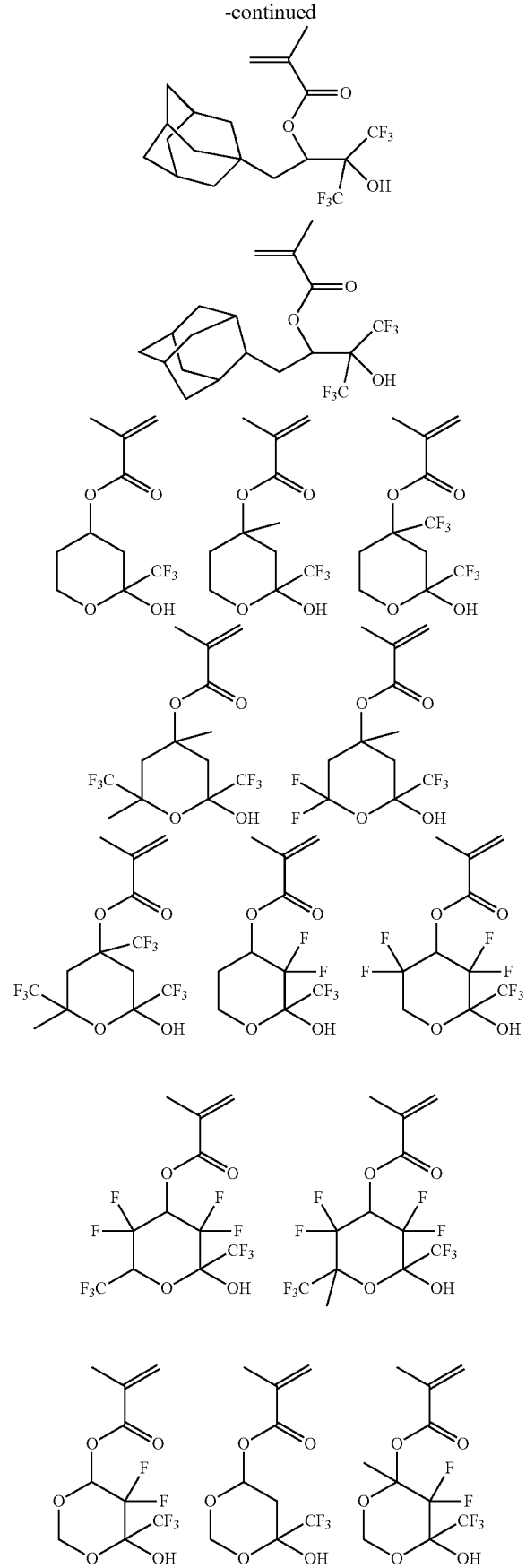

101
-continued
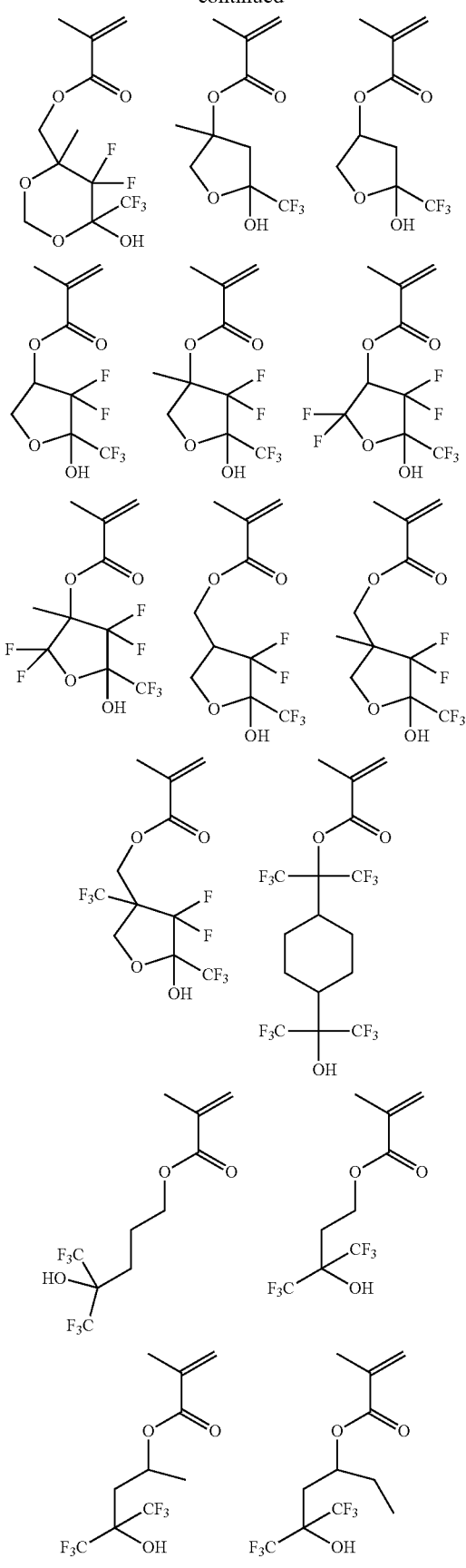
102
-continued
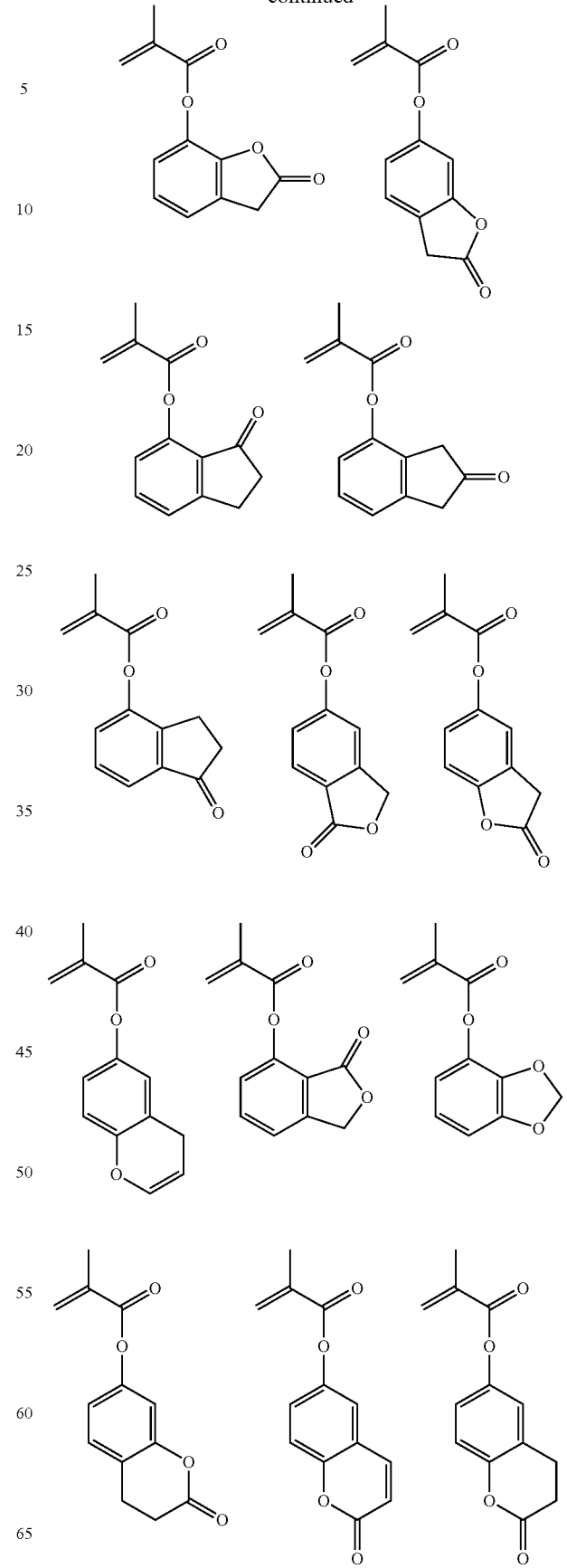

103
-continued
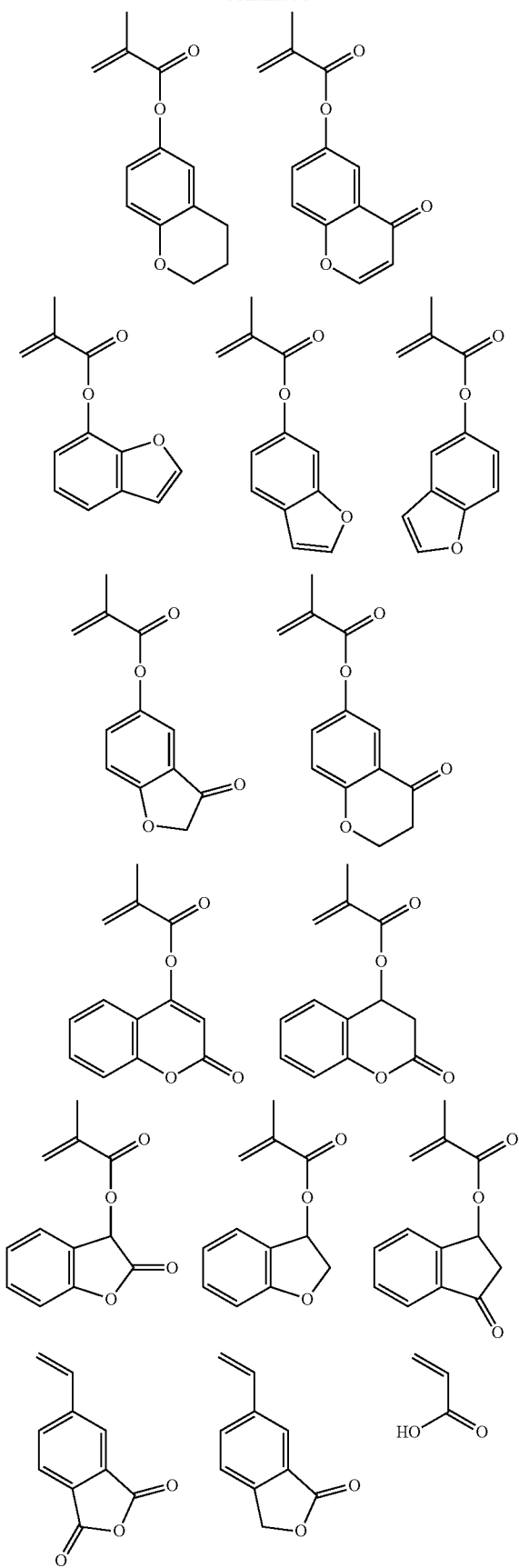
104
-continued
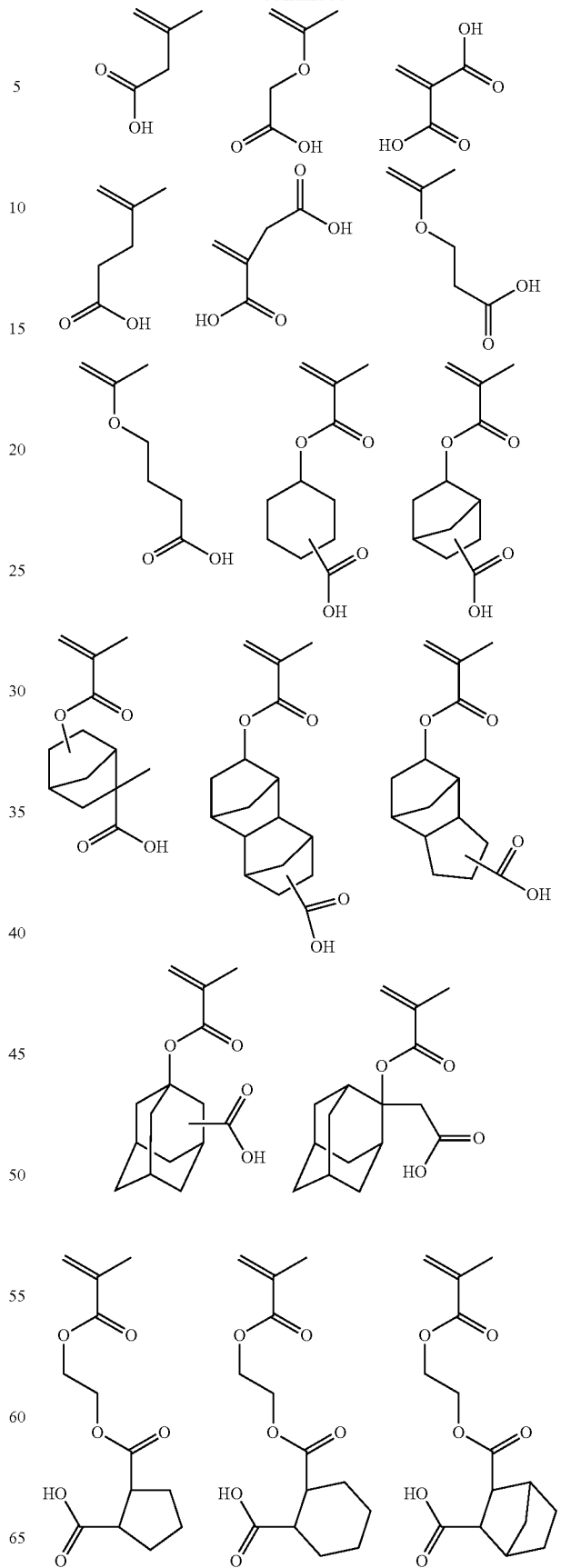

105
-continued
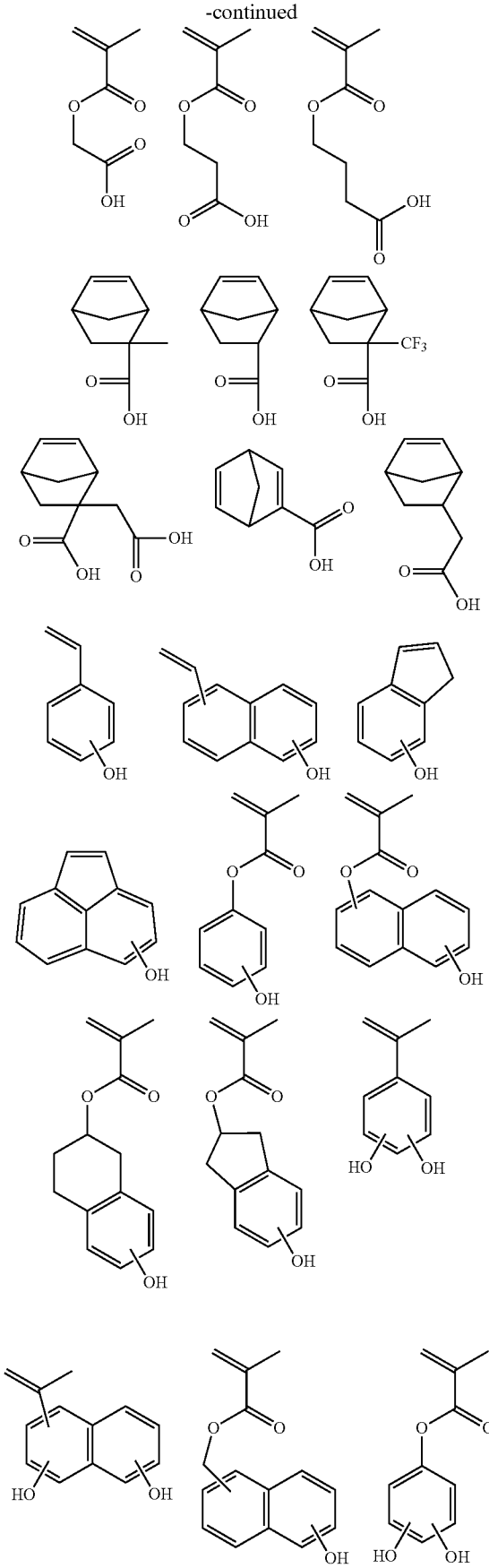
106
-continued
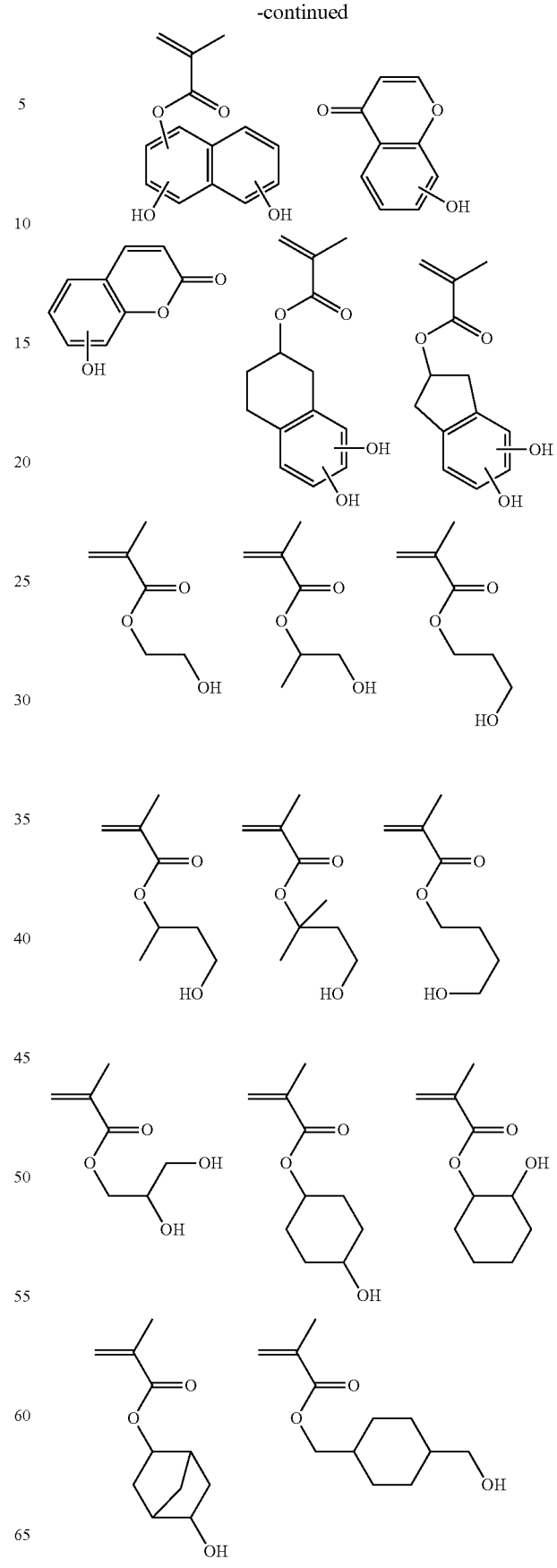

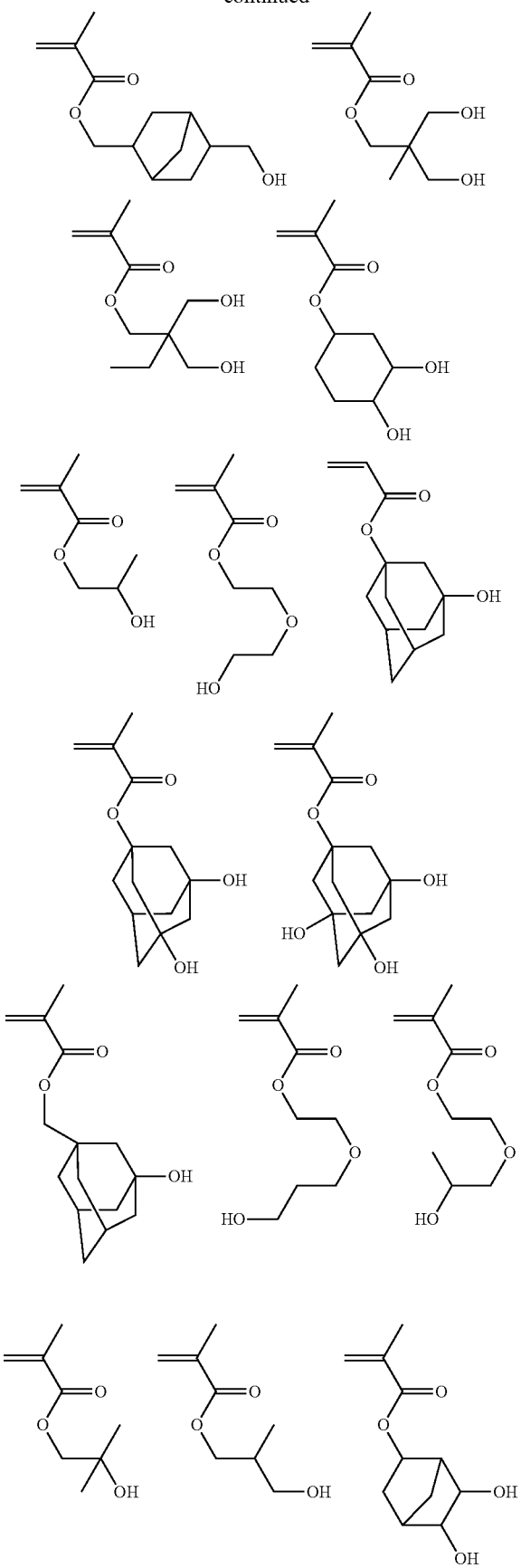
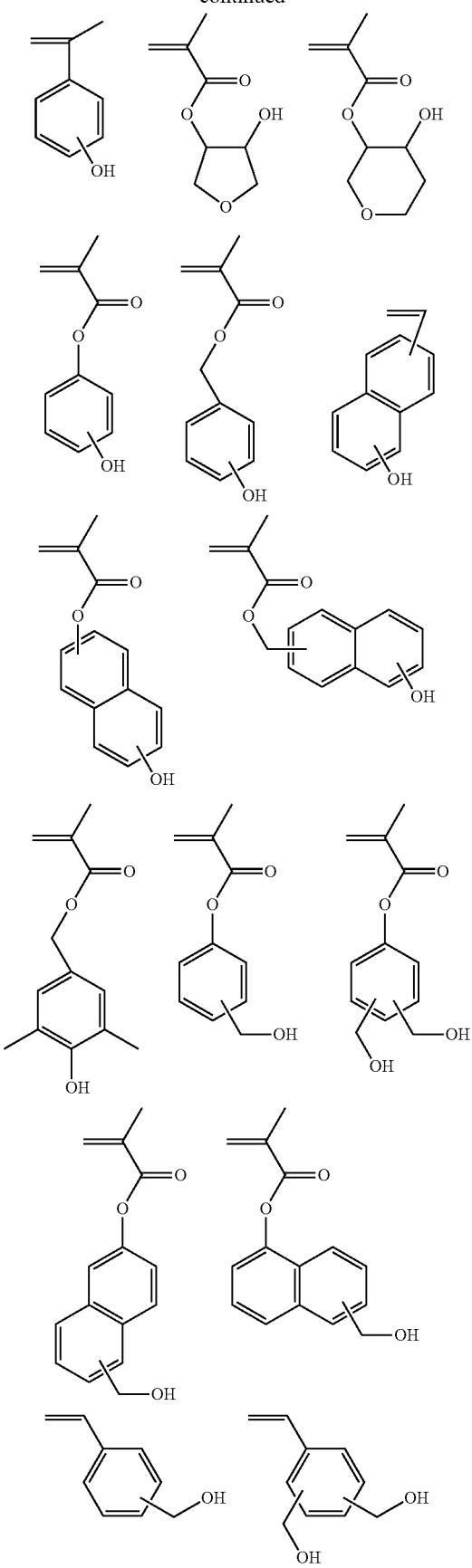

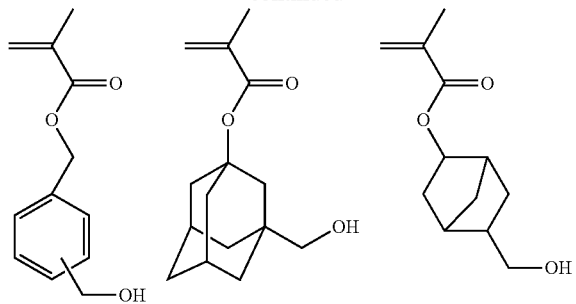
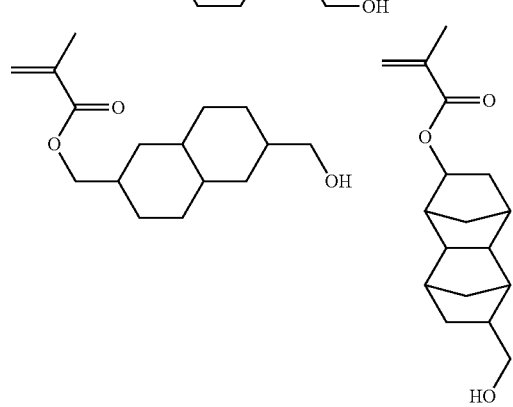
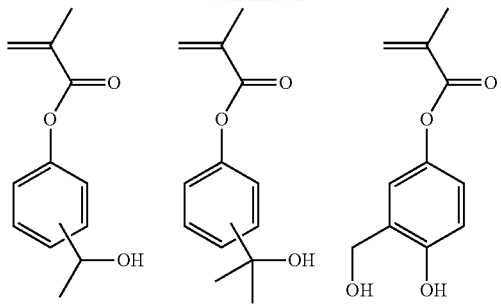
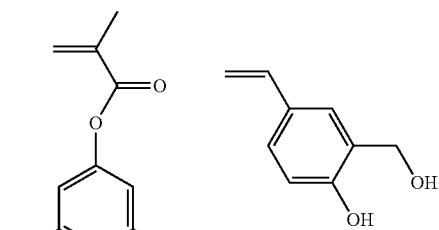
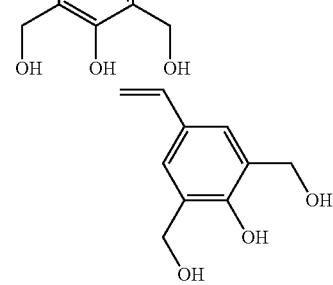
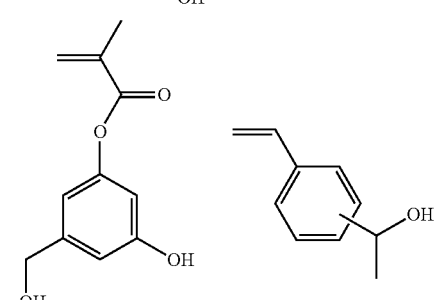
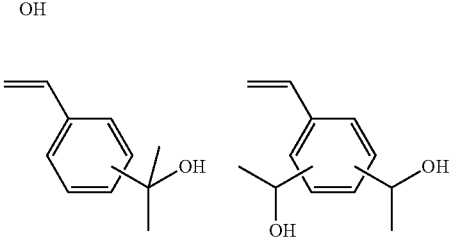

111
-continued

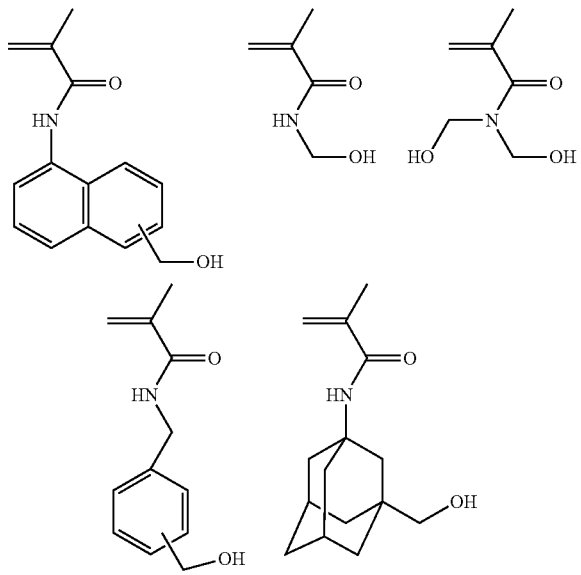

112
-continued

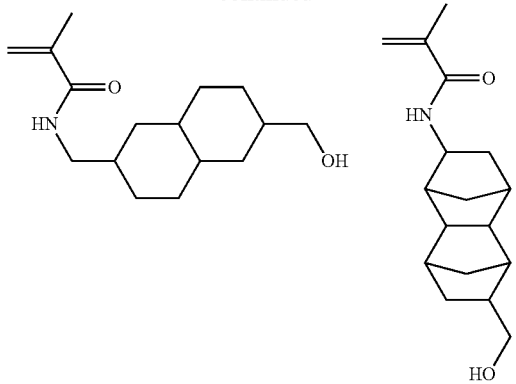

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In another preferred embodiment, the polymer may have further copolymerized therein recurring units (d) selected from units derived from indene, benzofuran, benzothiophene, acenaphthylene, chromone, coumarin, norbornadiene, and derivatives thereof. Suitable monomers are exemplified below, but not limited thereto.

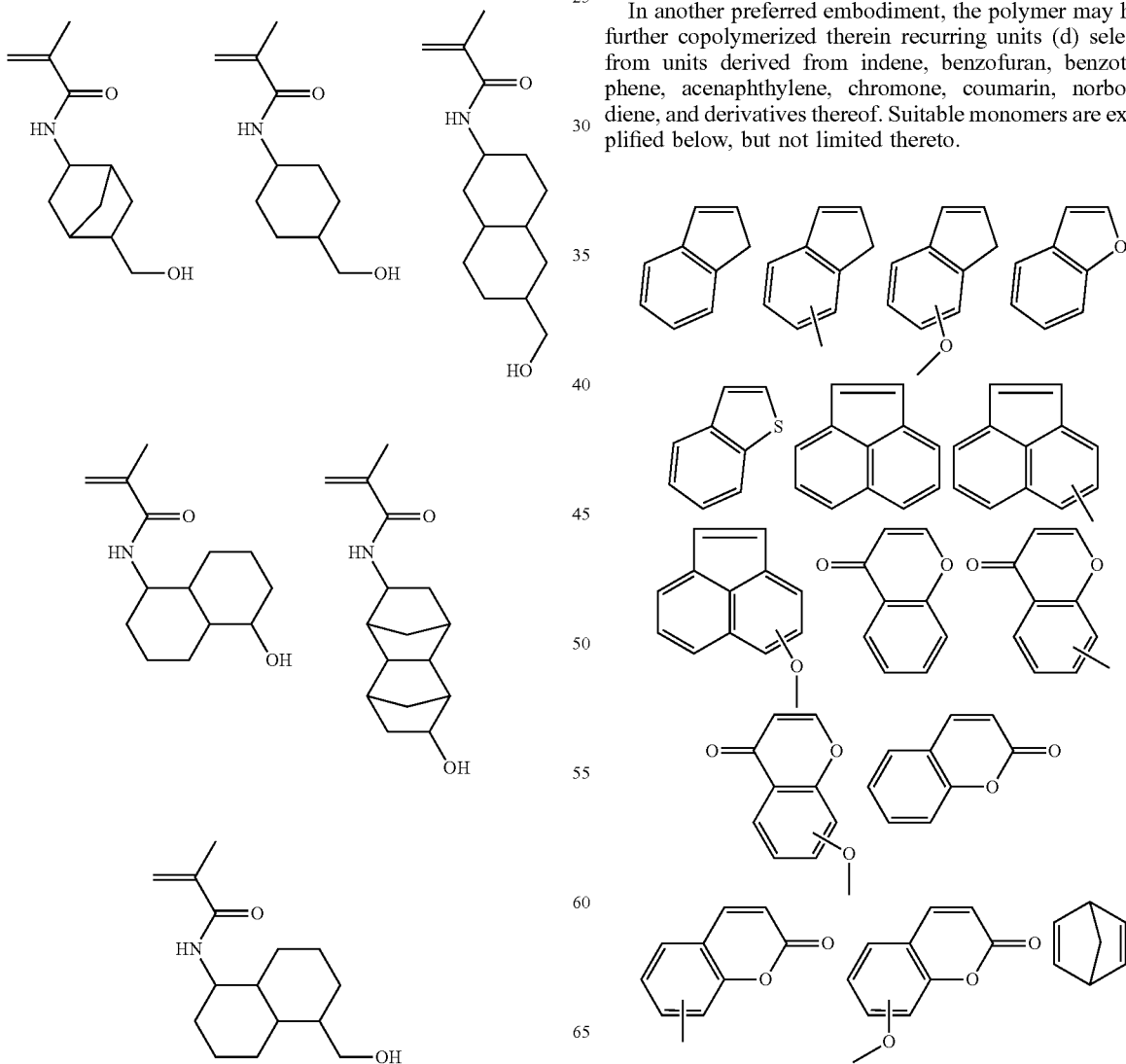

-continued

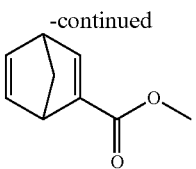

Besides the recurring units described above, further recurring units (e) can be incorporated in the polymer, examples of which include units derived from styrene, vinylnaphthalene, vinylanthracene, vinylpyrene, methyleneindane, vinylpyridine, and vinylcarbazole.

The polymer may be synthesized, for example, by dissolving one or more monomers selected from the monomers corresponding to the recurring units (a1), (a2), (a3), (b1), (b2), (c), (d), and (e) in an organic solvent, adding a radical polymerization initiator thereto, and effecting heat polymerization.

As the radical polymerization initiator, commercially available reagents may be used. The preferred radical polymerization initiators are azo and peroxide initiators. The initiators may be used alone or in admixture. The amount of the initiator used may be selected in accordance with the desired molecular weight, monomers, and synthesis conditions such as polymerization temperature and polymerization mode.

Of the polymerization initiators, suitable azo initiators include 2,2'-azobisisobutyronitrile (AIBN), 2,2'-azobis(2,4-dimethylvaleronitrile), dimethyl 2,2'-azobis(2-methylpropionate), 2,2'-azobis(4-methoxy-2,4-dimethylvaleronitrile), 2,2'-azobis(cyclohexane-1-carbonitrile), and 4,4'-azobis(4-cyanovaleric acid); and suitable peroxide initiators include benzoyl peroxide, decanoyl peroxide, lauroyl peroxide, succinic acid peroxide, t-butyl peroxy-2-ethylhexanoate, t-butyl peroxypivaloate, and 1,1,3,3-tetramethylbutyl peroxy-2-ethylhexanoate.

A chain transfer agent may be used in the polymerization reaction. As the chain transfer agent, thiol compounds are preferred, including well-known primary, secondary and tertiary thiol compounds. The chain transfer agent may be used alone or in admixture. The amount of the chain transfer agent used may be selected in accordance with the desired molecular weight, monomers, and synthesis conditions such as polymerization temperature and polymerization mode. Exemplary chain transfer agents include 1-octanethiol, 2-mercaptoethanol, thiolactic acid, thioglycolic acid, mercaptopropionic acid, cyclohexyl mercaptan, t-dodecyl mercaptan, 1,4-butanedithiol, 1,8-octanedithiol, butanediol bis(thioglycolate), hexanediol bis(thioglycolate), 1,3,5-benzenetrithiol, trimethylolpropane tris(thioglycolate), and pentaerythrythol tetrakis(thioglycolate). These agents are commercially available.

Examples of the organic solvent which can be used for polymerization include toluene, benzene, tetrahydrofuran, diethyl ether, dioxane, cyclohexane, cyclopentane, methyl ethyl ketone, and γ-butyrolactone.

Preferably the polymerization reaction is carried out at a temperature of 50 to 80° C. for 2 to 100 hours, more preferably 5 to 20 hours.

A basic compound may be added to the system prior to polymerization as described in JP 5548473. Even when the acid generator is photo-decomposed to generate sulfonic acid, the basic compound functions to inhibit deprotection of the acid labile group by the heat applied during polymerization. However, for the purpose of inhibiting the deprotection reaction of the acid labile group, it is the key to inhibit decomposition of the acid generator, which is the gist of the invention.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to polyhydroxystyrene or hydroxypolyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

While the polymer comprises recurring units (a1), (a2), (a3), (b1), (b2), (c), (d) and (e) as mentioned above, preferably a proportion of these units is: $0 \le a1 \le 0.8$, $0 \le a2 \le 0.8$, $0 \le a3 \le 0.8$, $0 < a1+a2+a3 \le 0.8$, $0 \le b1 < 1.0$, $0 \le b2 < 1.0$, $0.1 \le b1+b2 < 1.0$, $0 \le c \le 0.9$, $0 \le d \le 0.5$, and $0 \le e \le 0.5$;
more preferably $0 \le a1 \le 0.7$, $0 \le a2 \le 0.7$, $0 \le a3 \le 0.7$, $0.01 \le a1+a2+a3 \le 0.7$, $0 \le b1 \le 0.8$, $0 \le b2 \le 0.8$, $0.15 \le b1+b2 \le 0.8$, $0.1 \le c \le 0.8$, $0 \le d \le 0.4$, and $0 \le e \le 0.4$; and preferably $a1+a2+a3+b1+b2+c+d+e=1$.

The polymer should preferably have a weight average molecular weight (Mw) in the range of 1,000 to 500,000, and more preferably 2,000 to 30,000, as measured by GPC versus polystyrene standards using tetrahydrofuran as a solvent. With too low a Mw, the resist composition may become less heat resistant. A polymer with too high a Mw may lose alkaline solubility and give rise to a footing phenomenon after pattern formation.

After the completion of polymerization, a poor solvent in which the polymer is not soluble is added to the polymerization solution causing the polymer to crystallize. Examples of the crystallizing solvent include aliphatic hydrocarbons, alicyclic hydrocarbons, aromatic hydrocarbons, ethers, alcohols, water, and mixtures thereof. Suitable aliphatic hydrocarbons include pentane, hexane, heptane and octane; suitable alicyclic hydrocarbons include cyclohexane and methylcyclohexane; suitable aromatic hydrocarbons include benzene, toluene, and xylene; suitable ethers include diethyl ether, diisopropyl ether, and dimethoxyethane; suitable alcohols include methanol, ethanol, isopropyl alcohol, and butanol. It is the polymer that crystallizes whereas the residual monomers remain dissolved in the polymerization solution. That is, the residual monomers are removed. The solution in which the polymer has crystallized is passed through a filter, after which the polymer is collected in powder form, washed several times with the crystallizing solvent, and dried, obtaining polymer powder. The procedure must be performed until this point of time under illumination conditions where a light fraction of wavelength up to 400 nm is cut off.

This is followed by a dissolving step. After the polymer resulting from polymerization is subjected to precipitation/purification and optionally to drying treatment, it is dissolved in an organic solvent to form a polymer solution. The polymer solution is concentrated, while the low-boiling solvent (i.e., precipitation/purification solvent), if any, may be distilled off at the same time, whereby the solution of the polymer in the organic solvent is adjusted to the desired concentration, typically 5 to 40% by weight. The resulting solution is ready for use as a resist film-forming polymer solution. The organic solvent used for dissolution is not particularly limited as long as the polymer is soluble therein. Glycol, ketone and ester solvents are included. Suitable glycol solvents include propylene glycol monomethyl ether and propylene glycol monomethyl ether acetate (PGMEA). Suitable ketone solvents include acetone, methyl ethyl ketone, methyl isobutyl ketone, cyclopentanone, and cyclohexanone. Suitable ester solvents include ethyl acetate, isopropyl acetate, butyl acetate, and ethyl lactate. The organic solvents may be used alone or in admixture.

The inventive polymer may be used as a polymer, especially base polymer in semiconductor lithography resist compositions and mask pattern-forming resist compositions. In addition to the polymer, the resist composition may contain an organic solvent, basic compound, dissolution regulator, surfactant, acetylene alcohol, and other additives.

Examples of the organic solvent used herein are described in JP-A 2008-111103, paragraphs [0144] to [0145] (U.S. Pat. No. 7,537,880). Exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

Exemplary basic compounds include primary, secondary and tertiary amine compounds, specifically amine compounds having a hydroxyl, ether, ester, lactone ring, cyano or sulfonic acid ester group, as described in JP-A 2008-111103, paragraphs [0146] to [0164]. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied in the immersion lithography, the polymeric quencher is also effective for preventing a film thickness loss of resist pattern or rounding of pattern top.

A resist composition comprising the inventive polymer may be used to form a pattern via exposure and development without a need for an acid generator which is otherwise added thereto. However, an acid generator of blend type may be added to the composition if desired. In this case, the acid generator of blend type is preferably added in an amount of 0.01 to 100 parts, more preferably 0.1 to 80 parts by weight per 100 parts by weight of the base polymer. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base polymer.

Process

The resist composition comprising the inventive polymer, typically chemically amplified positive or negative resist composition comprising the inventive polymer, optionally a basic compound and an acid generator, in an organic solvent is used in the fabrication of various integrated circuits. Pattern formation using the resist composition may be performed by well-known lithography processes. The process generally involves coating, prebaking, exposure, and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dipping, spraying or doctor coating.

The coating is prebaked on a hot plate preferably at a temperature of 60 to 150° C. for 10 seconds to 30 minutes, more preferably at 80 to 120° C. for 30 seconds to 20 minutes. The resulting resist film is generally 0.1 to 2.0 μm thick.

The resist film is then exposed to a desired pattern of high-energy radiation such as UV, deep-UV, EB, EUV (soft x-ray), x-ray, excimer laser light, γ-ray, or synchrotron radiation, directly or through a mask. The exposure dose is preferably about 1 to 200 $mJ/cm^2$, more preferably about 10 to 100 $mJ/cm^2$, or about 0.1 to 100 $\mu C/cm^2$, more preferably about 0.5 to 50 $\mu C/cm^2$. The resist film is further baked (PEB) on a hot plate preferably at 60 to 150° C. for 10 seconds to 30 minutes, more preferably at 80 to 120° C. for 30 seconds to 20 minutes.

Thereafter the resist film is developed in an alkaline developer for 3 seconds to 3 minutes, preferably 5 seconds to 2 minutes by conventional techniques such as dip, puddle and spray techniques. A typical developer is a 0.1 to 10 wt %, preferably 2 to 10 wt %, more preferably 2 to 8 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, EB, EUV (soft x-ray), x-ray, γ-ray and synchrotron radiation.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as tert-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

In an alternative embodiment, a negative pattern may be formed via organic solvent development. The developer used herein is preferably an organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, tert-butylbenzene and mesitylene. The solvents may be used alone or in admixture.

Example

Examples of the invention are given below by way of illustration and not by way of limitation. The abbreviation "pbw" is parts by weight. For all polymers, Mw and Mn are determined by GPC versus polystyrene standards, and dispersity Mw/Mn is computed therefrom.

PAG Monomers 1 to 6 and Monomers 1, 2 used in Synthesis Examples and Comparative Synthesis Examples are identified below.

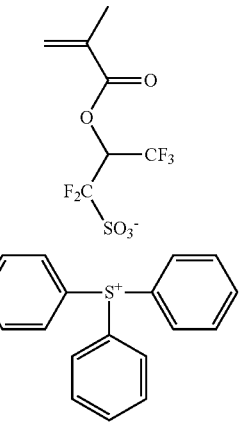

PAG Monomer 1

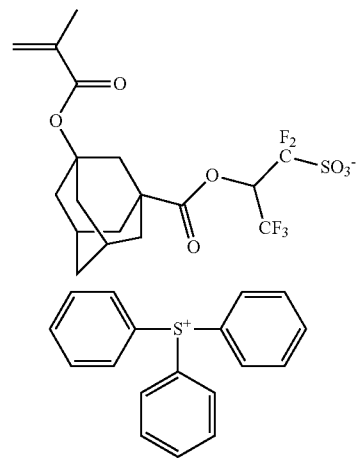

PAG Monomer 2

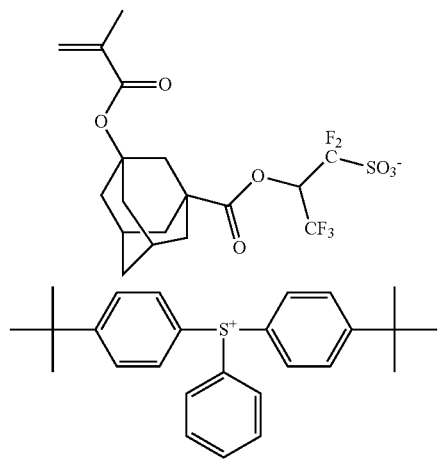

PAG Monomer 3

PAG Monomer 4

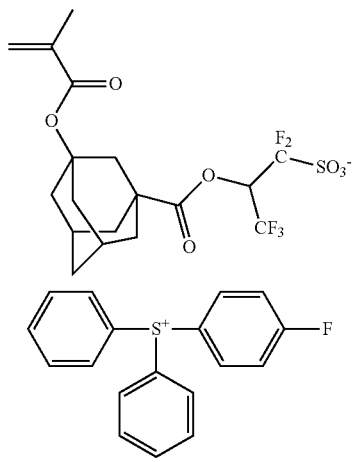

PAG Monomer 5

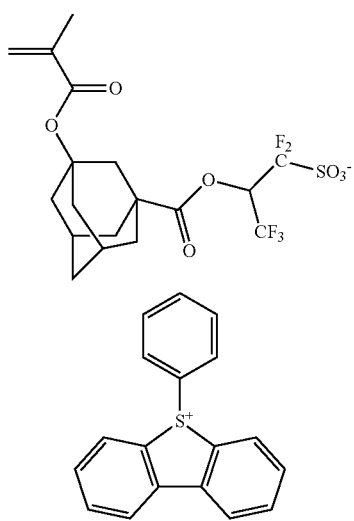

PAG Monomer 6

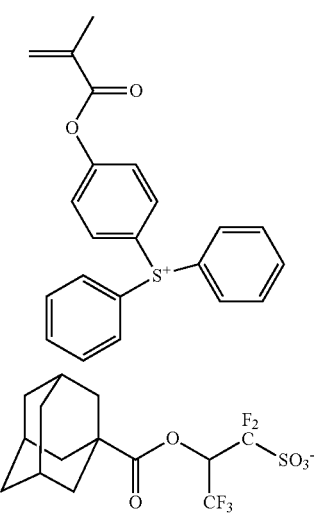

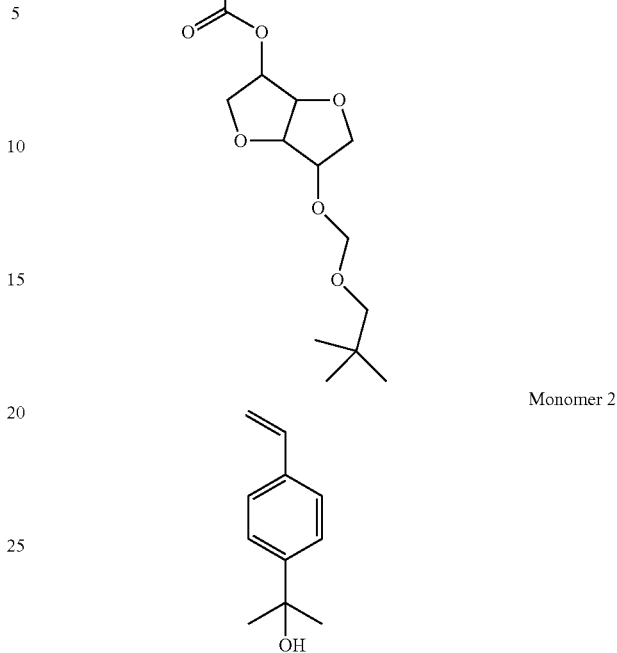

The LED lamp used in Examples is a LED lighting Tino4000NY by Intexs Corp. This lamp produces such illumination that a light fraction of wavelength up to 400 nm is cut off, specifically the quantity of light with wavelength 365 nm is less than 0.001 mW/cm$^2$, which is approximately equal to that of a yellow fluorescent lamp. The lamp used in Comparative Examples is a white fluorescent lamp which produces such illumination that the quantity of light with wavelength 365 nm is 0.1 mW/cm$^2$.

[1] Synthesis of Polymers

Synthesis Example 1

Under illumination of Tino4000NY, a 2-L flask was charged with 8.2 g of 3-ethyl-3-exo-tetracyclo[4.4.0.1$^{2,5}$.1$^{7,10}$]-dodecanyl methacrylate, 3.6 g of 4-hydroxyphenyl methacrylate, 9.0 g of 3-oxo-2,7-dioxatricyclo[4.2.1.0$^{4,8}$]nonan-9-yl methacrylate, 5.6 g of PAG Monomer 1, and 40 g of tetrahydrofuran (THF) as solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 1. The polymer was analyzed by $^{13}$C-NMR and $^1$H-NMR spectroscopy and GPC, with the results shown below.

Copolymer Compositional Ratio (Molar Ratio)
3-ethyl-3-exo-tetracyclo[4.4.0.1$^{2,5}$.1$^{7,10}$]dodecanyl methacrylate:4-hydroxyphenyl methacrylate:3-oxo-2,7-dioxatricyclo[4.2.1.0$^{4,8}$]nonan-9-yl methacrylate:PAG Monomer 1=0.30:0.20:0.40:0.10
Mw=7,200
Mw/Mn=1.92

Polymer 1

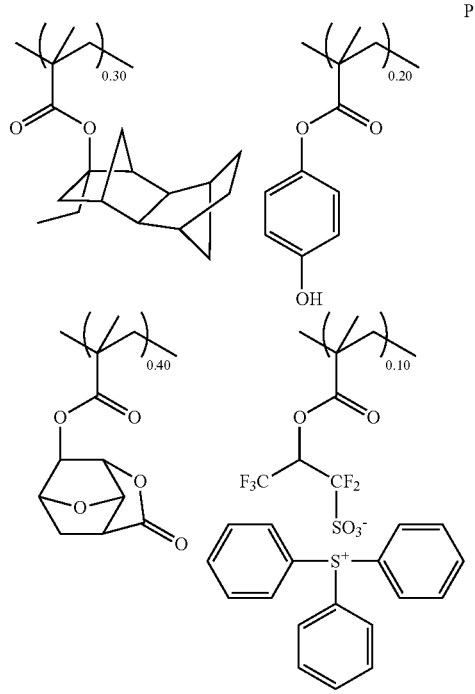

Synthesis Example 2

Under illumination of Tino4000NY, a 2-L flask was charged with 9.8 g of 3-isopropyl-3-cyclopentyl methacrylate, 8.7 g of 3-oxo-2,7-dioxatricyclo[4.2.1.0$^{4,8}$]nonan-9-yl methacrylate, 3.7 g of PAG Monomer 2, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 2. The polymer was analyzed by $^{13}$C-NMR and $^{1}$H-NMR spectroscopy and GPC, with the results shown below.

Copolymer Compositional Ratio (Molar Ratio)

3-isopropyl-3-cyclopentyl methacrylate:3-oxo-2,7-dioxatricyclo[4.2.1.0$^{4,8}$]nonan-9-yl methacrylate:PAG Monomer 2=0.48:0.47:0.05

Mw=7,600

Mw/Mn=1.78

Polymer 2

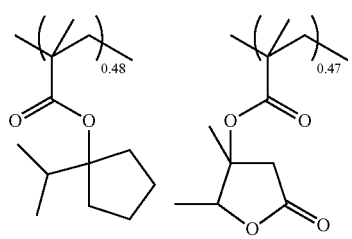

-continued

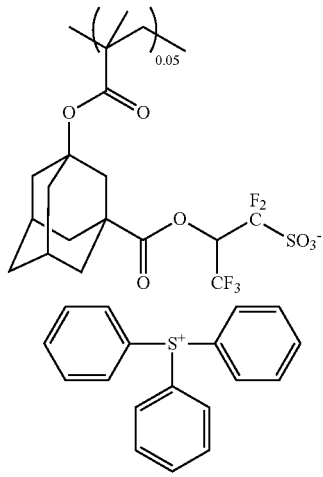

Synthesis Example 3

Under illumination of Tino4000NY, a 2-L flask was charged with 10.5 g of 3-t-butyl-3-cyclopentyl methacrylate, 2.5 g of 3-hydroxy-1-adamantyl methacrylate, 6.1 g of tetrahydro-2-oxofuran-3-yl methacrylate, 3.9 g of PAG Monomer 4, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 3. The polymer was analyzed by $^{13}$C-NMR and $^{1}$H-NMR spectroscopy and GPC, with the results shown below.

Copolymer Compositional Ratio (Molar Ratio)

3-t-butyl-3-cyclopentyl methacrylate:3-hydroxy-1-adamantyl methacrylate:tetrahydro-2-oxofuran-3-yl methacrylate:PAG Monomer 4=0.45:0.11:0.39:0.05

Mw=7,200

Mw/Mn=1.92

Polymer 3

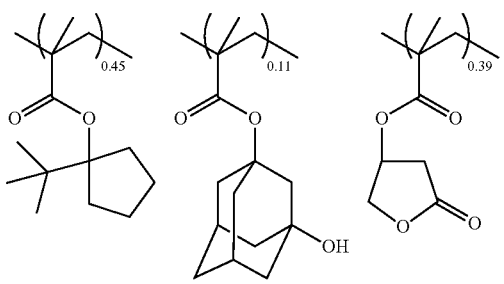

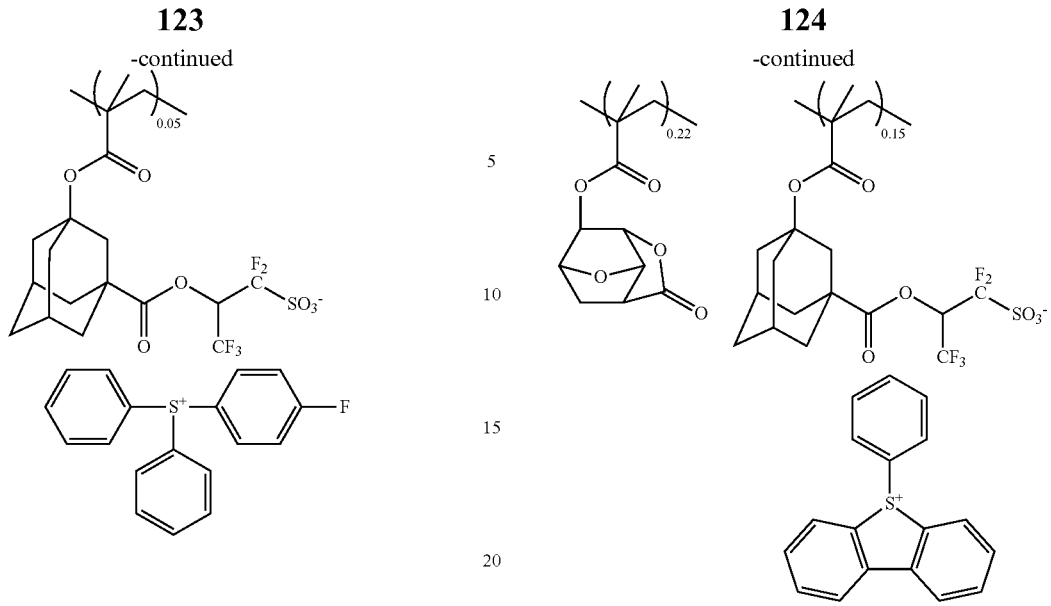

Synthesis Example 4

Under illumination of Tino4000NY, a 2-L flask was charged with 5.2 g of 1-(adamantan-1-yl)-1-methylethyl methacrylate, 2.9 g of 4-t-amyloxystyrene, 6.6 g of 4-hydroxy-2,3,5-trimethylphenyl methacrylate, 4.5 g of 3-oxo-2,7-dioxatricyclo[4.2.1.0$^{4,8}$]nonan-9-yl methacrylate, 11.0 g of PAG Monomer 5, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 4. The polymer was analyzed by $^{13}$C-NMR and $^{1}$H-NMR spectroscopy and GPC, with the results shown below.

Copolymer Compositional Ratio (Molar Ratio)

1-(adamantan-1-yl)-1-methylethyl methacrylate:4-t-amyloxystyrene:4-hydroxy-2,3,5-trimethylphenyl methacrylate:3-oxo-2,7-dioxatricyclo[4.2.1.0$^{4,8}$]nonan-9-yl methacrylate:PAG Monomer 5=0.19:0.15:0.29:0.22:0.15

Mw=9,700
Mw/Mn=1.78

Synthesis Example 5

Under illumination of Tino4000NY, a 2-L flask was charged with 9.0 g of 3-vinyl-3-cyclopentyl methacrylate, 2.4 g of 3-hydroxy-1-adamantyl methacrylate, 5.1 g of tetrahydro-2-oxofuran-3-yl methacrylate, 7.3 g of PAG Monomer 6, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 5. The polymer was analyzed by $^{13}$C-NMR and $^{1}$H-NMR spectroscopy and GPC, with the results shown below.

Copolymer Compositional Ratio (Molar Ratio)

3-vinyl-3-cyclopentyl methacrylate:3-hydroxy-1-adamantyl methacrylate:tetrahydro-2-oxofuran-3-yl methacrylate:PAG Monomer 6=0.48:0.10:0.32:0.10

Mw=7,200
Mw/Mn=1.92

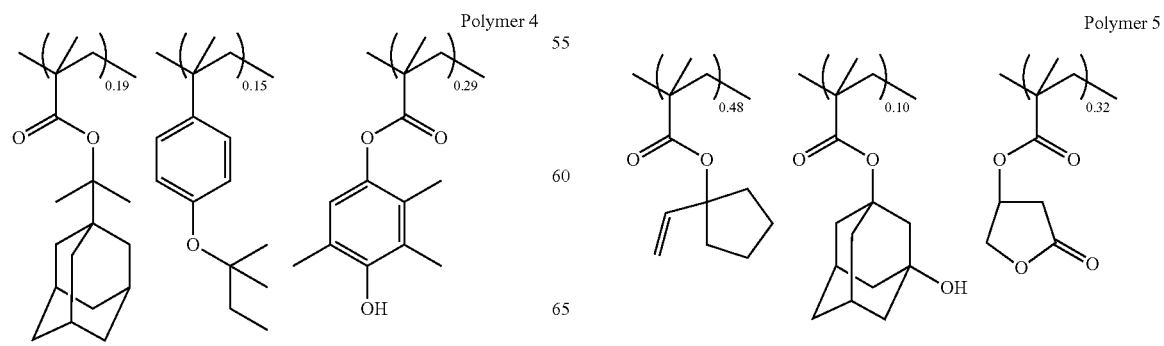

-continued

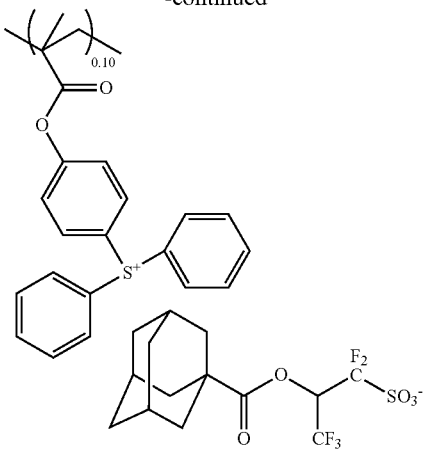

Synthesis Example 6

Under illumination of Tino4000NY, a 2-L flask was charged with 15.7 g of Monomer 1, 2.4 g of 3-hydroxy-1-adamantyl methacrylate, 6.0 g of tetrahydro-2-oxofuran-3-yl methacrylate, 4.3 g of PAG Monomer 3, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 6. The polymer was analyzed by $^{13}$C-NMR and $^{1}$H-NMR spectroscopy and GPC, with the results shown below.

Copolymer Compositional Ratio (Molar Ratio)

Monomer 1:3-hydroxy-1-adamantyl methacrylate:tetrahydro-2-oxofuran-3-yl methacrylate:PAG Monomer 3=0.50:0.10:0.35:0.05

Mw=7,800

Mw/Mn=1.77

Polymer 6

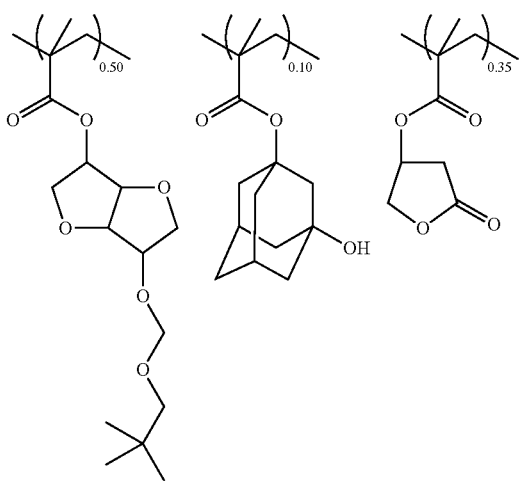

-continued

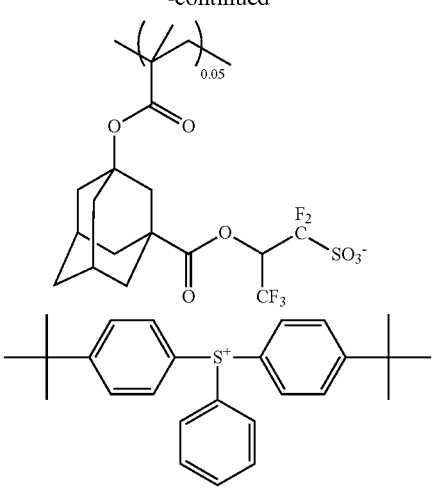

Synthesis Example 7

Under illumination of Tino4000NY, a 2-L flask was charged with 8.1 g of Monomer 2, 2.4 g of 3-hydroxy-1-adamantyl methacrylate, 5.3 g of 4-hydroxyphenyl methacrylate, 5.6 g of PAG Monomer 1, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 7. The polymer was analyzed by $^{13}$C-NMR and $^{1}$H-NMR spectroscopy and GPC, with the results shown below.

Copolymer Compositional Ratio (Molar Ratio)

Monomer 2:3-hydroxy-1-adamantyl methacrylate:4-hydroxyphenyl methacrylate:PAG Monomer 1=0.48:0.10:0.32:0.10

Mw=7,600

Mw/Mn=1.83

Polymer 7

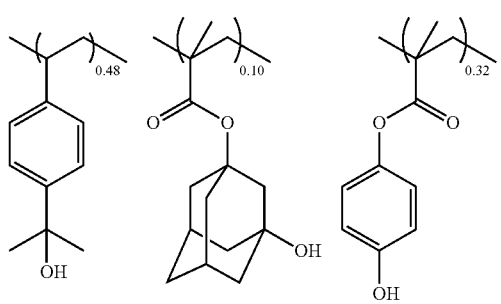

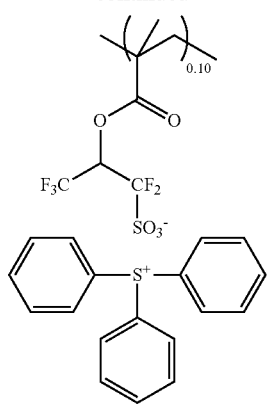

Comparative Synthesis Example 1

Under illumination of a white fluorescent lamp, a 2-L flask was charged with 8.2 g of 3-ethyl-3-exo-tetracyclo-[4.4.0.1$^{2,5}$.1$^{7,10}$]dodecanyl methacrylate, 3.6 g of 4-hydroxyphenyl methacrylate, 9.0 g of 3-oxo-2,7-dioxatricyclo[4.2.1.0$^{4,8}$]nonan-9-yl methacrylate, 5.6 g of PAG Monomer 1, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Comparative Polymer 1. The polymer was analyzed by $^{13}$C-NMR and $^{1}$H-NMR spectroscopy and GPC, with the results shown below.

Copolymer Compositional Ratio (Molar Ratio)

3-ethyl-3-exo-tetracyclo[4.4.0.1$^{2,5}$.1$^{7,10}$]dodecanyl methacrylate:4-hydroxyphenyl methacrylate:3-oxo-2,7-dioxatricyclo[4.2.1.0$^{4,8}$]nonan-9-yl methacrylate:PAG Monomer 1:methacrylic acid=0.25:0.20:0.40:0.10:0.05

Mw=7,000

Mw/Mn=1.99

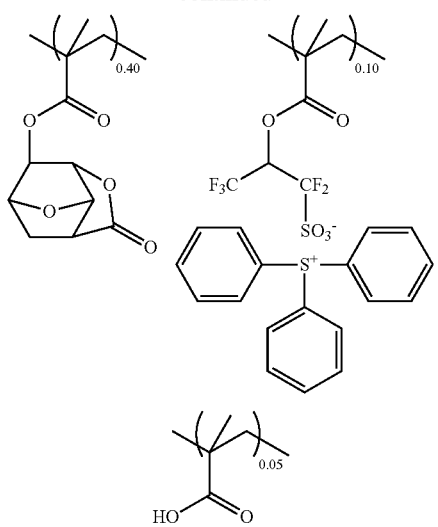

Comparative Synthesis Example 2

Under illumination of a white fluorescent lamp, a 2-L flask was charged with 10.5 g of 3-t-butyl-3-cyclopentyl methacrylate, 2.5 g of 3-hydroxy-1-adamantyl methacrylate, 6.1 g of tetrahydro-2-oxofuran-3-yl methacrylate, 3.9 g of PAG Monomer 4, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Comparative Polymer 2. The polymer was analyzed by $^{13}$C-NMR and $^{1}$H-NMR spectroscopy and GPC, with the results shown below.

Copolymer Compositional Ratio (Molar Ratio)

3-t-butyl-3-cyclopentyl methacrylate:3-hydroxy-1-adamantyl methacrylate:tetrahydro-2-oxofuran-3-yl methacrylate:PAG Monomer 4:methacrylic acid=0.41:0.11:0.39:0.04:0.05

Mw=7,100

Mw/Mn=1.99

Comparative Polymer 1

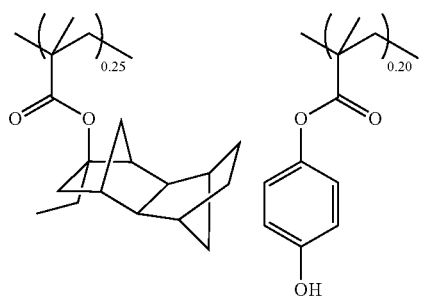

Comparative Polymer 2

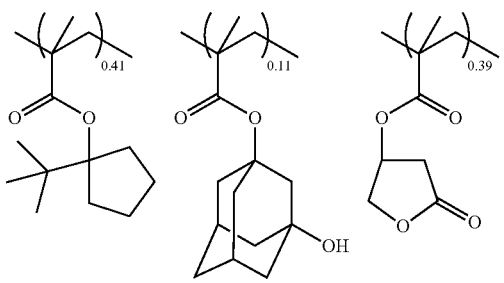

-continued

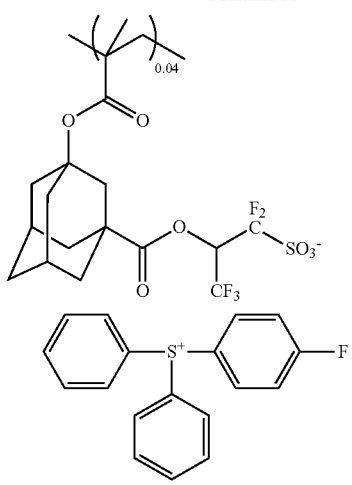

Comparative Synthesis Example 3

Under illumination of a white fluorescent lamp, a 2-L flask was charged with 8.1 g of Monomer 2, 2.4 g of 3-hydroxy-1-adamantyl methacrylate, 5.3 g of 4-hydroxyphenyl methacrylate, 5.6 g of PAG Monomer 1, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Comparative Polymer 3. The polymer was analyzed by $^{13}$C-NMR and $^1$H-NMR spectroscopy and GPC, with the results shown below.

Copolymer Compositional Ratio (Molar Ratio)

Monomer 2:3-hydroxy-1-adamantyl methacrylate:4-hydroxyphenyl methacrylate:PAG Monomer 1:4-isopropenylstyrene=0.46:0.10:0.32:0.10:0.02

Mw=20,600

Mw/Mn=2.32

Comparative Polymer 3

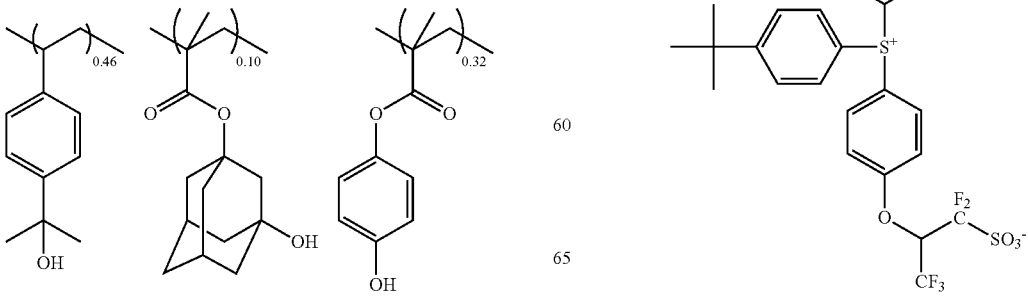

-continued

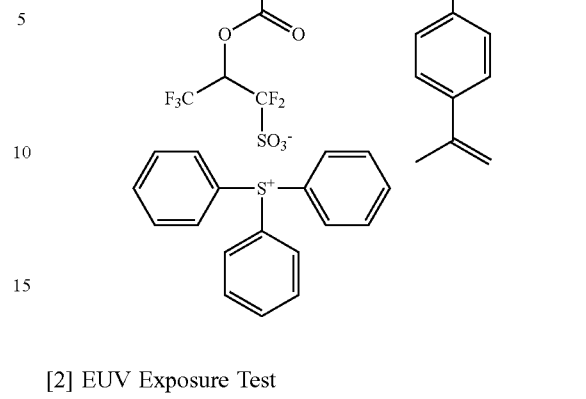

[2] EUV Exposure Test

Examples 1 to 10 & Comparative Examples 1 to 3

A positive resist composition was prepared by dissolving a polymer and other components in a solvent in accordance with the recipe shown in Table 1, adding 100 ppm of surfactant FC-4430 (3M) thereto, and filtering through a filter with a pore size of 0.2 μm.

The components in Table 1 are identified below.

Polymers 1 to 7:
   Polymers obtained in Synthesis Examples 1 to 7

Comparative Polymers 1 to 3:
   Polymers obtained in Comparative Synthesis Examples 1 to 3

Organic Solvent:
   PGMEA=propylene glycol monomethyl ether acetate
   PGME=propylene glycol monomethyl ether
   CyH=cyclohexanone
   EL=ethyl lactate Acid Generator:
   PAG1 to PAG3 of the structural formula below Basic Compound:
   Amines 1 and 2 of the structural formula below

PAG 1

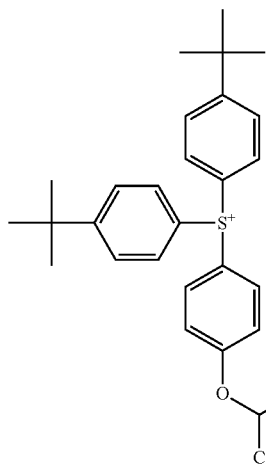

-continued

PAG 2

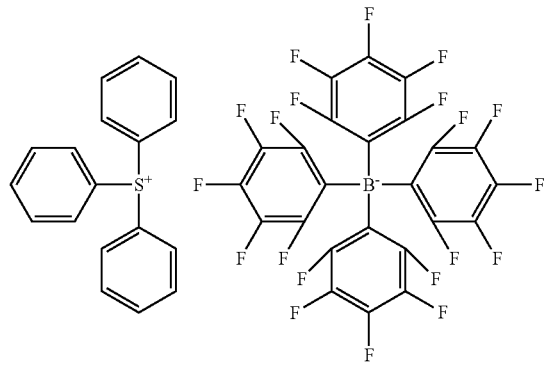

PAG 3

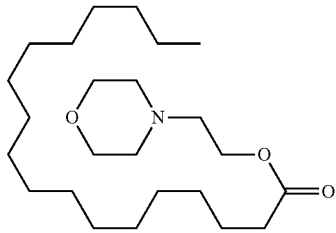

Amine 1

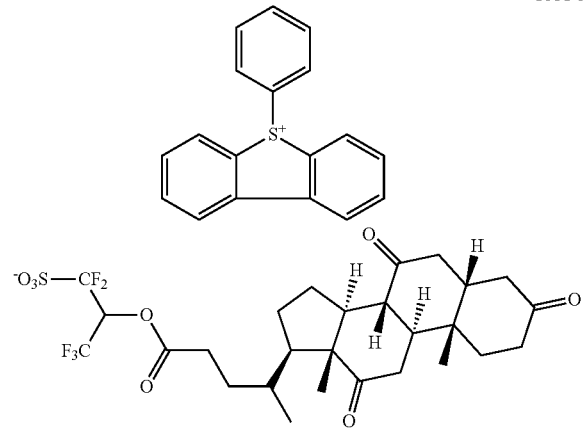

Amine 2

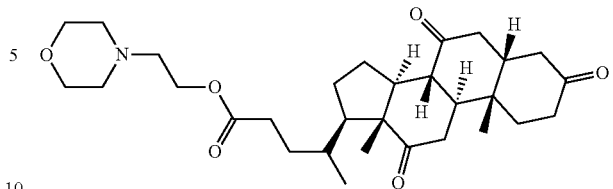

Examples 1, 4, 7, Comparative Examples 1 and 3 used a substrate which had been prepared by coating a silicon substrate of 4-inch diameter with a silicon-containing underlying film SHB-A940 (Shin-Etsu Chemical Co., Ltd.) and heating at 220° C. for 60 seconds to form a resist underlying film of 35 nm thick. Other Examples used a substrate which had been prepared by coating a silicon substrate of 4-inch diameter with a silicon-containing underlying film SHB-N04 (Shin-Etsu Chemical Co., Ltd.) and heating at 220° C. for 60 seconds to form a resist underlying film of 35 nm thick. The resist composition was spin coated onto the substrate and prebaked on a hot plate at 110° C. for 60 seconds to form a resist film of 30 nm thick. Using an EUV exposure tool (NA 0.3), the resist film was exposed to EUV through a pseudo-phase shift mask.

The resist film was immediately baked (PEB) on a hot plate at the temperature shown in Table 1 for 60 seconds. The resist film was puddle developed in a 2.38 wt % TMAH aqueous solution for 20 seconds to form a positive pattern in Examples 1, 4 and Comparative Example 1 or a negative pattern in Example 7 and Comparative Example 3. In Examples 2, 3, 5, 6, 8-10 and Comparative Example 2, the resist film was puddle developed in n-butyl acetate for 20 seconds to form a negative pattern.

The resulting resist pattern was evaluated as follows. Sensitivity is the optimum dose (mJ/cm$^2$) that provides a 1:1 resolution of a 20-nm line-and-space pattern. Resolution is a minimum size at the optimum dose. The 20-nm L/S pattern was measured for edge roughness (LWR) under SEM. The sensitivity, resolution and LWR on EUV lithography are shown in Table 1 together with the formulation of resist composition.

TABLE 1

|  |  | Polymer (pbw) | Acid generator (pbw) | Basic compound (pbw) | Organic solvent (pbw) | PEB temp. (° C.) | Sensitivity (mJ/cm$^2$) | Resolution (nm) | LWR (nm) |
|---|---|---|---|---|---|---|---|---|---|
| Example | 1 | Polymer 1 (100) | — | Amine 1 (1.4) | PGMEA (1,000) CyH (2,000) PGME (500) | 85 | 32 | 18 | 3.8 |
|  | 2 | Polymer 2 (100) | — | Amine 1 (1.4) | PGMEA (1,000) CyH (2,000) PGME (500) | 80 | 29 | 18 | 3.1 |
|  | 3 | Polymer 3 (100) | — | Amine 1 (1.4) | PGMEA (1,000) CyH (2,000) PGME (500) | 80 | 25 | 19 | 3.1 |
|  | 4 | Polymer 4 (100) | — | Amine 1 (1.4) | PGMEA (1,000) CyH (2,000) PGME (500) | 90 | 25 | 19 | 3.4 |
|  | 5 | Polymer 5 (100) | — | Amine 1 (1.4) | PGMEA (1,000) CyH (2,000) PGME (500) | 75 | 33 | 19 | 3.6 |
|  | 6 | Polymer 6 (100) | — | Amine 2 (2.0) | PGMEA (1,000) CyH (2,000) PGME (500) | 75 | 32 | 19 | 3.8 |
|  | 7 | Polymer 7 (100) | — | Amine 1 (1.4) | PGMEA (1,000) EL (2,000) | 110 | 36 | 19 | 4.1 |

TABLE 1-continued

|  |  | Polymer (pbw) | Acid generator (pbw) | Basic compound (pbw) | Organic solvent (pbw) | PEB temp. (° C.) | Sensitivity (mJ/cm$^2$) | Resolution (nm) | LWR (nm) |
|---|---|---|---|---|---|---|---|---|---|
|  | 8 | Polymer 3 (100) | PAG1 (5) | Amine 2 (2.4) | PGMEA (1,000) CyH (2,000) PGME (500) | 75 | 35 | 17 | 3.0 |
|  | 9 | Polymer 3 (100) | PAG2 (5) | Amine 2 (2.4) | PGMEA (1,000) CyH (2,000) PGME (500) | 75 | 30 | 18 | 3.1 |
|  | 10 | Polymer 3 (100) | PAG3 (5) | Amine 2 (2.4) | PGMEA (1,000) CyH (2,000) PGME (500) | 75 | 29 | 18 | 3.2 |
| Comparative Example | 1 | Comparative Polymer 1 (100) | — | Amine 1 (1.4) | PGMEA (1,000) CyH (2,000) PGME (500) | 85 | 31 | 20 | 4.6 |
|  | 2 | Comparative Polymer 2 (100) | — | Amine 1 (1.4) | PGMEA (1,000) CyH (2,000) PGME (500) | 80 | 27 | 20 | 4.5 |
|  | 3 | Comparative Polymer 3 (100) | — | Amine 1 (1.4) | PGMEA (1,000) EL (2,000) | 110 | 34 | 20 | 5.0 |

Polymers 1 to 7 which were polymerized under the LED lighting from which a light fraction of wavelength 400 nm or shorter was cut off could be polymerized to the polymerization ratio just as designed. In Comparative Polymers 1 and 2 which were polymerized under the white fluorescent lamp, decomposition of the acid generator occurred to a slight extent which was as trace as being undetectable by NMR analysis, the acid was accordingly generated, and deprotection of the acid labile group was induced by the heat of polymerization temperature. This accounts for the observation of methacrylic acid generated. In Comparative Polymer 3, formation of olefin from Monomer 2 via dehydration reaction and a molecular weight buildup due to crosslinking reaction occurred, failing in polymerization just as designed. For these reasons, the resist compositions using Comparative Polymers show a lower resolution and a more LWR than the resist compositions of Examples.

Japanese Patent Application No. 2014-249749 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for producing a polymer comprising recurring units having an acid generator bound to the backbone, and recurring units selected from recurring units having a carboxyl group optionally substituted with an acid labile group and recurring units having a hydroxyl group optionally substituted with an acid labile group, and a combination thereof, said method comprising polymerizing monomers corresponding to the recurring units under such illumination that the quantity of light of wavelength up to 400 nm is 0.05 mW/cm$^2$ or less,
   wherein the recurring units having an acid generator bound to the backbone are recurring units selected from recurring units having the formulae (1) to (3), and combinations thereof:

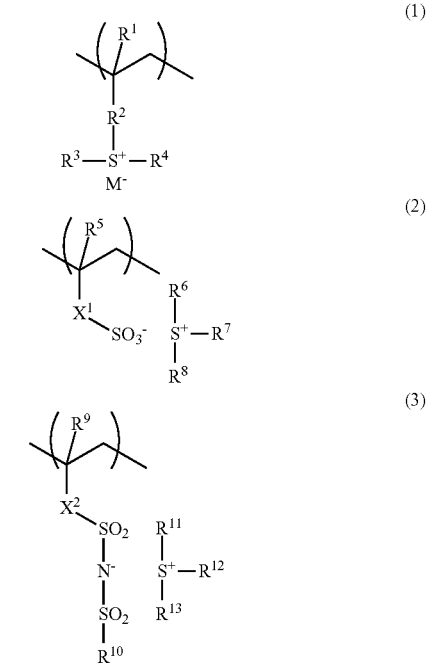

wherein $R^1$, $R^5$ and $R^9$ are each independently hydrogen or methyl,
$R^2$ is a single bond, phenylene, —O—R— or —C(=O)—$Y^0$—R—, $Y^0$ is oxygen or NH, R is a straight, branched or cyclic $C_1$-$C_6$ alkylene, straight, branched or cyclic $C_2$-$C_6$ alkenylene, or phenylene group, wherein the R group may contain a carbonyl (—CO—), ester (—COO—), ether (—O—), sulfonic acid ester (—OS($O_2$)—), sulfonamide represented by the formula —NH—S($O_2$)—, or hydroxyl moiety,
$R^3$, $R^4$, $R^6$, $R^7$, $R^8$, $R^{11}$, $R^{12}$ and $R^{13}$ are each independently a straight, branched or cyclic $C_1$-$C_{12}$ alkyl group, or a $C_6$-$C_{12}$ aryl, $C_7$-$C_{20}$ aralkyl, or thiophenyl group, wherein the straight, branched or cyclic $C_1$-$C_{12}$ alkyl group of $R^3$, $R^4$, $R^6$, $R^7$, $R^8$, $R^{11}$, $R^{12}$ and $R^{13}$ may contain a carbonyl, ester or ether moiety,
$X^1$ and $X^2$ are each independently a single bond, methylene, ethylene, phenylene, fluorinated phenylene, —O—R$^{14}$—, or —C(=O)—Z$^1$—R$^{14}$—, Z$^1$ is oxygen or NH, R$^{14}$ is a straight, branched or cyclic C$_1$-C$_6$ alkylene, alkenylene, or phenylene group, wherein the R$^{14}$ group may contain a carbonyl, ester, ether, sulfonic acid ester, sulfonamide or hydroxyl moiety, and the R$^{14}$ group may be fluorinated, R$^{10}$ is a C$_1$-C$_4$ fluoroalkyl or C$_6$-C$_{10}$ fluoroaryl group, and M$^-$ is a non-nucleophilic counter ion, and wherein the recurring units having a carboxyl group optionally substituted with an acid labile group and the recurring units having a hydroxyl group optionally substituted with an acid labile group have the following formulae (4) and (5), respectively,

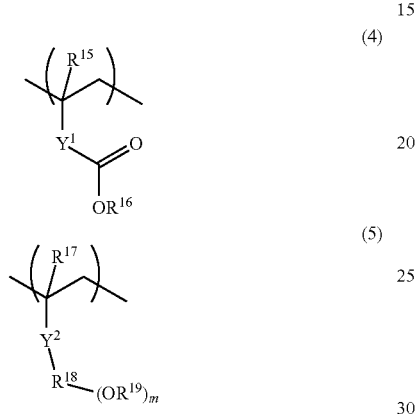

wherein R$^{15}$ and R$^{17}$ are each independently hydrogen or methyl,

R$^{16}$ and R$^{19}$ are each independently hydrogen or an acid labile group,

Y$^1$ is a single bond, phenylene, naphthylene or —C(=O)—O—R$^{20}$—, R$^{20}$ is a straight, branched or cyclic C$_1$-C$_{10}$ alkylene group, or phenylene or naphthylene group, wherein the C$_1$-C$_{10}$ alkylene group of Y$^1$ may contain an ether, ester, lactone ring or hydroxyl moiety, Y$^2$ is a single bond, a phenylene or naphthylene group, or —C(=O)—O—R$^{21}$—, —C(=O)—NH—R$^{21}$—, —O—R$^{21}$—, or —S—R$^{21}$—, wherein the phenylene and naphthylene group of Y$^2$ may have a nitro, cyano or halogen moiety, R$^{21}$ is a straight, branched or cyclic C$_1$-C$_{10}$ alkylene group, or a phenylene or naphthylene group, wherein the straight, branched or cyclic C$_1$-C$_{10}$ alkylene group of R$^{21}$ may contain an ether, ester, lactone ring or hydroxyl moiety, wherein the phenylene and naphthylene group of R$^{21}$ may contain a straight, branched or cyclic C$_1$-C$_6$ alkyl, C$_2$-C$_6$ alkenyl, C$_6$-C$_{10}$ aryl, alkoxy, acyl, acyloxy, alkoxycarbonyl, nitro, cyano or halogen moiety, R$^{18}$ is a single bond, or a straight, branched or cyclic, C$_1$-C$_{16}$, di- to pentavalent, aliphatic hydrocarbon group or phenylene group, which may contain an ether or ester moiety, and m is an integer of 1 to 4.

2. The method of claim 1 wherein the quantity of light of wavelength up to 400 nm is 0.02 mW/cm$^2$ or less.

3. The method of claim 2 wherein the quantity of light of wavelength up to 400 nm is 0.01 mW/cm$^2$ or less.

4. The method of claim 1 wherein the illumination is provided by an LED lamp or organic EL lamp.

5. The method of claim 1 wherein at least one of R$^3$ and R$^4$, at least one of R$^6$, R$^7$ and R$^8$, or at least one of R$^{11}$, R$^{12}$ and R$^{13}$ is an optionally substituted phenyl group.

6. The method of claim 1 wherein the polymer consists of recurring units having an acid generator bound to the backbone selected from recurring units having the formulae (1) to (3), recurring units having a carboxyl group optionally substituted with an acid labile group represented by formula (4) and/or recurring units having a hydroxyl group optionally substituted with an acid labile group represented by the following formula (5), and recurring units derived from monomers having an adhesive group selected from hydroxy, lactone ring, ether, ester, carbonyl and cyano group,

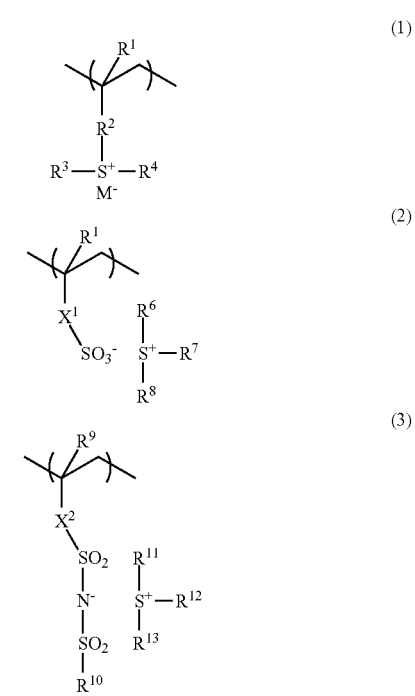

wherein R$^1$, R$^5$ and R$^9$ are each independently hydrogen or methyl,

R$^2$ is a single bond, phenylene, —O—R— or —C(=O)—Y$^0$—R—, Y$^0$ is oxygen or NH, R is a straight, branched or cyclic C$_1$-C$_6$ alkylene, straight, branched or cyclic C$_2$-C$_6$ alkenylene, or phenylene group, wherein the R group may contain a carbonyl (—CO—), ester (—COO—), ether (—O—), sulfonic acid ester (—OS(O$_2$)—), sulfonamide represented by the formula —NH—S(O$_2$)—, or hydroxyl moiety, R$^3$, R$^4$, R$^6$, R$^7$, R$^8$, R$^{11}$, R$^{12}$ and R$^{13}$ are each independently a straight, branched or cyclic C$_1$-C$_{12}$ alkyl group, or a C$_6$-C$_{12}$ aryl, C$_7$-C$_{20}$ aralkyl, or thiophenyl group, wherein the straight, branched or cyclic C$_1$-C$_{12}$ alkyl group of R$^3$, R$^4$, R$^6$, R$^7$, R$^8$, R$^{11}$, R$^{12}$ and R$^{13}$ may contain a carbonyl, ester or ether moiety, X$^1$ and X$^2$ are each independently a single bond, methylene, ethylene, phenylene, fluorinated phenylene, —O—R$^{14}$—, or —C(=O)—Z$^1$—R$^{14}$—, Z$^1$ is oxygen or NH, R$^{14}$ is a straight, branched or cyclic C$_1$-C$_6$ alkylene, alkenylene, or phenylene group, wherein the R$^{14}$ group may contain a carbonyl, ester, ether, sulfonic acid ester, sulfonamide or hydroxyl moiety, and the R$^{14}$ group may be fluorinated, $R^{10}$ is a $C_1$-$C_4$ fluoroalkyl or $C_6$-$C_{10}$ fluoroaryl group, and $M^-$ is a non-nucleophilic counter ion,

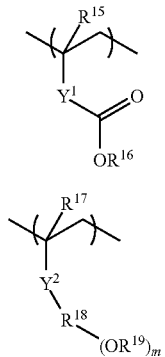

(4)

(5)

wherein $R^{15}$ and $R^{17}$ are each independently hydrogen or methyl, $R^{16}$ and $R^{19}$ are each independently hydrogen or an acid labile group, $Y^1$ is a single bond, phenylene, naphthylene or —C(=O)—O—$R^{20}$—, $R^{20}$ is a straight, branched or cyclic $C_1$-$C_{10}$ alkylene group, or phenylene or naphthylene group, wherein the $C_1$-$C_{10}$ alkylene group of $Y^1$ may contain an ether, ester, lactone ring or hydroxyl moiety, $Y^2$ is a single bond, a phenylene or naphthylene group, or —C(=O)—O—$R^{21}$—, —C(=O)—NH—$R^{21}$—, —O—$R^{21}$—, or —S—$R^{21}$—, wherein the phenylene and naphthylene group of $Y^2$ may have a nitro, cyano or halogen moiety, $R^{21}$ is a straight, branched or cyclic $C_1$-$C_{10}$ alkylene group, or a phenylene or naphthylene group, wherein the straight, branched or cyclic $C_1$-$C_{10}$ alkylene group of $R^{21}$ may contain an ether, ester, lactone ring or hydroxyl moiety, wherein the phenylene and naphthylene group of $R^{21}$ may contain a straight, branched or cyclic $C_1$-$C_6$ alkyl, $C_2$-$C_6$ alkenyl, $C_6$-$C_{10}$ aryl, alkoxy, acyl, acyloxy, alkoxycarbonyl, nitro, cyano or halogen moiety, $R^{18}$ is a single bond, or a straight, branched or cyclic, $C_1$-$C_{16}$, di- to pentavalent, aliphatic hydrocarbon group or phenylene group, which may contain an ether or ester moiety, and m is an integer of 1 to 4.

* * * * *